United States Patent
Nagasawa et al.

(10) Patent No.: US 12,415,930 B2
(45) Date of Patent: Sep. 16, 2025

(54) CONDUCTIVE POLYMER COMPOSITION, SUBSTRATE, AND METHOD FOR PRODUCING SUBSTRATE

(71) Applicant: SHIN-ETSU CHEMICAL CO., LTD., Tokyo (JP)

(72) Inventors: Takayuki Nagasawa, Joetsu (JP); Jun Hatakeyama, Joetsu (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 763 days.

(21) Appl. No.: 17/700,942

(22) Filed: Mar. 22, 2022

(65) Prior Publication Data

US 2022/0332957 A1    Oct. 20, 2022

(30) Foreign Application Priority Data

Mar. 31, 2021   (JP) .................................. 2021-59230

(51) Int. Cl.
  *C09D 5/24*         (2006.01)
  *C09D 7/20*         (2018.01)
  (Continued)

(52) U.S. Cl.
  CPC .................. *C09D 5/24* (2013.01); *C09D 7/20* (2018.01); *C09D 11/033* (2013.01);
  (Continued)

(58) Field of Classification Search
  CPC .......... C09D 5/24; C09D 7/20; C09D 11/033; C09D 11/107; C09D 11/38; C09D 11/52; C09D 125/18; C09D 133/16; C09D 7/63; C09D 133/14; C09D 165/00; H10K 85/111; H10K 85/141; H10K 85/151; H10K 50/17; H10K 71/15; C08J 2325/18; C08J 2465/00; C08J 3/03; C08J 2365/00; C08J 2425/18; C08J 7/0427; C08J 7/044; B05D 5/12; B05D 1/005; B05D 1/02; B05D 1/26; C08G 2261/11; C08G 2261/1424;
  (Continued)

(56) References Cited

U.S. PATENT DOCUMENTS 9,587,137 B2    3/2017 Nagasawa et al.
10,295,906 B2   5/2019 Nagasawa et al.
(Continued)

FOREIGN PATENT DOCUMENTS

EP    1 373 356 B1   5/2005
EP    3 693 979 A1   8/2020
(Continued)

OTHER PUBLICATIONS

Oct. 19, 2022 Search Report issued in European Patent Application No. 22164017.0.

(Continued)

*Primary Examiner* — Mark Kopec
*Assistant Examiner* — Jaison P Thomas
(74) *Attorney, Agent, or Firm* — Oliff PLC

(57) ABSTRACT

An object is to obtain a composition capable of: forming a uniform film even by spray coating or even when the composition is applied in the form of ink for inkjet printing; and preventing light emission from a portion other than an ITO electrode surface when the film is mounted on an organic EL device and light is emitted from the device. A conductive polymer composition contains: a composite containing a π-conjugated polymer (A) and a polymer (B) shown by a general formula (1); $H_2O$ (D) for dispersing the composite; a water-soluble organic solvent (C); and a compound (E) shown by a general formula (2). The electric conductivity of a film with a thickness of 20 to 200 nm formed from the conductive polymer composition is less than 1.00E-05 S/cm.

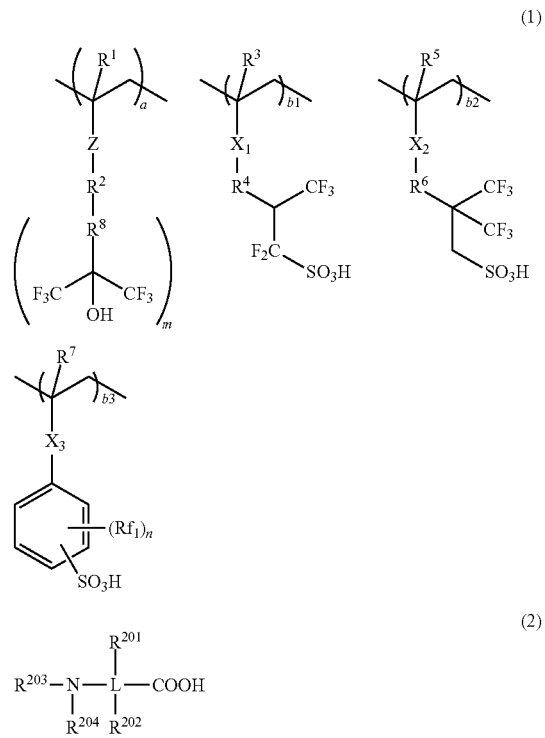

13 Claims, No Drawings

(51) Int. Cl.
*C09D 11/033* (2014.01)
*C09D 11/107* (2014.01)
*C09D 11/38* (2014.01)
*C09D 11/52* (2014.01)
*C09D 125/18* (2006.01)
*C09D 133/16* (2006.01)
*H10K 85/10* (2023.01)
*H10K 50/17* (2023.01)

(52) U.S. Cl.
CPC ............ *C09D 11/107* (2013.01); *C09D 11/38* (2013.01); *C09D 11/52* (2013.01); *C09D 125/18* (2013.01); *C09D 133/16* (2013.01); *H10K 85/111* (2023.02); *H10K 85/141* (2023.02); *H10K 85/151* (2023.02); *H10K 50/17* (2023.02)

(58) Field of Classification Search
CPC .......... C08G 2261/3223; C08G 61/126; C08G 2261/43; C08G 2261/794; C08F 8/00; C08F 212/24; C08F 220/382; C08L 25/18; C08L 65/00; C08L 33/14; H01B 1/122
See application file for complete search history.

(56) References Cited

U.S. PATENT DOCUMENTS

| | | | |
|---|---|---|---|
| 11,417,842 B2 * | 8/2022 | Nagasawa | C08F 212/30 |
| 2002/0173579 A1 | 11/2002 | Jonas et al. | |
| 2003/0211331 A1 | 11/2003 | Ouwet et al. | |
| 2007/0069185 A1 | 3/2007 | Hsu et al. | |
| 2015/0140492 A1 | 5/2015 | Sawai et al. | |
| 2016/0071626 A1 | 3/2016 | Hatakeyama et al. | |
| 2020/0259094 A1 | 8/2020 | Nagasawa et al. | |
| 2021/0380738 A1 * | 12/2021 | Nagasawa | C08F 212/16 |
| 2023/0159766 A1 * | 5/2023 | Nagasawa | H10K 85/141 257/40 |

FOREIGN PATENT DOCUMENTS

| | | |
|---|---|---|
| JP | 2005-068166 A | 3/2005 |
| JP | 2008-146913 A | 6/2008 |
| JP | 2008-546899 A | 12/2008 |
| JP | 2014-009342 A | 1/2014 |
| JP | 6450666 B2 | 1/2019 |
| JP | 6483518 B2 | 3/2019 |
| JP | 2020-128472 A | 8/2020 |
| WO | 03/048228 A1 | 6/2003 |
| WO | WO-2021205873 A1 * | 10/2021 ............ C08F 212/14 |

OTHER PUBLICATIONS

May 31, 2023 Office Action issued in European Patent Application No. 22164017.0.

Jan. 16, 2024 Office Action Issued in Japanese Patent Application No. 2021-059230.

* cited by examiner

CONDUCTIVE POLYMER COMPOSITION, SUBSTRATE, AND METHOD FOR PRODUCING SUBSTRATE

TECHNICAL FIELD

The present invention relates to a conductive polymer composition, and a substrate having a coating-type conductive film formed from the conductive polymer composition in an organic electroluminescent device.

BACKGROUND ART

A polymer having a conjugated double bond (a π-conjugated polymer) does not exhibit electrical conductivity by itself, but becomes an electro-conductive polymer material by doping with an appropriate anion molecule which causes electron or hole to move. (Hetero) aromatic polymers such as polythiophene, polyselenophene, polytellurophene, polypyrrole, polyaniline, a mixture thereof, and the like, have been used as the π-conjugated polymer. A sulfonic acid-based anion has most frequently been used as the anion molecule (dopant). This is because the sulfonic acid, which is a strong acid, interacts efficiently with the π-conjugated polymer.

As the sulfonic acid-based anion dopant, sulfonic acid polymers such as polyvinylsulfonic acid and polystyrenesulfonic acid (PSS) have widely been used (Patent Document 1). In addition, among such sulfonic acid polymers, a vinyl perfluoroalkyl ether sulfonic acid represented by Nafion® has been used for fuel cell applications.

The polystyrenesulfonic acid (PSS) which is a sulfonic acid homopolymer has high efficiency in doping to the π-conjugated polymer since sulfonic acids are continuously present as the monomer units in the polymer main chain, and it can improve dispersibility of the doped π-conjugated polymer in water. This is because hydrophilicity is retained by the presence of sulfo groups excessively present in the PSS compared with the doped portion, so that the dispersibility into water is dramatically improved.

Polythiophene using the PSS as a dopant can be handled as a highly conductive liquid material, and is thus expected as a coating-type transparent electrode film material in place of ITO (indium tin oxide) used as a transparent electrode in organic EL, solar cell, etc. While organic thin-film devices including organic EL, solar cell, and so forth are in such a trend that all the layers are made from coating-type material, high conductivity is not required, but it is desirable to apply polythiophene as a coating material which functions as an injection layer to reduce the carrier transfer load from an electrode to a carrier transfer layer.

When PSS having quite high hydrophilicity is added as a dopant to a π-conjugated polymer having low hydrophilicity, the composite of the π-conjugated polymer with the dopant is dispersed as particles in $H_2O$. This dispersion is applicable as a liquid material onto a substrate. After a substrate is coated with the composite, a film can be formed by heating with a hot air circulation furnace, hot plate, or the like, by IR or UV radiation, etc. Nevertheless, since the PSS having quite high hydrophilicity retains the moisture, a large amount of moisture remains in the film after the treatment for the film formation. After device preparation and sealing, the moisture volatizes and fills the device, for example, and consequently significantly lowers the device performance in some cases. When the composite material is used for a film (thin film) constituting, for example, an organic EL, the moisture remaining in the film and moisture absorbed from the external atmosphere in the manufacturing process till sealing volatize or permeate an adjacent layer after constituent layers are laminated and sealed. When the moisture condenses in the sealed device or in the film, this causes defects and lowers the device functions such as decreased function of the light emitting layer and increased voltage for driving the device due to the moisture in the film. Consequently, there are problems such as shortened device lifetime.

Hence, when a composite of a π-conjugated polymer with PSS as a dopant is used in the form of a $H_2O$ dispersion as a transparent electrode material or hole injection layer material in an organic thin-film device such as organic EL or solar cell, the remaining moisture degrades the device performance. Efforts have been made to disperse the composite in an organic solvent as an alternative solvent to $H_2O$; however, the affinity to organic solvent is so low that it is difficult to obtain a uniform dispersion.

Meanwhile, PEDOT-PSS, which has been studied for wide applications, absorbs light in the visible light range and the transmittance is low. Hence, this material has a difficulty in application to light-permeable, light emitting devices, and has natures such that dispersed particles of the composite in a liquid state are likely to aggregate. The filtration purification is difficult.

When a composite of a π-conjugated polymer with PSS as a dopant is used for a transparent electrode material or hole injection layer material in an organic thin-film device such as organic EL or solar cell, the thin film can be formed in a variety of ways. Examples of the film formation method include: coating with a spin coater, etc.; bar coating, dipping, comma coating, spray coating, roll coating, screen printing, flexographic printing, gravure printing, ink-jet printing, etc. After a substrate is coated, a conductive film can be formed by a heat treatment with a hot air circulation furnace, hot plate, or the like, by IR or UV radiation, etc. However, the filtration for removing the component aggregates in the composition is problematic as described above. Coating without filtration brings about problems: the coating is improperly carried out due to the influence of these aggregates; even if a uniform film is obtained, the surface roughness is poor; and when the uniform film is employed for organic EL, solar cell, or the like having a laminate structure, problems such as impaired carrier transfer and short circuit are likely to occur due to such large surface unevenness or pinhole.

Moreover, when $H_2O$ is used as the solvent for a composite of a π-conjugated polymer with PSS as a dopant, since the surface tension is high, the contact angle is large regardless of whether a glass substrate or plastic substrate is coated. The aggregation occurs in the solution after the coating, or the solution is left adhering on the substrate as droplets by the repelling on the substrate. Hence, it is necessary to lower the contact angle with respect to a substrate by lowering the surface tension of the material, and to impart leveling property so that a uniform film can be formed. Particularly, in spray coating and inkjet printing by spraying or blowing a liquid material, lowering the surface tension and imparting leveling property are essential. Moreover, a solid content may be firmly attached around a nozzle, or the solid content may precipitate due to drying after the liquid material is ejected from the nozzle tip and before landing on the substrate. Hence, it is necessary to use a less volatile solvent as a main solvent instead of $H_2O$, or to further add an agent for slowing the drying if the main solvent is $H_2O$.

When a glass substrate or plastic substrate is coated with a composite of a π-conjugated polymer with PSS as a dopant, the main solvent is most desirably an organic solvent from the viewpoints of coatability and film quality. Patent Documents 2 and 3 describe production of a polythiophene-polyanion complex in a water-free solvent or low-water-content solvent. In these systems, $H_2O$ as an initial solvent is exchanged with another water-miscible organic solvent. For this purpose, after an organic solvent is added, $H_2O$ is removed by distillation, for example. However, this procedure has the following shortcomings: the distillation requires a two-stage process; the organic solvent to be added has to be miscible with water; if the organic solvent has a boiling point of roughly 150° C. or more, or if the polythiophene-polyanion particle dispersion has high versatility, polymer modification occurs such that the conductivity is increased; in the application as hole injection layer, there are such problems that the conductivity departs from the appropriate range; etc.

Meanwhile, in Patent Document 4, Otani et al. describe a method in which a conductive polymer such as PEDOT is first dried and then re-dispersed in an organic solvent. Although isopropyl alcohol and γ-butyrolactone are disclosed in Examples, this method requires a polar solvent for re-dissolution. This document does not disclose a polythiophene-polyanion composite. Concerning a polythiophene-polyanion composite, particularly PEDOT-PSS with PSS as a dopant, after removal of $H_2O$, which is a solvent for chemical polymerization, a mechanical treatment, such as high-pressure dispersing, is required for the re-dispersing into an organic solvent. Even after such treatment is performed, when the composite is used for a transparent electrode material or hole injection layer material in an organic thin-film device such as organic EL or solar cell, there is such a disadvantage that defects such as dark spots derived from the polymer aggregates are likely to occur on the resulting film that transmits light. The viscosity also tends to be high in comparison with the system with $H_2O$ main solvent. These disadvantages are considerably related to the film formability as well as the luminance lifetime, durability, and yield in production of the organic thin-film device. This re-dispersion scheme is not desirable because an appropriate dispersion in the PEDOT-PSS usage does not cause film thickness reduction due to the solid content reduction by passing the dispersion through a filtration membrane of at least 0.45 μm or less when the PEDOT-PSS is used.

Meanwhile, the synthesis method of a polythiophene-based conductive polymer with PSS as a dopant, such as widely-applicable PEDOT-PSS, is known, and numerous commercial products of the raw materials and manufactured articles are available in the market. Accordingly, the polythiophene-based conductive polymer is a suitable material applied to organic thin-film devices such as organic EL and solar cell. Nevertheless, there are problems that: the transparency is poor due to visible light absorption; the aggregation is highly likely in the $H_2O$ dispersion state; the aggregation is further accelerated by mixing an organic solvent, so that the viscosity is high and the filtration purification is difficult; after the film formation, plenty of moisture remains in the film; the film itself has poor surface roughness; and defects are likely to occur by particles derived from the aggregates. Furthermore, in a state where no organic solvent is added to avoid the aggregation, the surface tension is so high that after the composition is blown onto a substrate by employing a spray-type printer, the contact angle of landed droplets is high, and the leveling property is low. Consequently, a flat continuous film cannot be obtained, and a partial film or a sea-island structure is formed from the composition droplets on the substrate.

Patent Documents 5, 6, and 7 propose conductive polymer compositions formed by using: a π-conjugated polymer formed of a repeating unit selected from thiophene, pyrrole, aniline, and polycyclic aromatic compounds; and a dopant polymer incorporating a fluorinated acid unit. It is disclosed that a $H_2O$ dispersion of the conductive polymer is obtained by combining $H_2O$, a precursor monomer of the π-conjugated polymer, a fluorinated acid polymer, and an oxidizing agent in any order. By introducing a fluorinated acid unit, the affinity of the fluorine atoms to organic solvents is imparted to the dopant polymer. As a result, the composite including the π-conjugated polymer as a whole has higher affinity to organic solvents and hydrophobic substrate surface, improving the dispersibility of the composite in organic solvents and coatability on hydrophobic substrates. Moreover, introducing a fluorinated acid unit into the dopant relieves the strong hydrophilicity observed from PSS, and thus the moisture remaining in the film is reduced after the film formation.

In Patent Document 6, the dopant polymer is constituted of a fluorinated acid unit and such an acid unit as styrenesulfonic acid, which is a constituent monomer of PSS. Nevertheless, the amount of $H^+$ generated from extra sulfonated terminals other than the sulfonated terminal for doping the π-conjugated polymer is not controlled. In other words, in a case where every repeating unit of a dopant polymer (B) is a unit having a sulfonated terminal, the repeating units constituting a π-conjugated polymer (A) are not doped therewith at a ratio of 1:1. Hence, the sulfonated terminals of the repeating units of the dopant polymer (B) in a non-doping state are present as free acids, so that the acidity of the material in a liquid state before film formation is very high. Due to the influence of such high acidity, a problem occurs that surrounding members corrode progressively in the coating step. Furthermore, even after a film formed as a constituent of a thin-film device is dried, $H^+$ diffuses into the device structure through the adjacent layer or from a side surface of the laminate structure, bringing about problems such as chemical changes in constituent layers, and decreases in function, device performance as a whole, and durability. Against these problems, in Patent Document 7, an amphoteric ion compound is added to control the diffusion of $H^+$ into such adjacent layer. Thereby, the composite containing a π-conjugated polymer formed of a repeating unit selected from thiophene, pyrrole, aniline, and polycyclic aromatic compounds, and a dopant polymer incorporating a fluorinated acid unit is improved in terms of dispersibility into an organic solvent and coatability onto a substrate.

Moreover, in Patent Document 8, the dopant polymer constituted of a fluorinated acid unit and such an acid unit as styrenesulfonic acid, which is a constituent monomer of PSS, is incorporated with a non-doping fluorine-containing unit, that is, a non-fluorinated acid unit. Thereby, the resulting dopant polymer has a low content of sulfonic acid unit which serves as $H^+$ source, and further controls the amount of $H^+$ generated from extra sulfonated terminals other than the sulfonated terminal for doping the π-conjugated polymer.

The composition described in Patent Document 8 has favorable filterability and film formability, and forms a flatter continuous film by spin coating method. Films formed by this method are applicable as hole injection layers in organic EL devices, organic thin-film solar cells, and so forth. In addition, in the application as a hole injection layer in an organic EL device, such composition has an effect of efficiently reducing the residual moisture in the film formed therefrom, and has an effect of delaying luminance attenuation in an organic EL device in which the luminance attenuation is otherwise accelerated by moisture. In other words, the composition has an effect of extending the luminance lifetime of light emitted from the organic EL device. However, in the production of these organic thin-film devices, printing methods with a spray coater or by inkjet printing to blow droplets onto a substrate are suitable because the time required for the coating process is shorter than that by film formation through the spin coating. Nonetheless, when a film is formed from the composition by such printing method, there are such problems as coating spots, pinhole generation, and insufficient film flatness. The resulting device has problems such as increased voltage, uneven light emission, lowered durability, and short circuit. Moreover, when a solvent of the composition is 100% $H_2O$, this $H_2O$ volatizes while the droplets are sprayed according to the printing method, so that the solid content is firmly attached around the nozzle, or the solid content precipitates by drying after the liquid material is ejected from the nozzle tip and before landed on a substrate. Consequently, the precipitate adheres to the film, causing defect problem in the organic EL device.

Further, when the film formed from the composition described in Patent Document 8 is mounted on an ITO electrode serving as an anode in an organic EL device, the portion of the composition film applied outside the ITO electrode surface functions as a hole injection layer and simultaneously acts as an electrode when driving voltage is applied. This results in a problem that light is emitted from an unintended portion other than the electrode surface originally designed to emit light.

CITATION LIST

Patent Literature

Patent Document 1: JP 2008-146913 A
Patent Document 2: EP 1,373,356 A
Patent Document 3: WO 2003/048228 A1
Patent Document 4: JP 2005-068166 A
Patent Document 5: JP 2008-546899 A
Patent Document 6: JP 6483518 B
Patent Document 7: JP 6450666 B
Patent Document 8: JP 2020-128472 A

SUMMARY OF INVENTION

Technical Problem

The present invention has been made in view of the above circumstances. An object of the present invention is to obtain a conductive polymer composition having favorable film formability and being capable of: relieving acidity; forming a conductive film with high transparency; forming a defect-free flat uniform film even by such droplet-application methods as spray coating or even when the composition is applied in the form of ink for inkjet printing; and further preventing light emission from a portion other than an ITO electrode surface designed to emit light when the composition is applied to a hole injection layer in an organic EL device and mounted on the organic EL device to allow the device to emit light.

Solution to Problem

To achieve the object, the present invention provides a conductive polymer composition comprising:

a composite comprising
    a π-conjugated polymer (A), and
    a polymer (B) shown by the following general formula (1);
$H_2O$ (D) for dispersing the composite;
a water-soluble organic solvent (C); and
a compound (E) shown by the following general formula (2),
wherein an electric conductivity of a film with a thickness of 20 to 200 nm formed from the conductive polymer composition is less than 1.00E-05 S/cm,

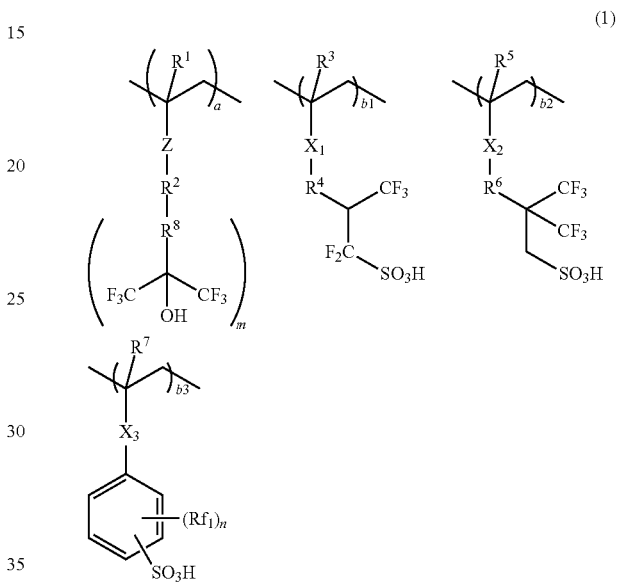

wherein $R^1$ represents a hydrogen atom or a methyl group; Z represents any of a phenylene group, a naphthylene group, an ester group, an ether group, an amino group, and an amide group; when Z is a phenylene group or a naphthylene group, $R^2$ represents any of a single bond and a linear, branched, or cyclic hydrocarbon group having 1 to 12 carbon atoms optionally having one or both of an ester group and an ether group; when Z is an ester group, an ether group, an amino group, or an amide group, $R^2$ represents any of a single bond and a linear, branched, or cyclic hydrocarbon group having 1 to 14 carbon atoms optionally having an ether group; "m" represents any one of 1 to 3; $R^3$, $R^5$, and $R^7$ each independently represent a hydrogen atom or a methyl group; $R^4$ and $R^6$ each independently represent any of a single bond and a linear, branched, or cyclic hydrocarbon group having 1 to 12 carbon atoms optionally having one or both of an ether group and an ester group; $R^8$ represents any of a single bond, a methylene group, an ethylidene group, an isopropylidene group, an ether group, an ester group, an amino group, an amide group, and a linear, branched, or cyclic hydrocarbon group having 1 to 12 carbon atoms optionally containing an ether group, an ester group, an amino group, an amide group, or a heteroatom, and the amino groups and the amide groups each optionally contain any of a hydrogen atom and a linear, branched, or cyclic hydrocarbon group having 1 to 12 carbon atoms optionally containing a heteroatom; $X_1$ and $X_2$ each independently represent any of a single bond, a phenylene group, a naphthylene group, an ether group, an ester group, and an amide group; $X_3$ represents any of a single bond, an ether group, and an ester group; $Rf_1$ represents a fluorine atom or a trifluoromethyl group; "a", b1, b2, and b3 satisfy 0<a<1.0, 0≤b1<1.0, 0≤b2<1.0, 0≤b3<1.0, and 0<b1+b2+b3<1.0; and "n" represents an integer of 1 to 4, and

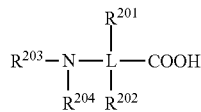

(2)

wherein $R^{201}$ and $R^{202}$ each independently represent any of a hydrogen atom, a heteroatom, and a linear, branched, or cyclic monovalent hydrocarbon group having 1 to 20 carbon atoms optionally having a heteroatom; $R^{203}$ and $R^{204}$ each independently represent any of a hydrogen atom and a linear, branched, or cyclic monovalent hydrocarbon group having 1 to 20 carbon atoms optionally having a heteroatom; $R^{201}$ and $R^{203}$, or $R^{201}$ and $R^{204}$, are optionally bonded to each other to form a ring; L represents a linear, branched or cyclic tetravalent organic group having 1 to 20 carbon atoms optionally having a heteroatom; and when L has a heteroatom, the heteroatom is optionally an ion.

Incorporating (A), (B), (C), (D), and (E) as described above enables the electro-conductive composition to have favorable filterability and favorable film formability, to relieve acidity, and impart favorable leveling property because of low surface tension and contact angle on a substrate. Moreover, when a film is formed from the composition in the form of ink for inkjet printing or by spray coating, a defect-free flat uniform film is formed. Further, since the film formed from the composition has an electric conductivity (S/cm) of less than 1.00E-05, the composition is capable of preventing light emission (crosstalk) from a portion other than an ITO electrode surface designed to emit light when the film is applied as a hole injection layer in an organic EL device and light is emitted from the device.

Moreover, the inventive conductive polymer composition preferably has a surface tension in a range of 20 to 50 mN/m.

With the value of the surface tension being within such a range, when a droplet spray-type printer such as spray printer and inkjet printer is employed, the droplets blown on a substrate are leveled progressively, making it possible to prevent the composition solution from repelling on the substrate, from forming a partial (incomplete) film, and from forming a sea-island structure as a trace of the droplets.

The component (C) preferably comprises an organic solvent (C1) having a boiling point of 120° C. or more and/or an organic solvent (C2) having a boiling point of less than 120° C. such that 1.0 wt %≤(C1)+(C2)≤50.0 wt % is satisfied relative to a total of the components (A), (B), and (D).

In this case, the components (C1) and (C2) are preferably selected from alcohols, ethers, esters, ketones, and nitriles each of which has 1 to 7 carbon atoms.

In the present invention, such organic solvents are usable.

Further, the repeating unit "a" in the component (B) preferably comprises one or more selected from repeating units a1 to a4 shown by the following general formulae (3-1) to (3-4),

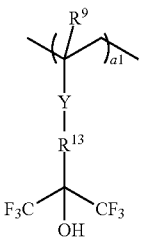

(3-1)

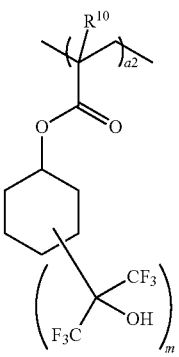

(3-2)

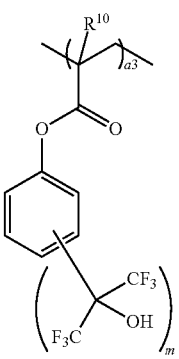

(3-3)

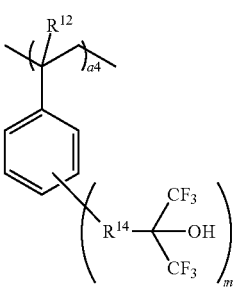

(3-4)

wherein $R^9$, $R^{10}$, $R^{11}$, and $R^{12}$ each independently represent a hydrogen atom or a methyl group; $R^{13}$ represents any of a single bond and a linear, branched, or cyclic hydrocarbon group having 1 to 14 carbon atoms optionally having an ether group; $R^{14}$ represents any of a single bond, a methylene group, an ethylidene group, an isopropylidene group, an ether group, an ester group, an amino group, an amide group, and a linear, branched, or cyclic hydrocarbon group having 1 to 12 carbon atoms optionally containing an ether group, an ester group, an amino group, an amide group, or a heteroatom, and the amino groups and the amide groups each optionally contain any of a hydrogen atom and a linear, branched, or cyclic hydrocarbon group having 1 to 12 carbon atoms optionally containing a heteroatom; Y represents any of an ether group, an ester group, an amino group, and an amide group, and the amino group and the amide group each optionally contain any of a hydrogen atom and a linear, branched, or cyclic hydrocarbon group having 1 to 12 carbon atoms optionally containing a heteroatom; "m" represents any one of 1 to 3; and a1, a2, a3, and a4 satisfy 0≤a1<1.0, 0≤a2<1.0, 0≤a3<1.0, 0≤a4<1.0, and 0<a1+a2+a3+a4<1.0.

Moreover, the repeating unit b1 in the component (B) preferably comprises one or more selected from repeating units b'1 to b'4 shown by the following general formulae (4-1) to (4-4),

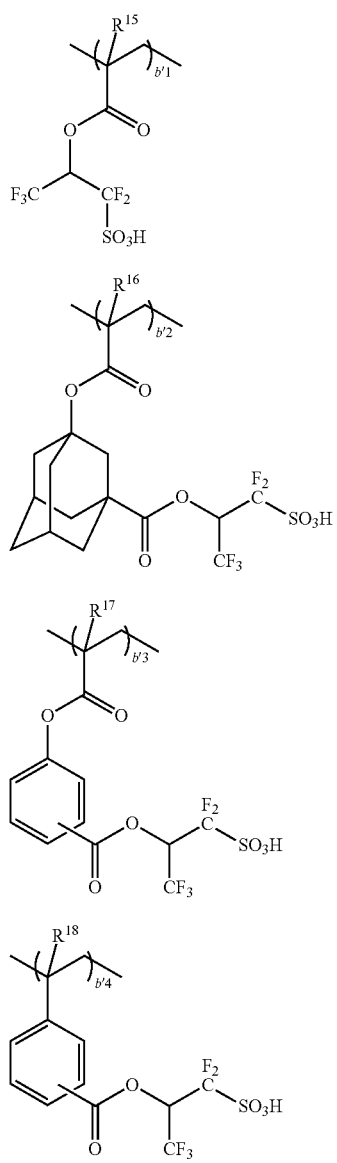

wherein $R^{15}$, $R^{16}$, $R^{17}$, and $R^{18}$ each independently represent a hydrogen atom or a methyl group; and b'1, b'2, b'3, and b'4 satisfy 0≤b'1<1.0, 0≤b'2<1.0, 0≤b'3<1.0, 0≤b'4<1.0, and 0<b'1+b'2+b'3+b'4<1.0.

It is preferable to incorporate these repeating units as "a" and "b1", or "a" and "b2", or "a" and "b3" in the component (B). Incorporating the composite of the π-conjugated polymer (A) and the polymer (B) makes the inventive conductive polymer composition have appropriate filterability, film formability, coatability onto organic and inorganic substrates, and electric conductivity after film formation. Additionally, the effect of reducing residual moisture in the film will be exhibited.

The component (B) may further comprise a repeating unit "c" shown by the following general formula (5),

wherein "c" satisfies 0<c<1.0.

By incorporating such repeating unit "c" in the component (B), it is possible to further adjust the conductivity of the film and efficient function demonstration in forming a hole injection layer in an organic EL device or an organic thin-film device constituent layer in an organic thin-film solar cell, etc.

The component (B) preferably has a weight-average molecular weight in a range of 1,000 to 500,000.

When the weight-average molecular weight is 1,000 or more, the heat resistance is excellent, and the uniformity of the solution containing the composite with the component (A) is favorable. Meanwhile, when the weight-average molecular weight is 500,000 or less, the viscosity is not increased too much, the workability is favorable, and the dispersibility into water and an organic solvent is not lowered.

The component (A) is preferably a material in which at least one precursor monomer selected from the group consisting of pyrrole, thiophene, selenophene, tellurophene, aniline, polycyclic aromatic compounds, and derivatives thereof is polymerized.

Such monomers are easily polymerized, and the stability in air is favorable. Hence, the component (A) can be easily synthesized.

The component (E) is preferably contained in an amount of 1 part by mass to 50 parts by mass based on 100 parts by mass of the composite of the component (A) with the component (B).

When the component (E) is contained in such an amount, it is possible to more surely control acid diffusion into adjacent layers of the laminate structure and into other constituent layers.

The inventive conductive polymer composition preferably further comprises a nonionic surfactant.

Such a component can further enhance the coatability onto a material to be processed, such as a substrate.

In this case, the nonionic surfactant is preferably contained in an amount of 1 part by mass to 15 parts by mass based on 100 parts by mass of the composite of the component (A) with the component (B).

In such a composition, the compound (E) relieves the acidity and can prevent corrosion of a metallic part in a substrate which comes into contact with the composition by the printing method. Moreover, when the conductive polymer composition is used to form a film as a hole injection layer of a thin film-stacked device, such as organic EL and solar cell, it is possible to control acid diffusion into adjacent layers of the laminate structure and into other constituent layers, and to reduce adverse influence on the device performance. Further, the conductive polymer composition makes further favorable the coatability onto a material to be processed, such as a substrate, by droplet-spraying application methods including spray coating and inkjet, in addition to conventional film formation techniques by spin coating. The film to be formed also has favorable surface flatness.

Additionally, the inventive conductive polymer composition is preferably used to form a hole injection layer of an organic thin-film device.

The conductive film formed from the inventive conductive polymer composition is excellent in conductivity and hole injectability, and has low moisture content in the formed film. Thus, the resulting film can favorably function as a hole injection layer of organic EL or solar cell.

Further, the present invention provides a substrate comprising an organic thin-film device, wherein the organic thin-film device comprises a hole injection layer formed from the above-described conductive polymer composition.

The inventive conductive polymer composition is particularly suitably utilizable in such usages.

Furthermore, the present invention provides a method for producing the substrate, comprising applying the conductive polymer composition by employing spin coating, a spray coater, or inkjet printing.

The inventive substrate can be easily produced by such a method.

Advantageous Effects of Invention

As described above, the inventive conductive polymer composition makes it possible to provide a conductive polymer composition having low viscosity, favorable filterability, and good film formability by coating on inorganic and organic substrates. Moreover, residual moisture in the film is efficiently removed during the film formation by the influence of fluorine atoms present in the repeating units "a" and "b" in the dopant polymer as the component (B). The film to be formed can be a conductive film having transparency, flatness, and appropriate conductivity, and favorable hole injection function. Further, in the component (B), the repeating unit "b" containing a sulfo group is copolymerized with the non-doping fluorinated unit "a" having no sulfonic acid terminal (sulfonated terminal). The use of this polymer as a dopant to form a composite with the component (A) decreases extra non-doping sulfonated terminals, consequently generating fewer $H^+$. Furthermore, as the component (E) relieves the acidity, this makes it possible to suppress corrosion of a metallic part of printer member which comes into contacts with the liquid composition, and to suppress the influence of $H^+$ on other constituent layers when the inventive conductive polymer composition is employed as a constituent film of a thin film-stacked device. Furthermore, the conductive film formed from the inventive conductive polymer composition is excellent in hole injection efficiency, transparency, etc., and can reduce residual moisture in the film when employed as a constituent film of a thin film-stacked device. Accordingly, such a conductive film can effectively function as a hole injection layer of such a thin film-stacked device. In addition, since the inventive conductive polymer composition is mixed with an organic solvent, the surface tension and the contact angle are so low that the leveling property on a substrate is favorable and it is possible to form a defect-free flat uniform film even when the inventive composition is used in such a droplet-application method as spray coating or in an ink-like form for inkjet printing, besides conventional spin coating. Additionally, since the film formed from the composition has an electric conductivity (S/cm) of less than 1.00E-05, a portion other than an ITO electrode surface designed to emit light is successfully prevented from emitting light when the film is applied as a hole injection layer in an organic EL device to emit light.

DESCRIPTION OF EMBODIMENTS

Deposition materials have often been employed as hole injection layers of organic thin-film devices so far. Nevertheless, in the vapor deposition process, roll-to-roll application at normal pressure to improve productivity is difficult, and it is also difficult to planarize the surface roughness on the underlayer ITO electrode to reduce device defects due to protrusion or pinhole of ITO. Thus, there have been demands for the development of a coating-type hole injection layer material which enables printing and roll-to-roll application at normal pressure, and which can planarize the surface roughness on an underlayer ITO electrode. From the foregoing, an effective and quite promising hole injection layer material in the production of organic thin-film devices in the future will be a conductive polymer composition as described above which has low viscosity, favorable filterability, and favorable film formability by coating on inorganic and organic substrates, which can form a low-defect continuous film not only by conventional spin coating but also with a spray coater or by inkjet printing, which results in a film having less residual moisture and favorable flatness, and which prevents light emission from a portion other than an underlayer electrode surface when the composition is applied as a hole injection layer of an organic EL.

The present inventors have intensively studied the problems and consequently found the following facts. Specifically, in place of polystyrenesulfonic acid homopolymer (PSS) widely used as a dopant for a conductive polymer material represented by PEDOT-PSS having a function as a coating-type hole injection layer material, a dopant polymer is prepared by copolymerizing a non-doping fluorinated unit "a" and a repeating unit "b" including a repeating unit with a sulfo group fluorinated at the α-position, for example. Further, a $H_2O$ dispersion of a conductive polymer material using this dopant polymer is mixed with a water-soluble organic solvent. A conductive polymer composition thus obtained has favorable filterability and favorable ability to form a low-defect continuous film on an inorganic substrate even when a spray coater or an inkjet printer is used. Moreover, the conductive polymer composition can form a conductive film having little residual moisture and high flatness. Further, the inventors found that when a film formed from this composition has an electric conductivity lower than a predetermined value and is mounted as a constituent layer of an organic EL device, favorable results are obtained in the device performance evaluation such that the film exhibits uniform light emission, low luminance attenuation percentage, long light lifetime, and no extra light emission (crosstalk) outside the underlayer ITO electrode surface. These findings have led to the completion of the present invention.

Specifically, the present invention is a conductive polymer composition comprising:
a composite comprising
a π-conjugated polymer (A), and
a polymer (B) shown by the following general formula (1);

$H_2O$ (D) for dispersing the composite;
a water-soluble organic solvent (C); and
a compound (E) shown by the following general formula (2),
wherein an electric conductivity of a film with a thickness of 20 to 200 nm formed from the conductive polymer composition is less than 1.00E-05 S/cm,

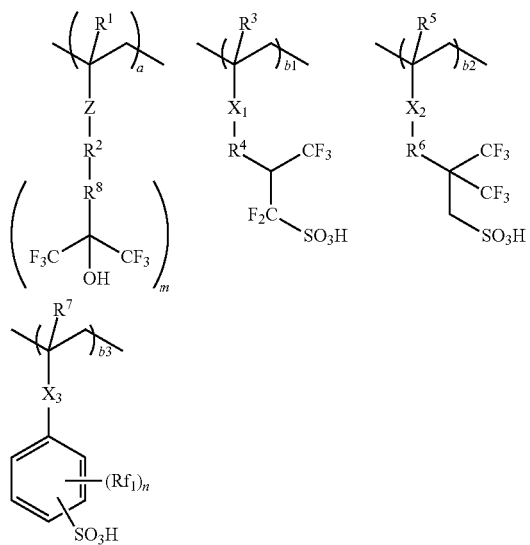

(1)

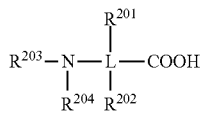

(2)

wherein $R^{201}$ and $R^{202}$ each independently represent any of a hydrogen atom, a heteroatom, and a linear, branched, or cyclic monovalent hydrocarbon group having 1 to 20 carbon atoms optionally having a heteroatom; $R^{203}$ and $R^{204}$ each independently represent any of a hydrogen atom and a linear, branched, or cyclic monovalent hydrocarbon group having 1 to 20 carbon atoms optionally having a heteroatom; $R^{201}$ and $R^{203}$, or $R^{201}$ and $R^{204}$, are optionally bonded to each other to form a ring; L represents a linear, branched or cyclic tetravalent organic group having 1 to 20 carbon atoms optionally having a heteroatom; and when L has a heteroatom, the heteroatom is optionally an ion.

Hereinafter, the present invention will be described in detail, but the present invention is not limited thereto.

[(A) π-Conjugated Polymer]

The inventive conductive polymer composition contains a π-conjugated polymer as a component (A). This component (A) may be a polymer containing a precursor monomer (organic monomer molecule) for forming a π-conjugated chain (a structure in which a single bond and a double bond are alternately continued).

Examples of such a precursor monomer include monocyclic aromatics, such as pyrroles, thiophenes, thiophene vinylenes, selenophenes, tellurophenes, phenylenes, phenylene vinylenes, and anilines; polycyclic aromatics, such as acenes; acetylenes; etc. A homopolymer or a copolymer of these monomers can be used as the component (A).

wherein $R^1$ represents a hydrogen atom or a methyl group; Z represents any of a phenylene group, a naphthylene group, an ester group, an ether group, an amino group, and an amide group; when Z is a phenylene group or a naphthylene group, $R^2$ represents any of a single bond and a linear, branched, or cyclic hydrocarbon group having 1 to 12 carbon atoms optionally having one or both of an ester group and an ether group; when Z is an ester group, an ether group, an amino group, or an amide group, $R^2$ represents any of a single bond and a linear, branched, or cyclic hydrocarbon group having 1 to 14 carbon atoms optionally having an ether group; "m" represents any one of 1 to 3; $R^3$, $R^5$, and $R^7$ each independently represent a hydrogen atom or a methyl group; $R^4$ and $R^6$ each independently represent any of a single bond and a linear, branched, or cyclic hydrocarbon group having 1 to 12 carbon atoms optionally having one or both of an ether group and an ester group; $R^8$ represents any of a single bond, a methylene group, an ethylidene group, an isopropylidene group, an ether group, an ester group, an amino group, an amide group, and a linear, branched, or cyclic hydrocarbon group having 1 to 12 carbon atoms optionally containing an ether group, an ester group, an amino group, an amide group, or a heteroatom, and the amino groups and the amide groups each optionally contain any of a hydrogen atom and a linear, branched, or cyclic hydrocarbon group having 1 to 12 carbon atoms optionally containing a heteroatom; $X_1$ and $X_2$ each independently represent any of a single bond, a phenylene group, a naphthylene group, an ether group, an ester group, and an amide group; $X_3$ represents any of a single bond, an ether group, and an ester group; $Rf_1$ represents a fluorine atom or a trifluoromethyl group; "a", b1, b2, and b3 satisfy $0<a<1.0$, $0\leq b1<1.0$, $0\leq b2<1.0$, $0\leq b3<1.0$, and $0<b1+b2+b3<1.0$; and "n" represents an integer of 1 to 4, and Among the monomers, from the viewpoints of easiness in polymerization and stability in air, pyrrole, thiophene, selenophene, tellurophene, aniline, polycyclic aromatic compounds, and derivatives thereof are preferable, and pyrrole, thiophene, aniline, and derivatives thereof are particularly preferable.

In addition, the component (A) can give sufficient conductivity even when the monomer constituting the π-conjugated polymer is not substituted. Nevertheless, for higher conductivity, a monomer substituted by an alkyl group, a carboxyl group, a sulfo group, an alkoxy group, a hydroxyl group, a cyano group, a halogen atom, or the like may be used.

Specific examples of the monomers of pyrroles, thiophenes, and anilines include pyrrole, N-methylpyrrole, 3-methylpyrrole, 3-ethylpyrrole, 3-n-propylpyrrole, 3-butylpyrrole, 3-octylpyrrole, 3-decylpyrrole, 3-dodecylpyrrole, 3,4-dimethylpyrrole, 3,4-dibutylpyrrole, 3-carboxypyrrole, 3-methyl-4-carboxypyrrole, 3-methyl-4-carboxyethylpyrrole, 3-methyl-4-carboxybutylpyrrole, 3-hydroxypyrrole, 3-methoxypyrrole, 3-ethoxypyrrole, 3-butoxypyrrole, 3-hexyloxypyrrole, 3-methyl-4-hexyloxypyrrole; thiophene, 3-methylthiophene, 3-ethylthiophene, 3-propylthiophene, 3-butylthiophene, 3-hexylthiophene, 3-heptylthiophene, 3-octylthiophene, 3-decylthiophene, 3-dodecylthiophene, 3-octadecylthiophene, 3-bromothiophene, 3-chlorothiophene, 3-iodothiophene, 3-cyanothiophene, 3-phenylthiophene, 3,4-dimethylthiophene, 3,4-dibutylthiophene, 3-hydroxythiophene, 3-methoxythiophene, 3-ethoxythiophene, 3-butoxythiophene, 3-hexyloxythiophene, 3-heptyloxythiophene, 3-octyloxythiophene, 3-decyloxythiophene, 3-dodecyloxythiophene, 3-octadecyloxythiophene, 3,4-dihydroxythiophene, 3,4-dimethoxythiophene, 3,4-diethoxythiophene, 3,4-dipropoxythiophene, 3,4-dibutoxythiophene, 3,4-dihexyloxythiophene, 3,4-diheptyloxythiophene, 3,4-dioctyloxythiophene, 3,4-didecyloxythiophene, 3,4-didodecyloxythiophene, 3,4-ethylenedioxythiophene, 3,4-propylenedioxythiophene, 3,4-butenedioxythiophene, 3-methyl-4-methoxythiophene, 3-methyl-4-ethoxythiophene, 3-carboxythiophene, 3-methyl-4-carboxythiophene, 3-methyl-4-carboxyethylthiophene, 3-methyl-4-carboxybutylthiophene; aniline, 2-methylaniline, 3-isobutylaniline, 2-methoxyaniline, 2-ethoxyaniline, 2-anilinesulfonic acid, 3-anilinesulfonic acid; etc.

Particularly, a (co)polymer containing one or more selected from pyrrole, thiophene, N-methylpyrrole, 3-methylthiophene, 3-methoxythiophene, and 3,4-ethylenedioxythiophene is suitably used from the viewpoints of a resistance value and reactivity. Moreover, a homopolymer of pyrrole or 3,4-ethylenedioxythiophene is more preferable because the conductivity is high.

For a practical reason, the number of these repeating units repeated is preferably in a range of 2 to 20, more preferably 6 to 15. The molecular weight is preferably about 130 to 5000.

[(B) Dopant Polymer]

The inventive conductive polymer composition contains a dopant polymer as a component (B). This dopant polymer as the component (B) is a strongly acidic polyanion containing repeating units "a" and "b" (b1, b2, b3) shown by the following general formula (1). A monomer for forming the repeating unit "a" is shown by the following general formula (6).

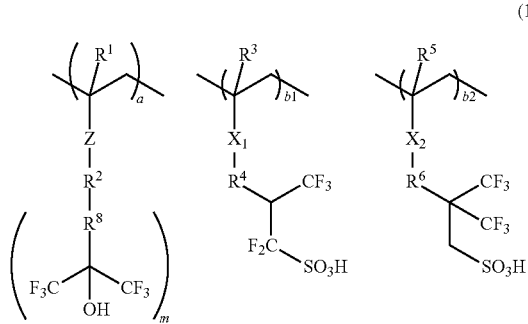

(1)

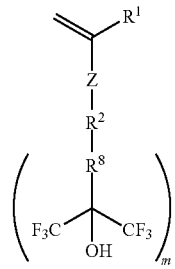

(6)

In the formulae, $R^1$ represents a hydrogen atom or a methyl group. Z represents any of a phenylene group, a naphthylene group, an ester group, an ether group, an amino group, and an amide group. When Z is a phenylene group or a naphthylene group, $R^2$ represents any of a single bond and a linear, branched, or cyclic hydrocarbon group having 1 to 12 carbon atoms optionally having one or both of an ester group and an ether group. When Z is an ester group, an ether group, an amino group, or an amide group, $R^2$ represents any of a single bond and a linear, branched, or cyclic hydrocarbon group having 1 to 14 carbon atoms optionally having an ether group. "m" represents any one of 1 to 3. $R^3$, $R^5$, and $R^7$ each independently represent a hydrogen atom or a methyl group. $R^4$ and $R^6$ each independently represent any of a single bond and a linear, branched, or cyclic hydrocarbon group having 1 to 12 carbon atoms optionally having one or both of an ether group and an ester group. $R^8$ represents any of a single bond, a methylene group, an ethylidene group, an isopropylidene group, an ether group, an ester group, an amino group, an amide group, and a linear, branched, or cyclic hydrocarbon group having 1 to 12 carbon atoms optionally containing an ether group, an ester group, an amino group, an amide group, or a heteroatom; the amino groups and the amide groups each optionally contain any of a hydrogen atom and a linear, branched, or cyclic hydrocarbon group having 1 to 12 carbon atoms optionally containing a heteroatom. $X_1$ and $X_2$ each independently represent any of a single bond, a phenylene group, a naphthylene group, an ether group, an ester group, and an amide group. $X_3$ represents any of a single bond, an ether group, and an ester group. $Rf_1$ represents a fluorine atom or a trifluoromethyl group. "a", b1, b2, and b3 satisfy $0<a<1.0$, $0≤b1<1.0$, $0≤b2<1.0$, $0≤b3<1.0$, and $0<b1+b2+b3<1.0$. "n" represents an integer of 1 to 4.

In the component (B), the repeating unit "a" preferably includes one or more selected from repeating units a1 to a4 shown by the following general formulae (3-1) to (3-4).

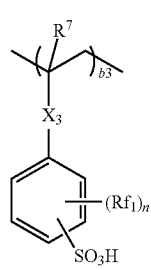

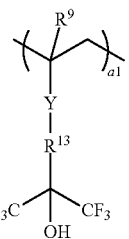

(3-1)

-continued

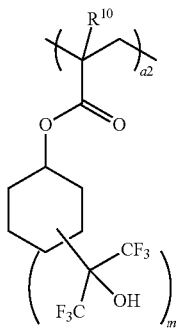
(3-2)

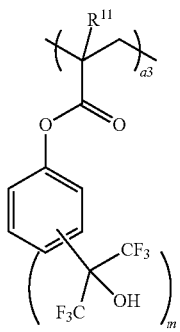
(3-3)

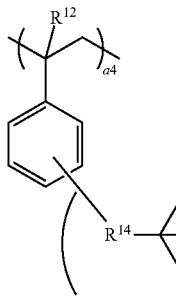
(3-4)

In the formulae, $R^9$, $R^{10}$, $R^{11}$, and $R^{12}$ each independently represent a hydrogen atom or a methyl group. $R^{13}$ represents any of a single bond and a linear, branched, or cyclic hydrocarbon group having 1 to 14 carbon atoms optionally having an ether group. $R^{14}$ represents any of a single bond, a methylene group, an ethylidene group, an isopropylidene group, an ether group, an ester group, an amino group, an amide group, and a linear, branched, or cyclic hydrocarbon group having 1 to 12 carbon atoms optionally containing an ether group, an ester group, an amino group, an amide group, or a heteroatom; the amino groups and the amide groups each optionally contain any of a hydrogen atom and a linear, branched, or cyclic hydrocarbon group having 1 to 12 carbon atoms optionally containing a heteroatom. Y represents any of an ether group, an ester group, an amino group, and an amide group; the amino group and the amide group each optionally contain any of a hydrogen atom and a linear, branched, or cyclic hydrocarbon group having 1 to 12 carbon atoms optionally containing a heteroatom. "m" represents any one of 1 to 3. a1, a2, a3, and a4 satisfy 0≤a1<1.0, 0≤a2<1.0, 0≤a3<1.0, 0≤a4<1.0, and 0<a1+a2+a3+a4<1.0.

In the component (B), the higher the content of the repeating unit "a" relative to repeating unit "b", the more clearly the effects of the present invention are exhibited. The content percentage is preferably 40≤a≤60 to sufficiently obtain the effects of the present invention. Specifically, in order to achieve sufficient hole injection efficiency and to prevent extra light emission (crosstalk) outside an ITO electrode serving as a positive electrode when the composition is applied as a hole injection layer in an organic EL device, preferable ranges for exhibiting appropriate film electric conductivity are 40≤a≤60 and 40≤b≤60, or 40≤a≤60 and 40≤b+c≤60; in this case, c≤40 is preferable. "c" will be described later.

A monomer for providing the repeating unit "a" can be specifically exemplified by the following.

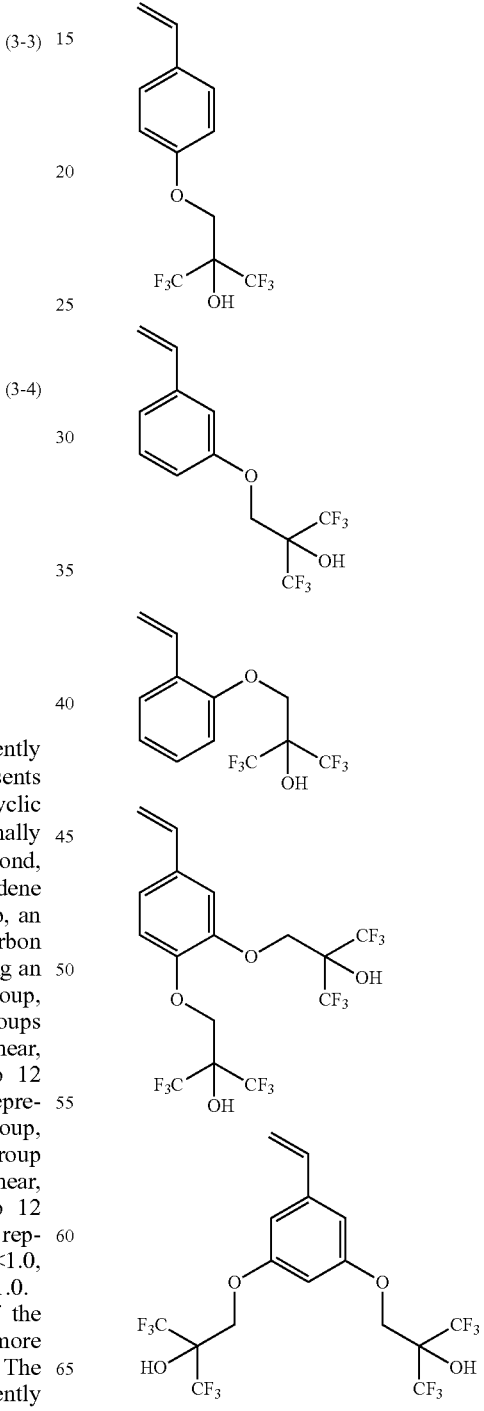

-continued
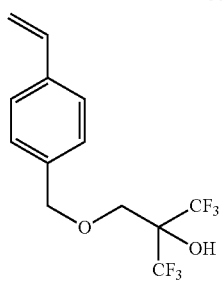
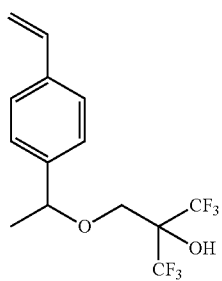
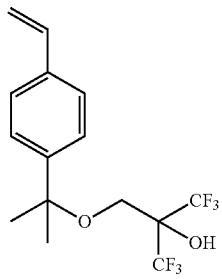
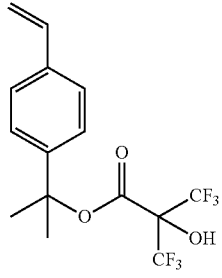
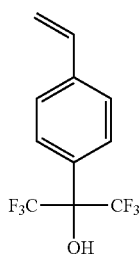
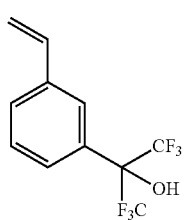
-continued
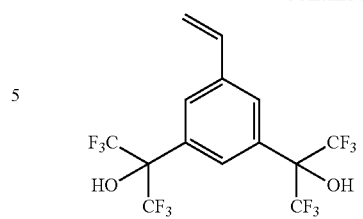
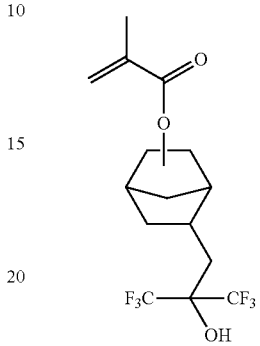
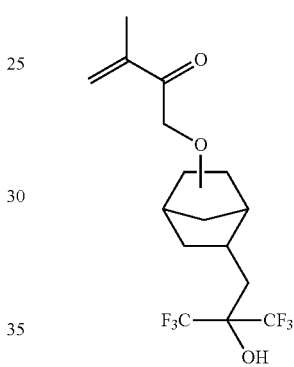
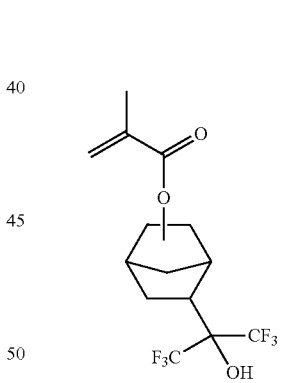
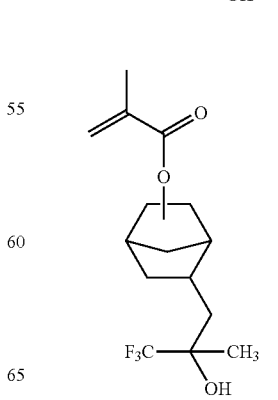

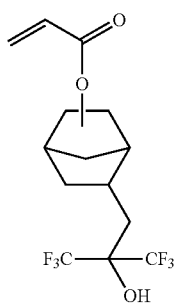
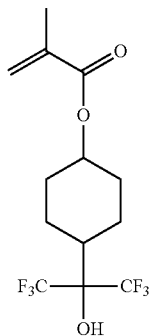
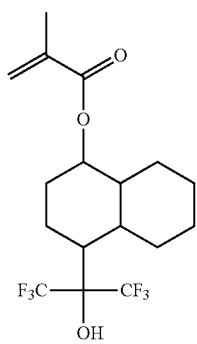
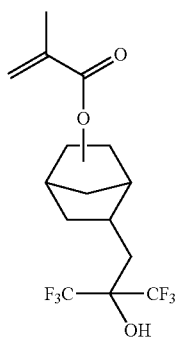
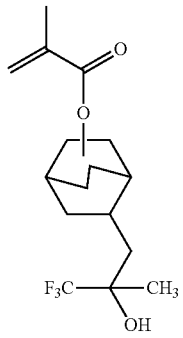
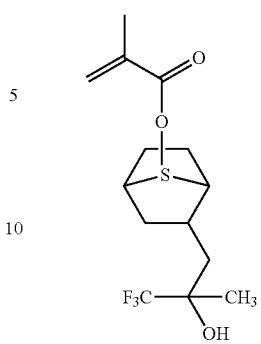
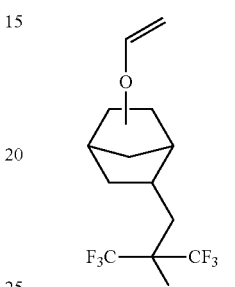
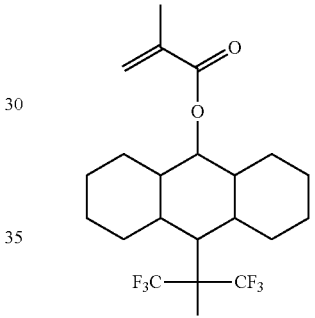
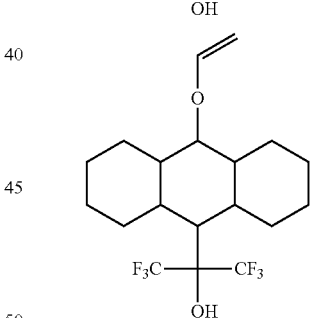
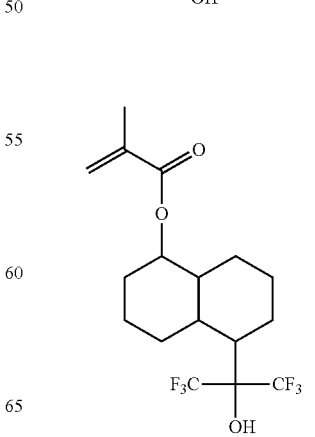

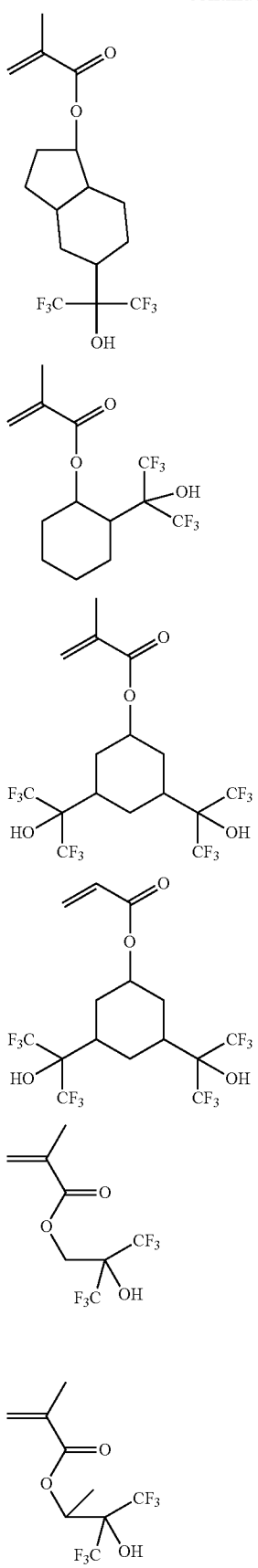
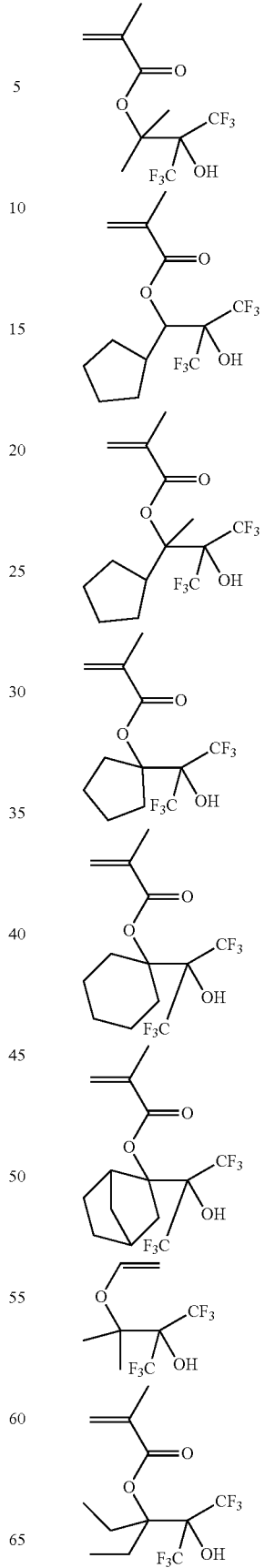

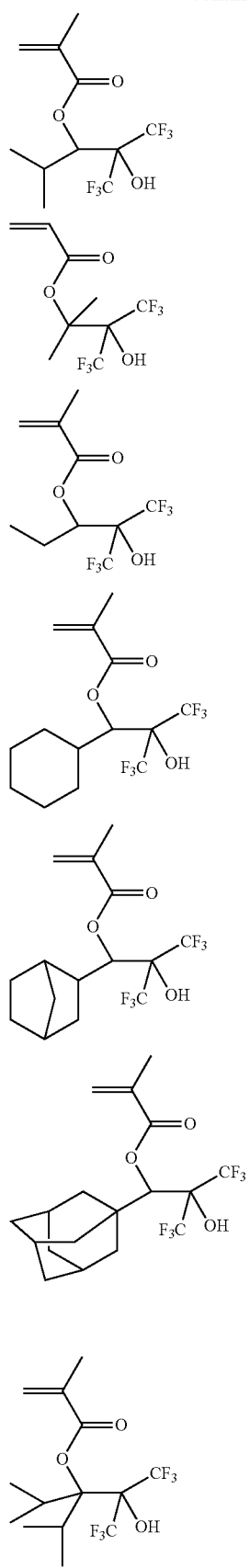
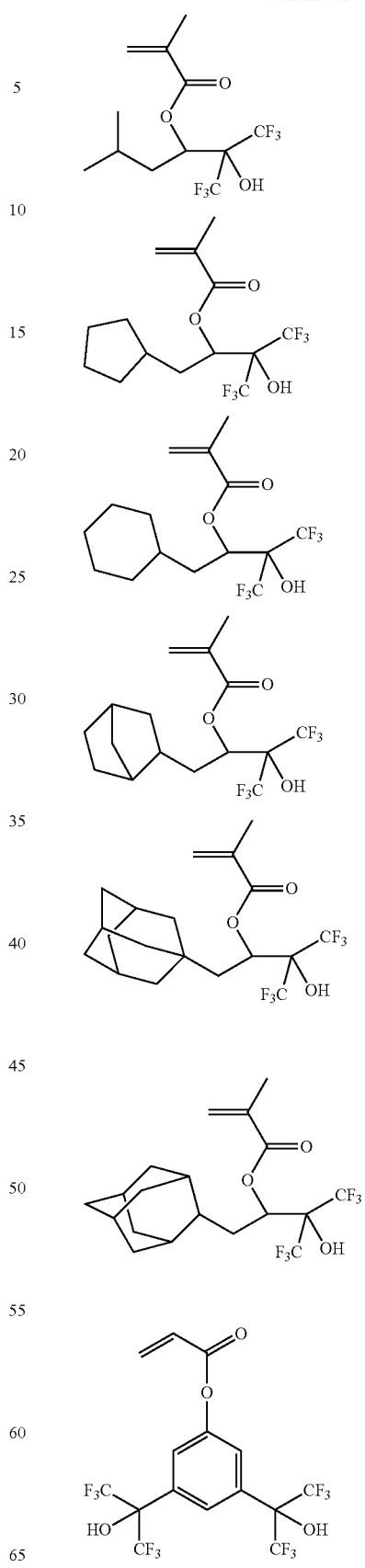

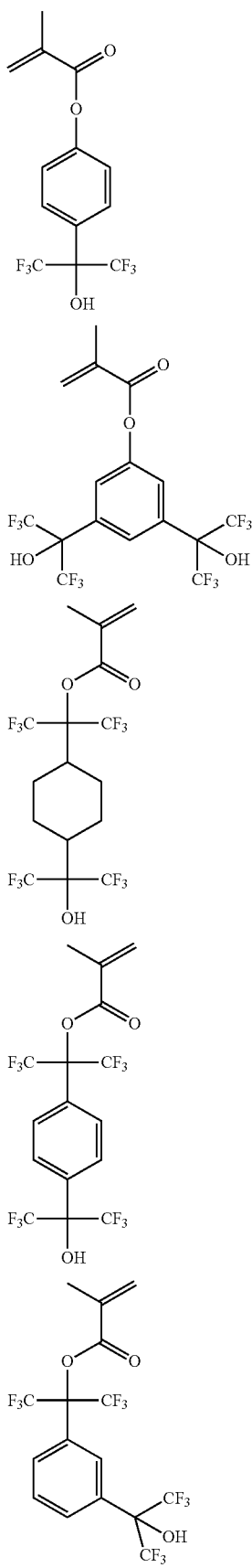
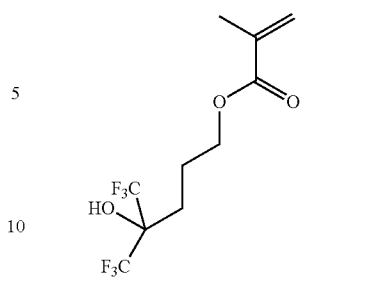
As the repeating unit b1, the component (B) preferably contains one or more selected from repeating units b'1 to b'4 shown by the following general formulae (4-1) to (4-4).
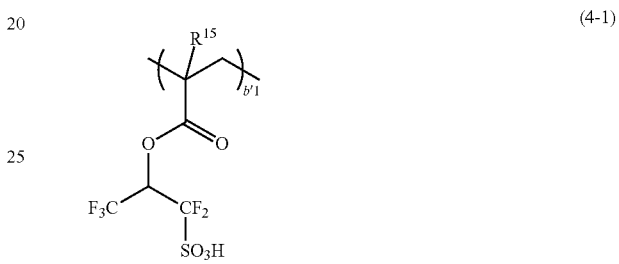
(4-1)
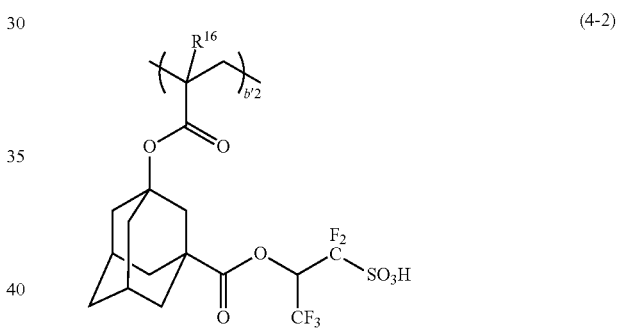
(4-2)
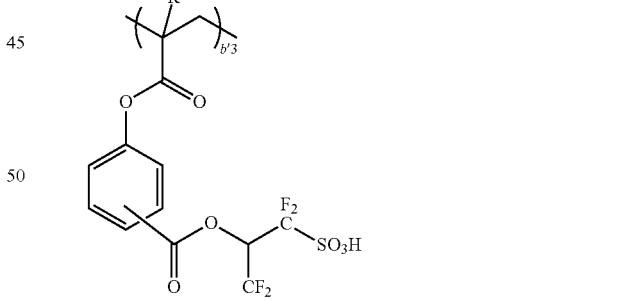
(4-3)
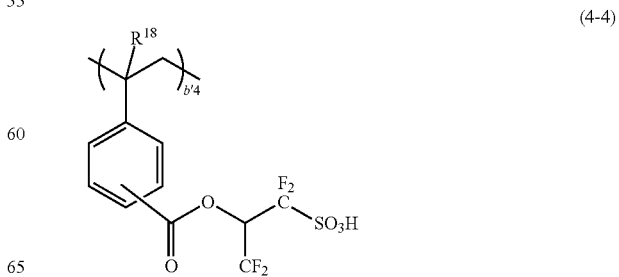
(4-4)

In the formulae, $R^{15}$, $R^{16}$, $R^{17}$ and $R^{18}$ each independently represent a hydrogen atom or a methyl group. b'1, b'2, b'3, and b'4 satisfy $0 \leq b'1 < 1.0$, $0 \leq b'2 < 1.0$, $0 \leq b'3 < 1.0$, $0 \leq b'4 < 1.0$, and $0 < b'1+b'2+b'3+b'4 < 1.0$.
A monomer for providing the repeating unit b1 can be specifically exemplified by the following.
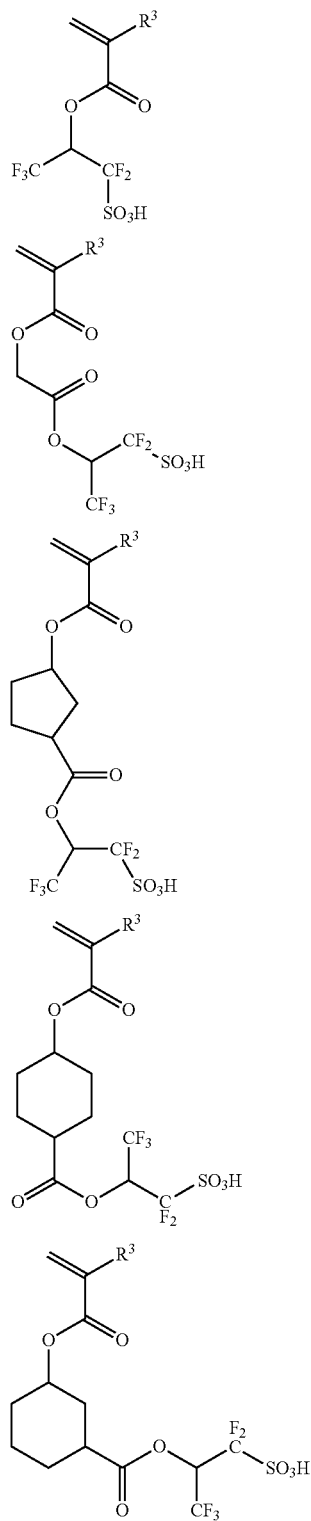
-continued
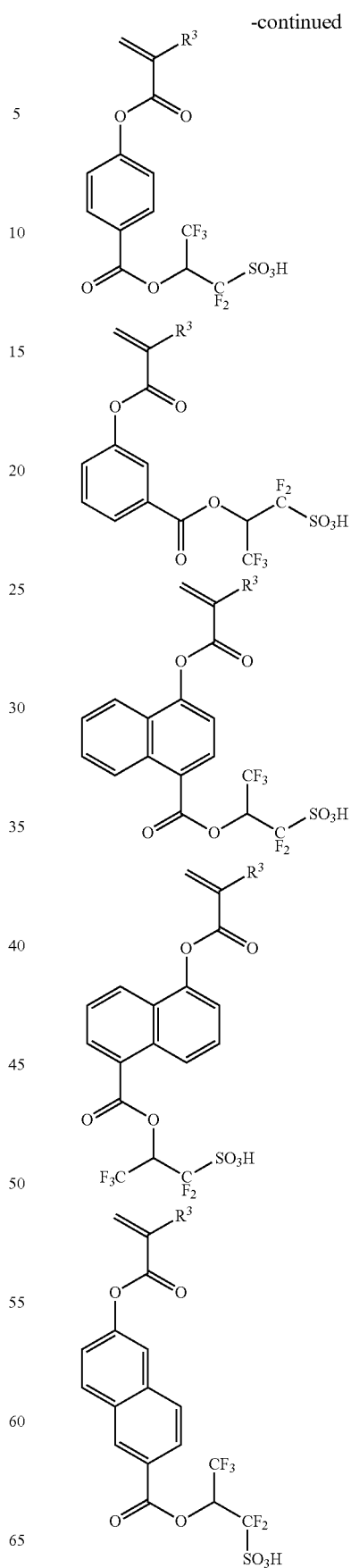

31
-continued
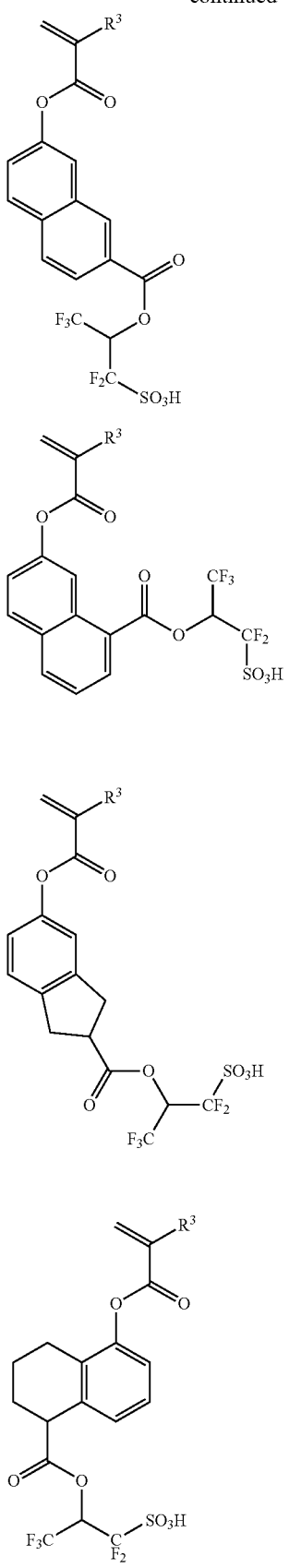
32
-continued
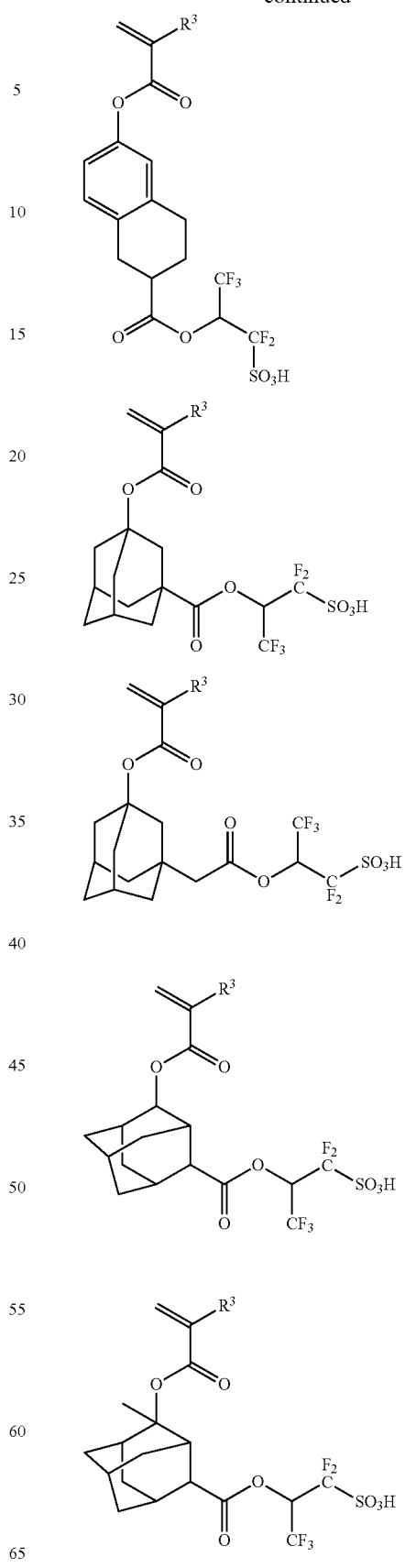

33
-continued
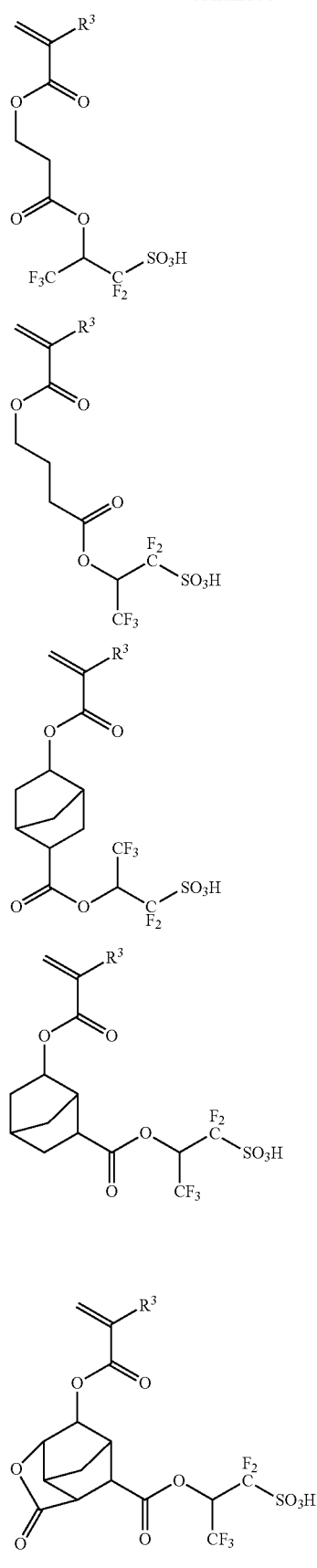
34
-continued
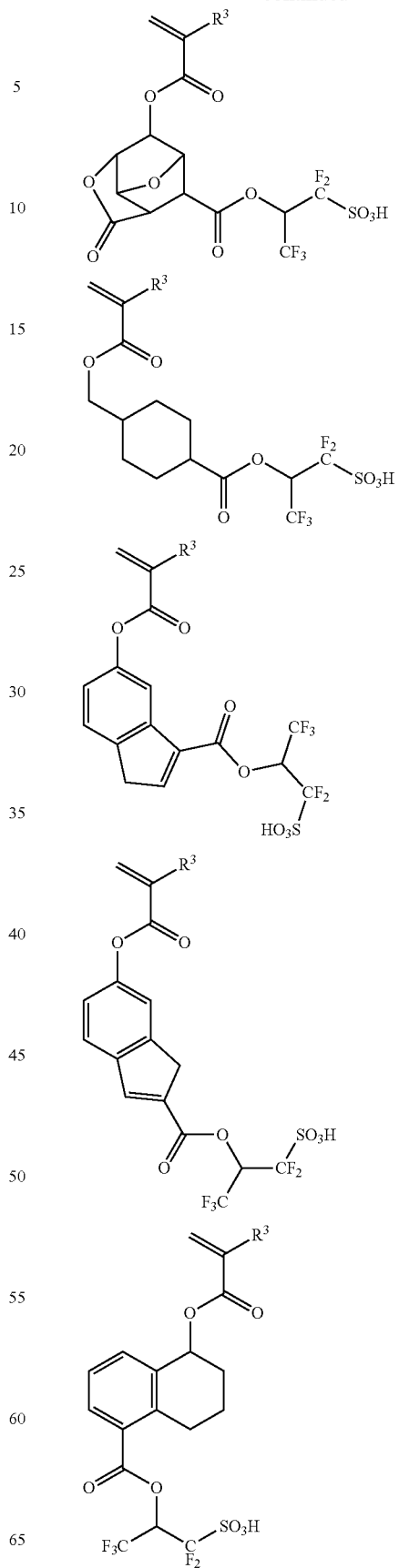

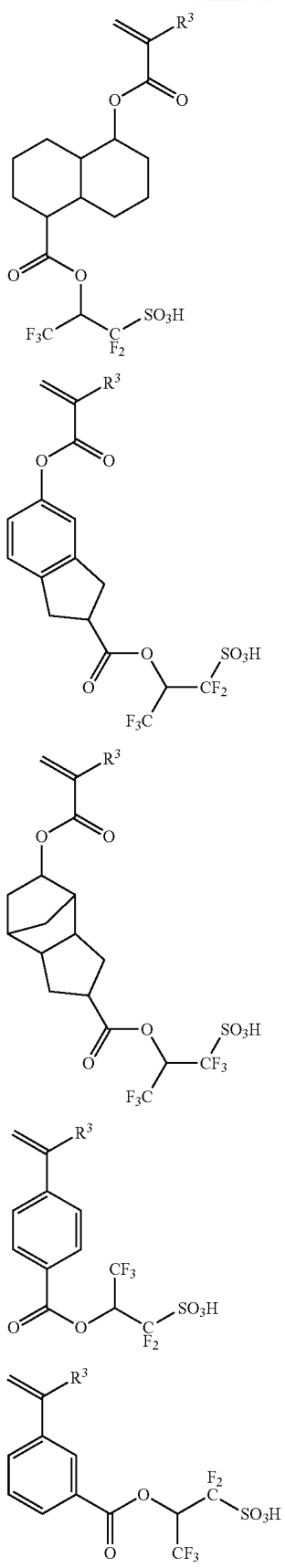
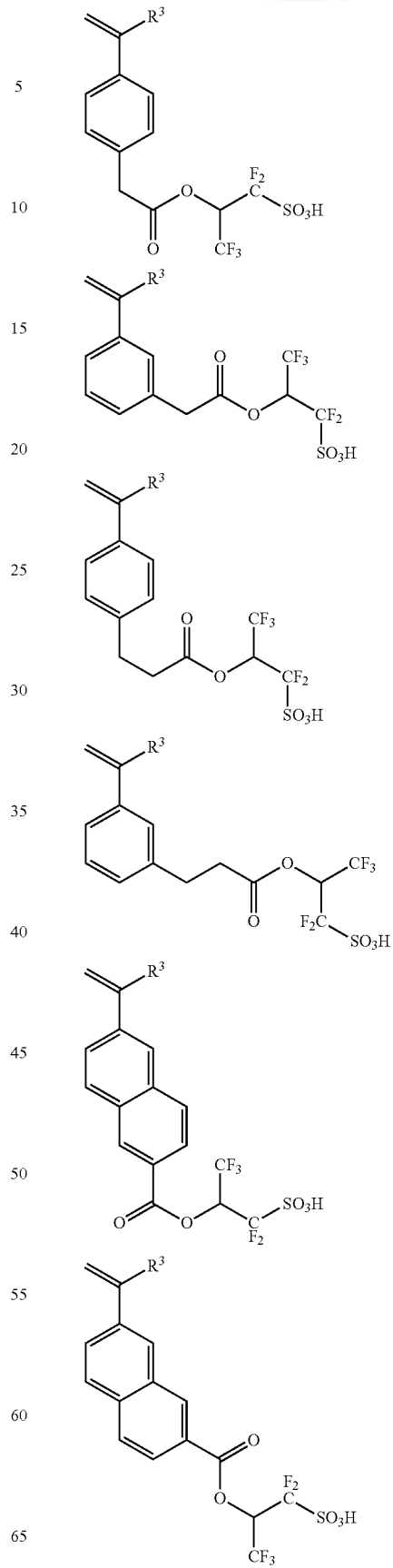

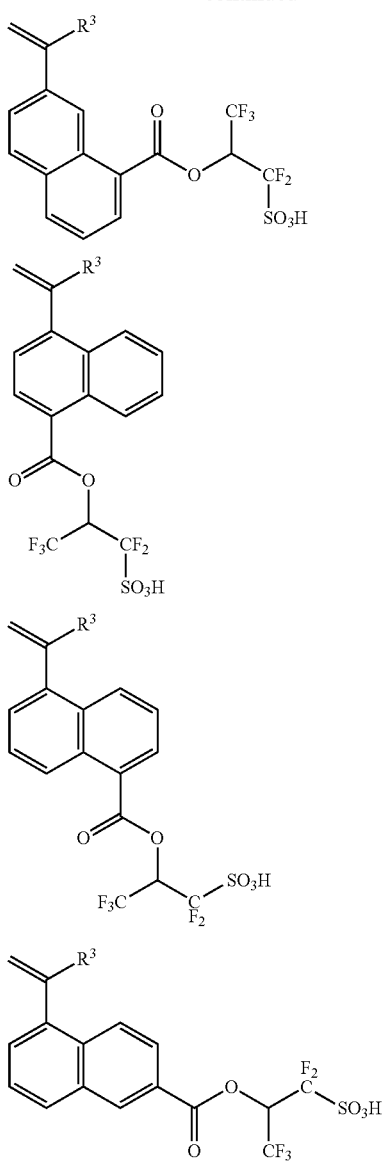
In the formulae, $R^3$ is as defined above.
A monomer for providing the repeating unit b2 can be specifically exemplified by the following.
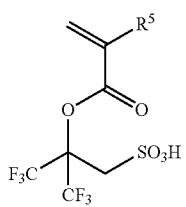
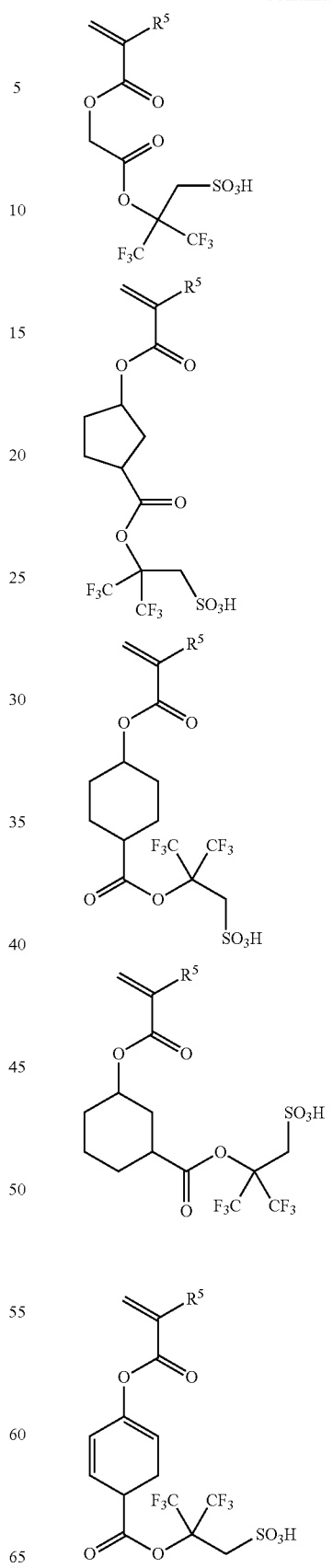

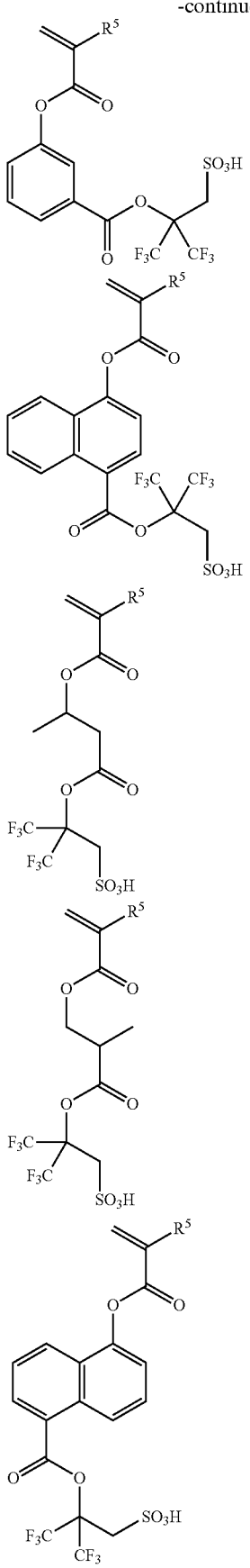
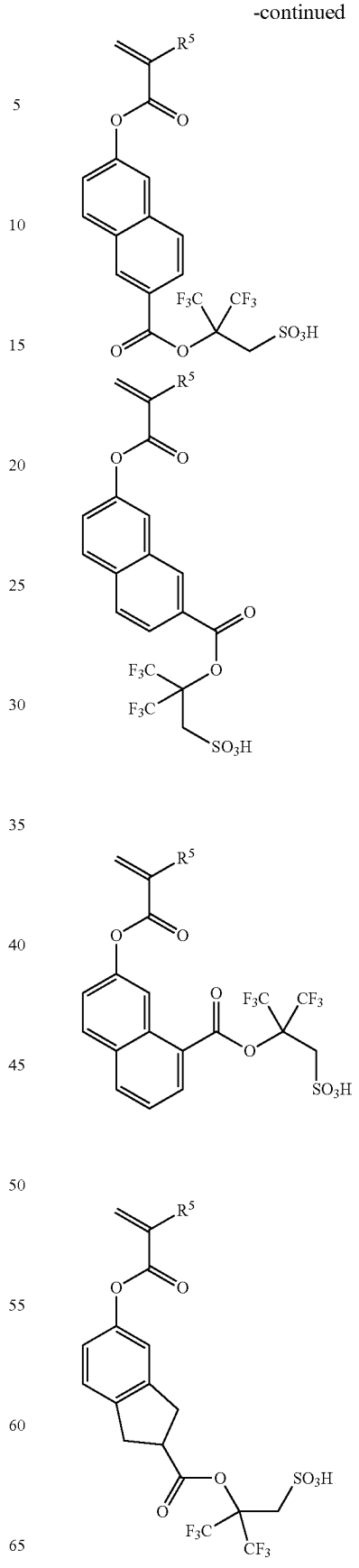

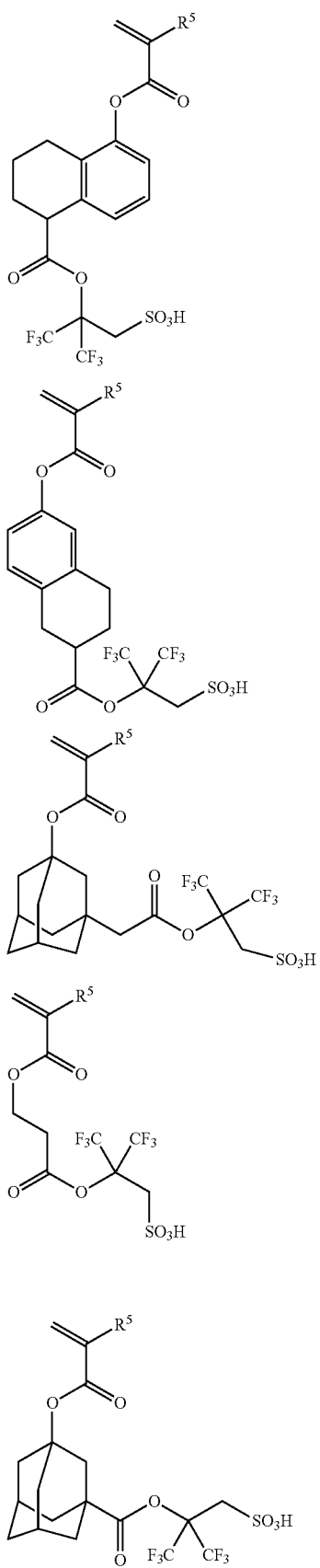
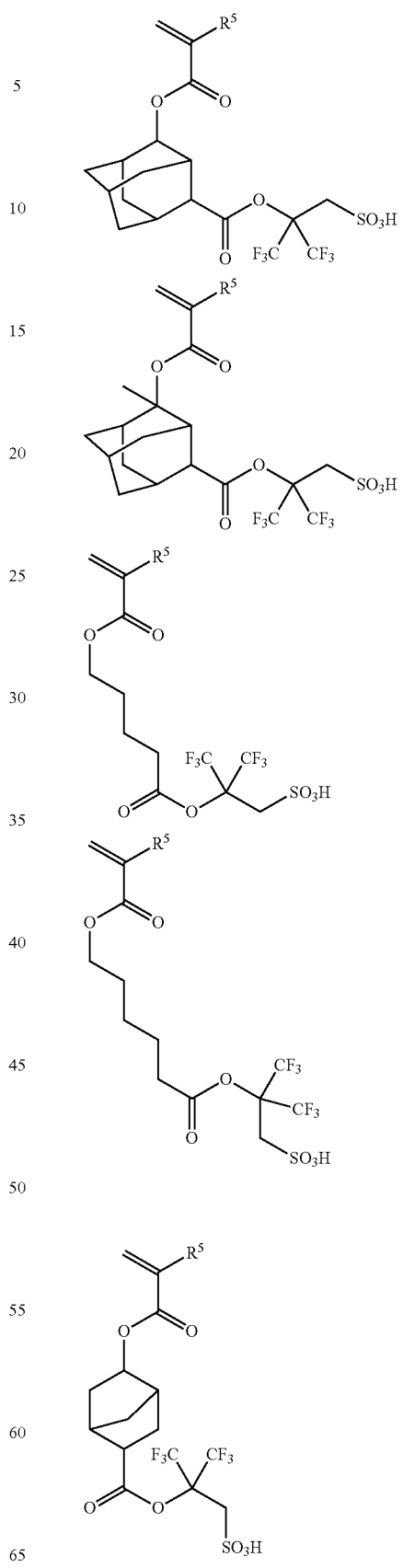

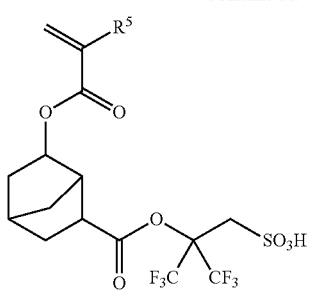
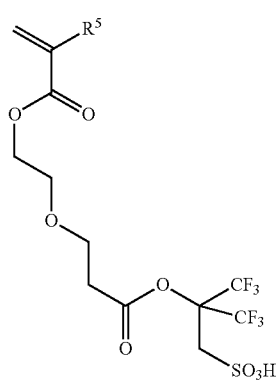
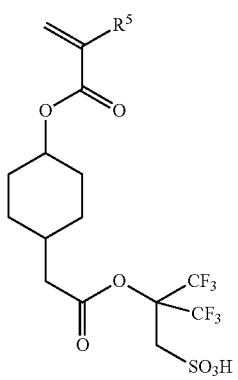
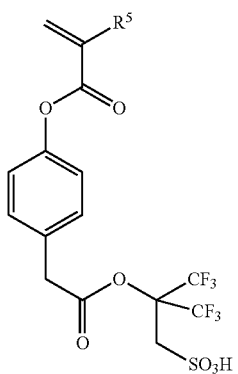
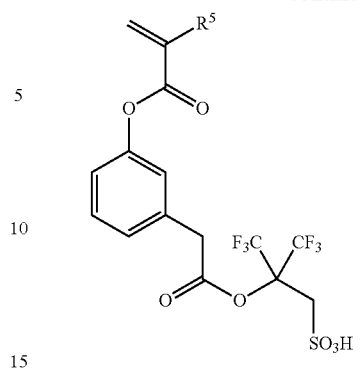
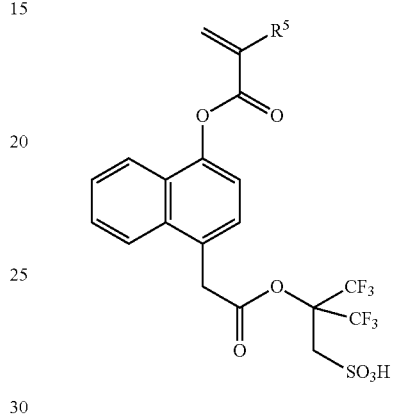
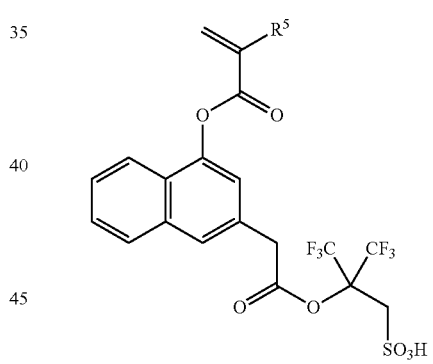
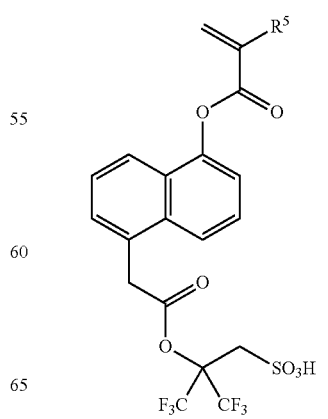

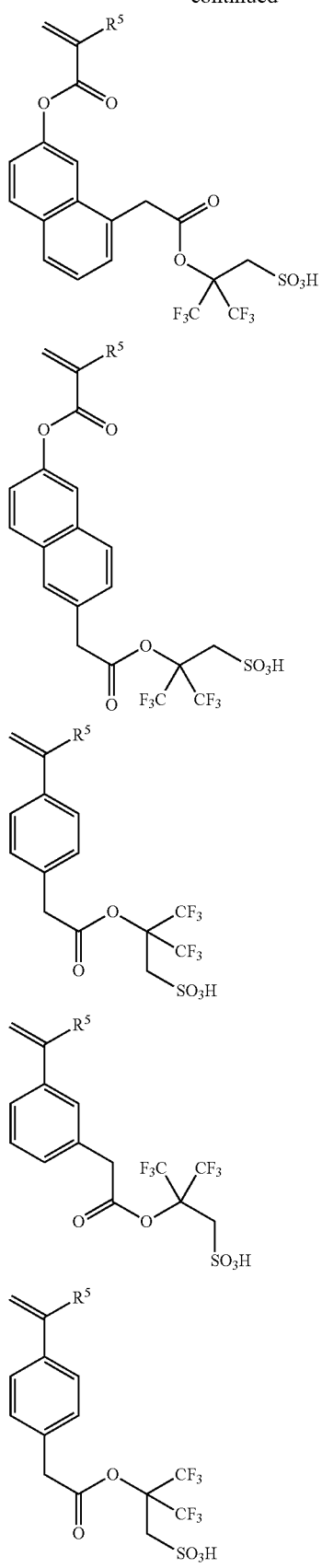
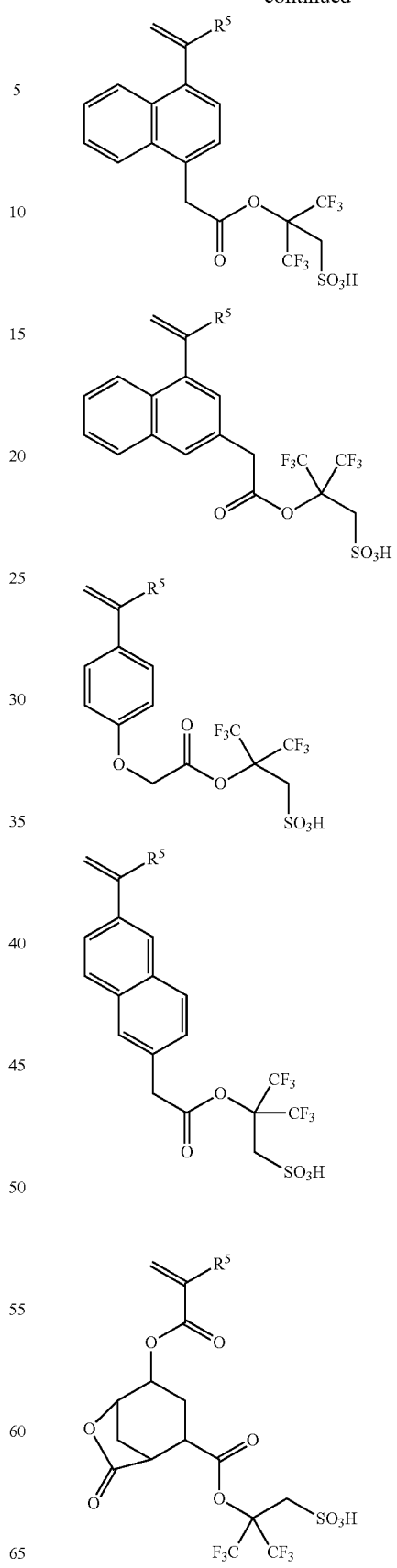

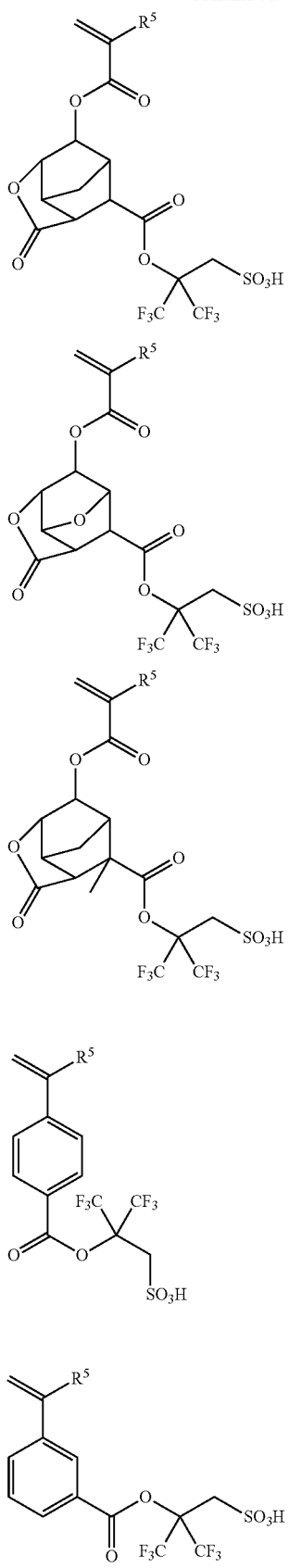
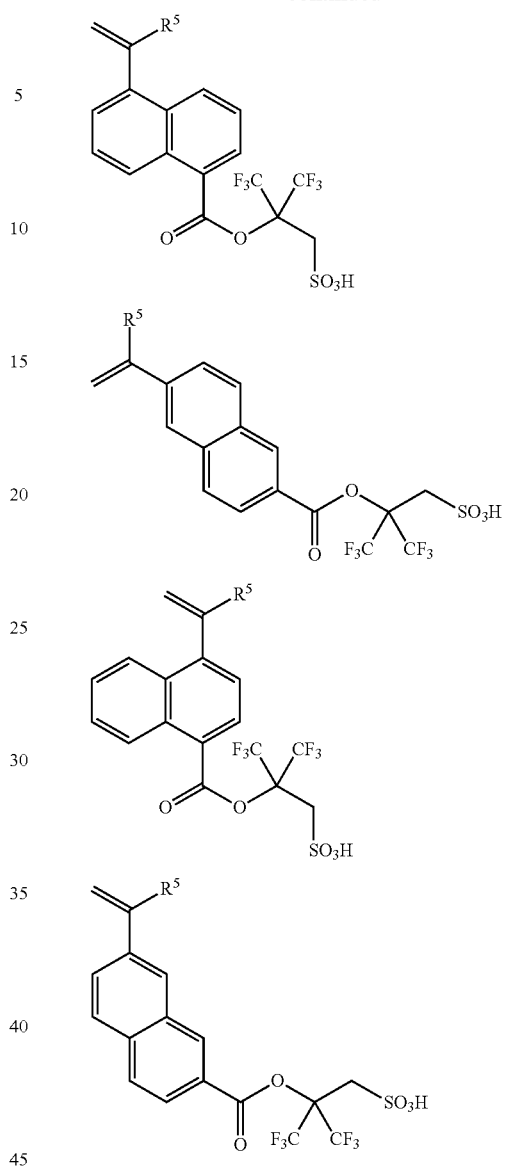
In the formulae, R⁵ is as defined above.
A monomer for providing the repeating unit b3 can be specifically exemplified by the following.
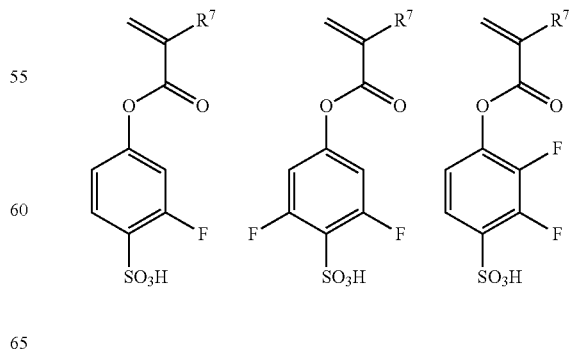

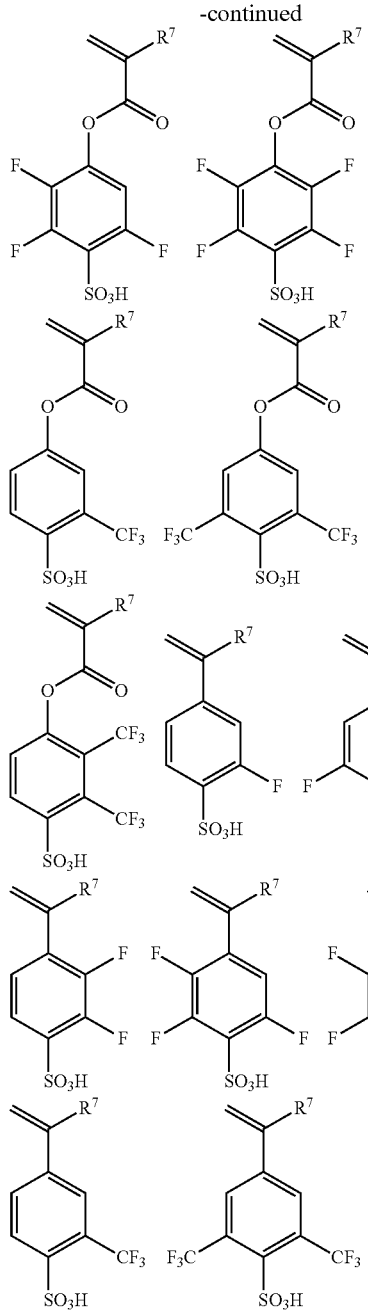

In the formulae, R⁷ is as defined above.

The component (B) can further contain a repeating unit "c" shown by the following general formula (5).

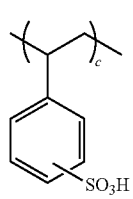 (5)

"c" satisfies 0<c<1.0.

A monomer for providing the repeating unit "c" can be specifically exemplified by the following.

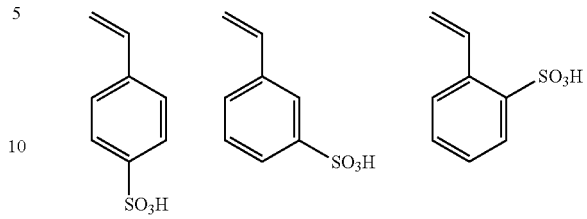

Furthermore, the dopant polymer as the component (B) may have a repeating unit "d" other than the repeating units "a" to "c". Examples of the repeating unit "d" can include repeating units based on styrene, vinylnaphthalene, vinylsilane, acenaphthylene, indene, vinylcarbazole, etc.

A monomer for providing the repeating unit "d" can be specifically exemplified by the following.

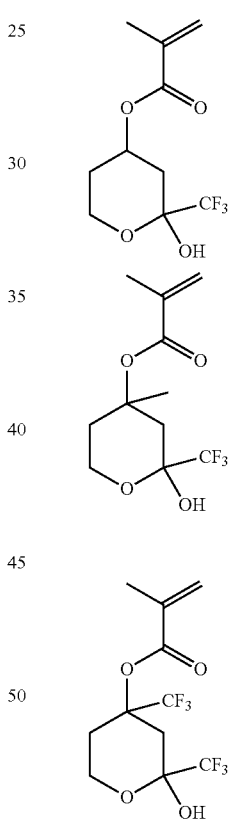

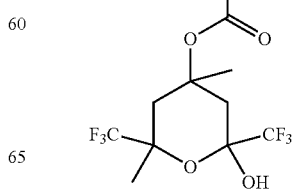

51
-continued
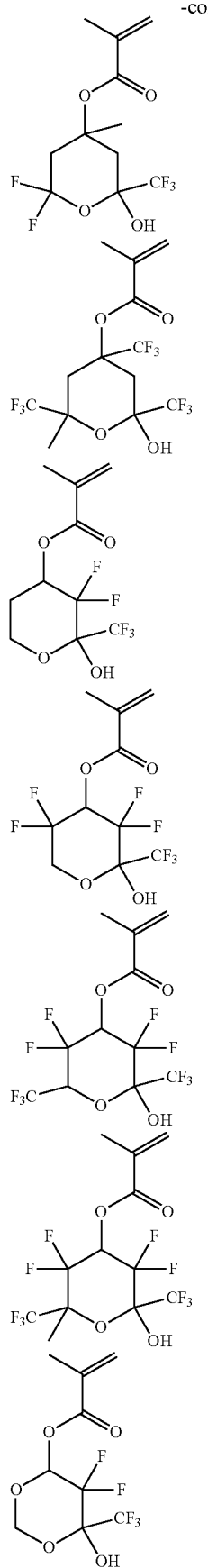
52
-continued
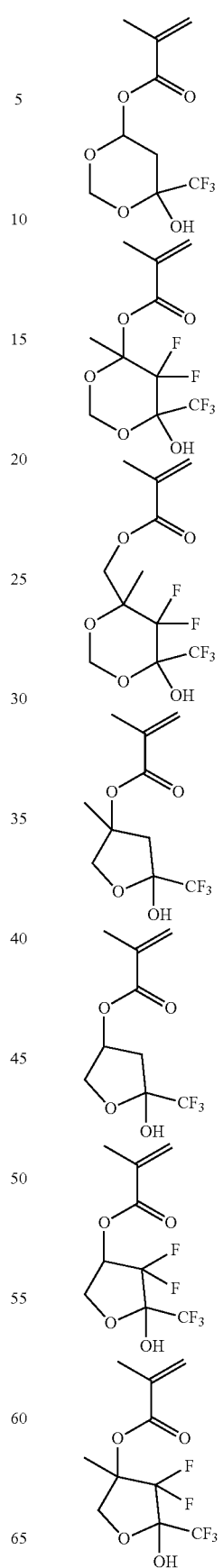

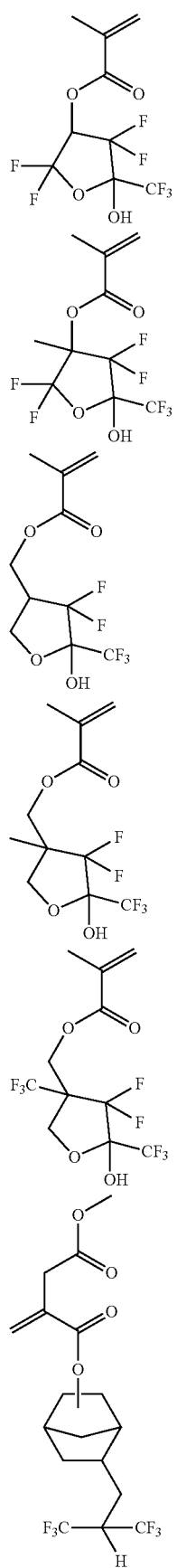
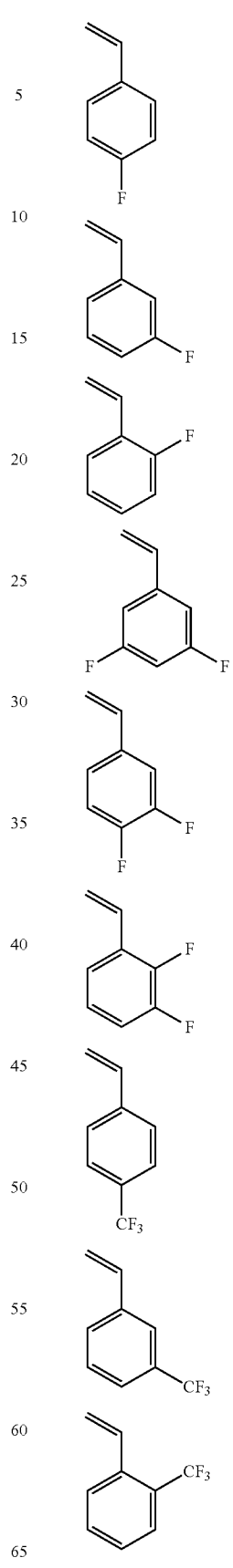

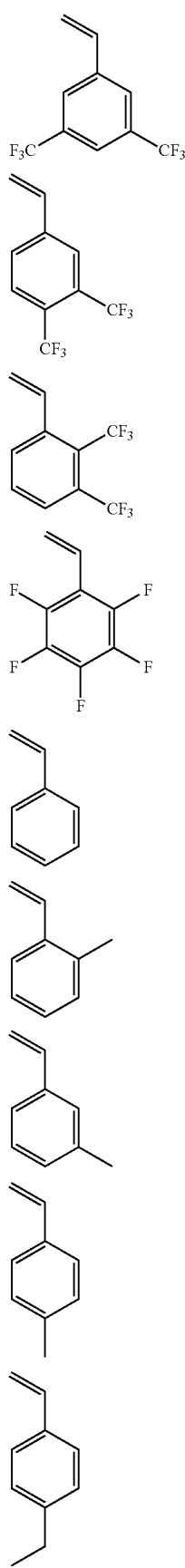
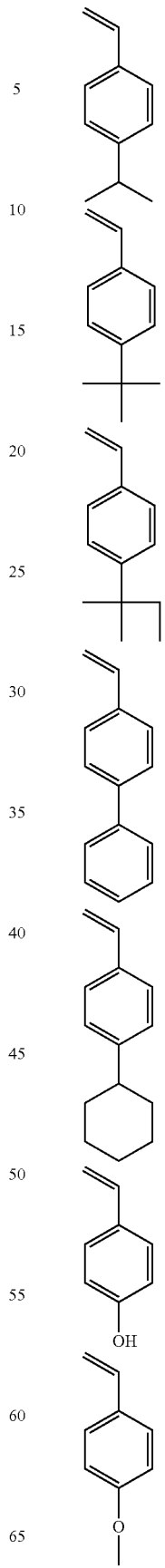

-continued
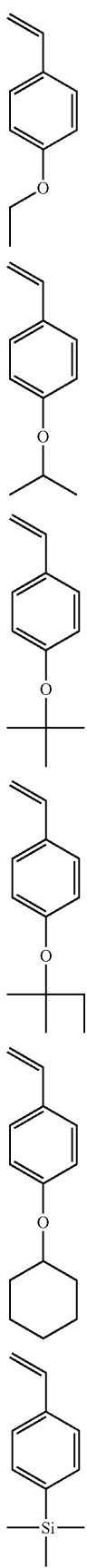
-continued
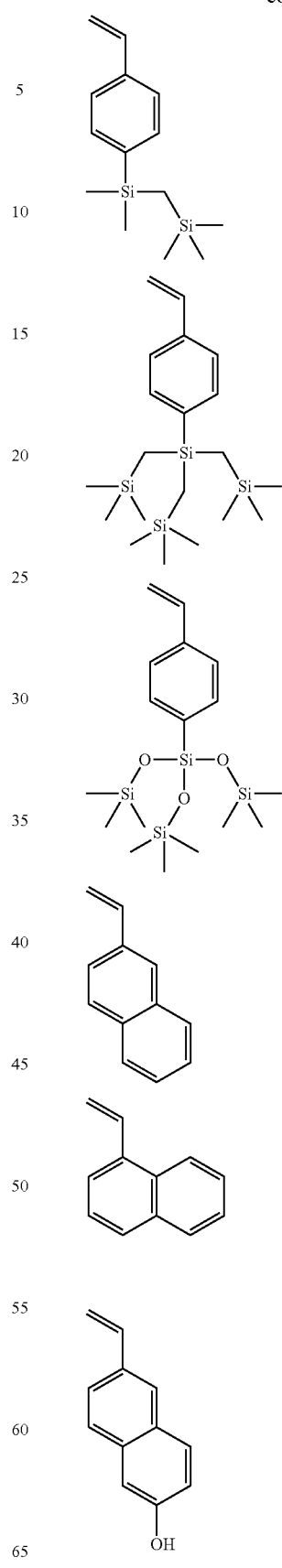

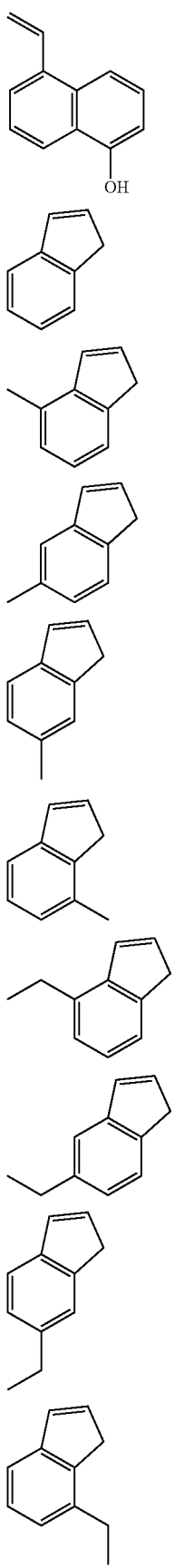
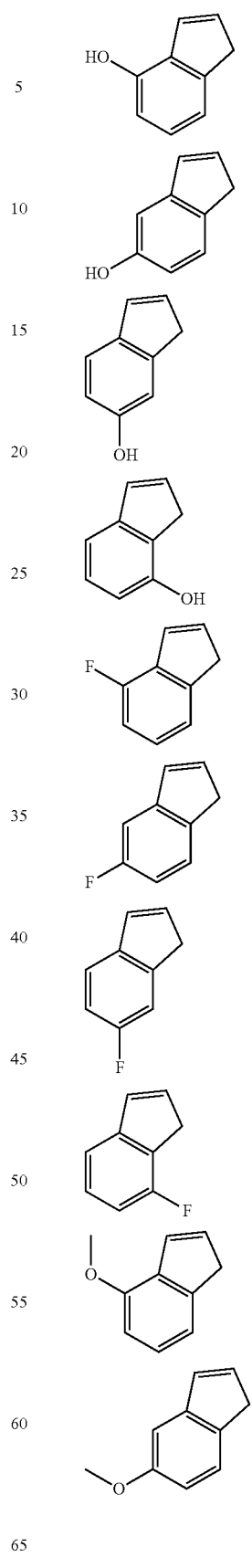

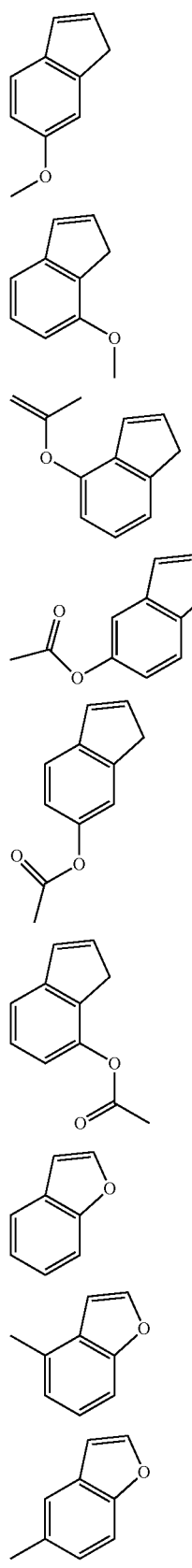
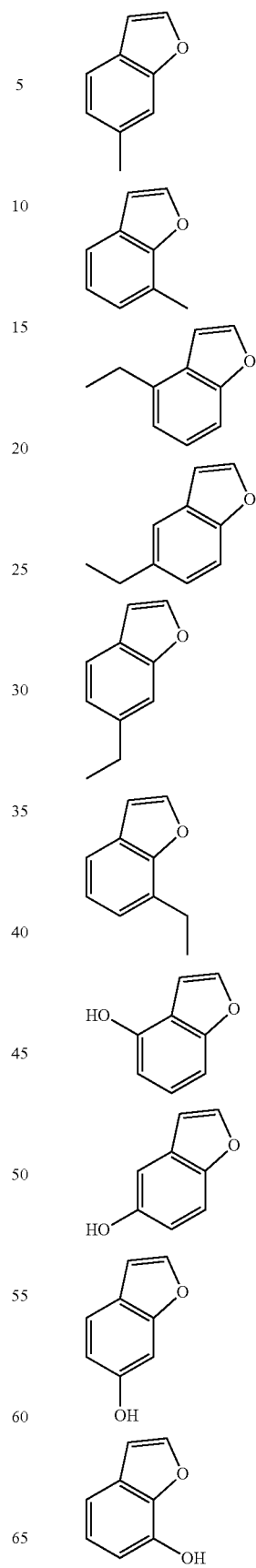

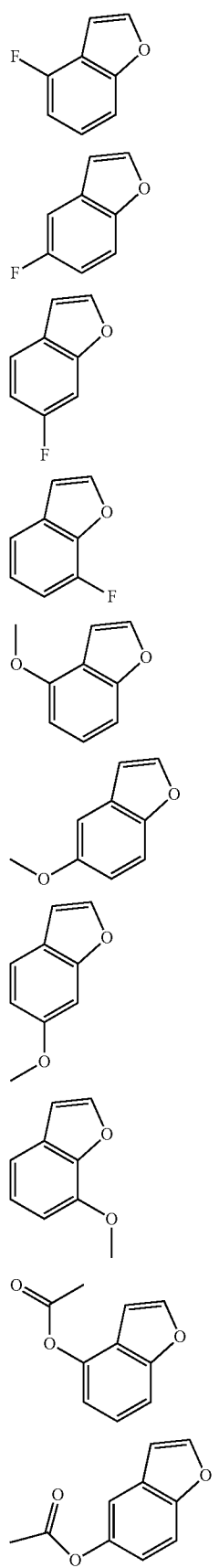
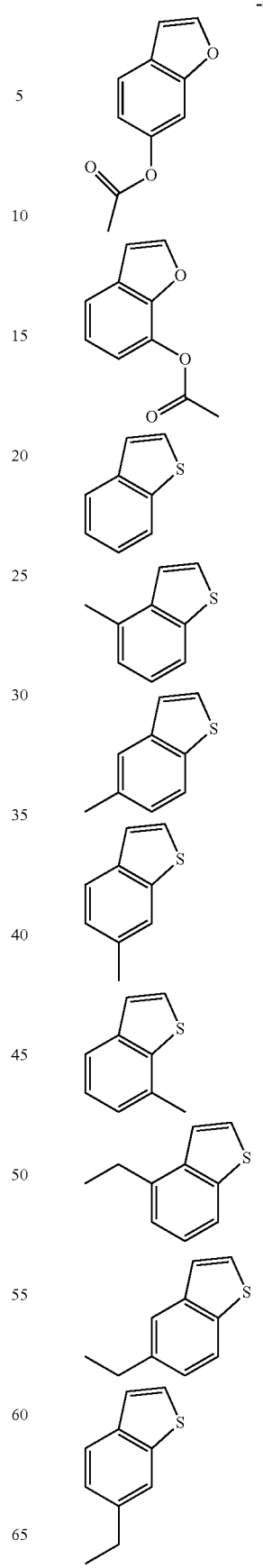

-continued

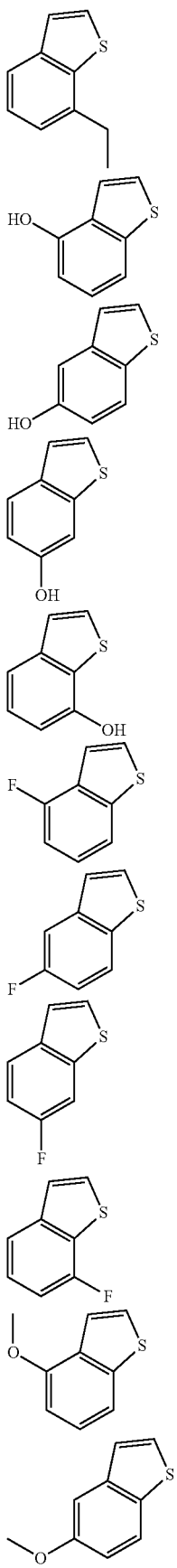

-continued

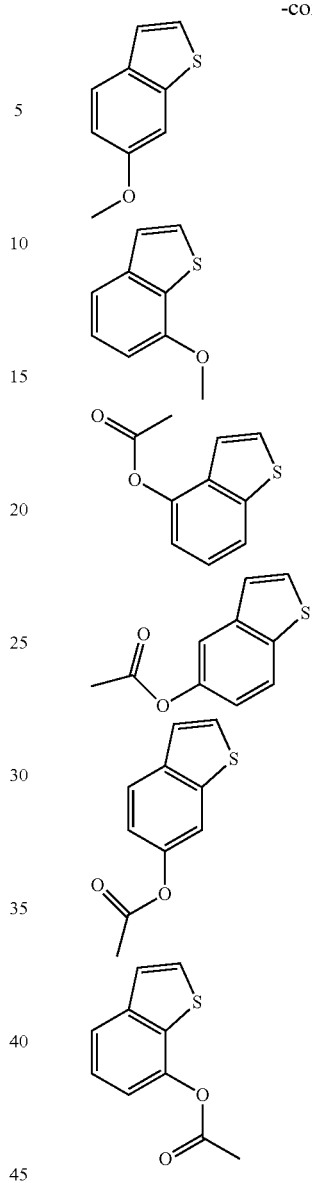

As a method for synthesizing the dopant polymer as the component (B), for example, desired monomers among the monomers providing the repeating units "a" to "d" may be subjected to polymerization under heating in an organic solvent by adding a radical polymerization initiator to obtain a dopant polymer which is a (co)polymer.

The organic solvent to be used at the time of the polymerization may be exemplified by toluene, benzene, tetrahydrofuran, diethyl ether, dioxane, cyclohexane, cyclopentane, methyl ethyl ketone, γ-butyrolactone, etc.

The radical polymerization initiator may be exemplified by 2,2'-azobisisobutyronitrile (AIBN), 2,2'-azobis(2,4-dimethylvaleronitrile), dimethyl 2,2'-azobis(2-methylpropionate), benzoyl peroxide, lauroyl peroxide, etc.

The reaction temperature is preferably 50 to 80° C. The reaction time is preferably 2 to 100 hours, more preferably 5 to 20 hours.

In the dopant polymer as the component (B), the monomer for providing the repeating unit "a" may be either one kind or two or more kinds. It is preferable to use a methacrylic type monomer and a styrene type monomer in combination to heighten polymerizability.

When two or more kinds of the monomers for providing the repeating unit "a" are used, each monomer may be randomly copolymerized, or may be copolymerized in block. When the block copolymerized polymer (block copolymer) is made, the repeating unit portions of two or more kinds of the repeating unit "a" aggregate, whereby a specific structure is generated around the dopant polymer, and as a result, a merit of improving electric conductivity can also be expected.

In addition, the monomers providing the repeating units "a" to "c" may be randomly copolymerized, or may be copolymerized in block. In this case also, a merit of improving conductivity can be expected by forming a block copolymer, as in the case of the repeating unit "a".

When the random copolymerization is carried out by the radical polymerization, it is a general method that monomers to be copolymerized and a radical polymerization initiator are mixed and polymerized under heating. Polymerization is started in the presence of a first monomer and a radical polymerization initiator, and a second monomer is added later. Thereby, one side of the polymer molecule has a structure in which the first monomer is polymerized, and the other side has a structure in which the second monomer is polymerized. In this case, however, the repeating units of the first and second monomers are mixedly present in the intermediate portion, and the form is different from that of the block copolymer. For forming the block copolymer by the radical polymerization, living radical polymerization is preferably used.

In the living radical polymerization method called as the RAFT polymerization (Reversible Addition Fragmentation chain Transfer polymerization), the radical at the polymer end is always living, so that it is possible to form a di-block copolymer with a block of the repeating unit of the first monomer and a block of the repeating unit of the second monomer by: starting the polymerization with the first monomer, and adding the second monomer when the first monomer is consumed. Further, a tri-block copolymer can also be formed by: starting the polymerization with the first monomer, adding the second monomer when the first monomer is consumed, and then adding a third monomer.

When the RAFT polymerization is carried out, there is a characteristic that a narrow dispersion polymer whose molecular weight distribution (dispersity) is narrow is formed. In particular, when the RAFT polymerization is carried out by adding the monomers at a time, a polymer having a narrower molecular weight distribution can be formed.

Note that the dopant polymer as the component (B) has a molecular weight distribution (Mw/Mn) of preferably 1.0 to 2.0, particularly preferably a narrow dispersity of 1.0 to 1.5. With a narrow dispersity, it is possible to prevent a decrease in the transmittance of a conductive film formed from the conductive polymer composition using such dopant polymer.

For carrying out the RAFT polymerization, a chain transfer agent is necessary. Specific examples thereof include 2-cyano-2-propylbenzothioate, 4-cyano-4-phenylcarbonothloylthiopentanoic acid, 2-cyano-2-propyl dodecyl trithiocarbonate, 4-cyano-4-[(dodecylsulfanylthiocarbonyl)sulfanyl] pentanoic acid, 2-(dodecylthiocarbonothioylthio)-2-methylpropanoic acid, cyanomethyl dodecyl thiocarbonate, cyanomethyl methyl(phenyl)carbamothioate, bis(thiobenzoyl)disulfide, and bis(dodecylsulfanylthiocarbonyl)disulfide. Among these, 2-cyano-2-propylbenzothioate is particularly preferable.

The dopant polymer as the component (B) has a weight-average molecular weight in a range of preferably 1,000 to 500,000, more preferably 2,000 to 200,000. When the weight-average molecular weight is 1,000 or more, the heat resistance is excellent, and the uniformity of the composite solution with the component (A) does not deteriorate. Meanwhile, when the weight-average molecular weight is 500,000 or less, the viscosity is not increased too much, the workability is favorable, and the dispersibility into water and an organic solvent is favorable.

Incidentally, the weight-average molecular weight (Mw) is a measured value in terms of polyethylene oxide, polyethylene glycol, or polystyrene, by gel permeation chromatography (GPC) using water, dimethylformamide (DMF), or tetrahydrofuran (THF) as a solvent.

Note that, as the monomer constituting the dopant polymer as the component (B), a monomer having a sulfo group may be used. Alternatively, the polymerization reaction may be carried out using a monomer which is a lithium salt, a sodium salt, a potassium salt, an ammonium salt, or a sulfonium salt of a sulfo group; after the polymerization, the resultant is changed to a sulfo group by using an ion exchange resin.

[Composite of Components (A) and (B)]

The inventive conductive polymer composition contains the composite containing: the π-conjugated polymer as the component (A); and the dopant polymer as the component (B). The dopant polymer of the component (B) is coordinated to the π-conjugated polymer of the component (A) to form the composite.

Preferably, the composite used in the present invention is capable of dispersing in $H_2O$ and has affinity to an organic solvent. The composite can improve the continuous-film formability and the film flatness on a highly hydrophobic inorganic or organic substrate when a spray coater and an inkjet printer are used.

(Composite Production Method)

The composite of the components (A) and (B) can be obtained, for example, by adding a raw-material monomer of the component (A) (preferably, pyrrole, thiophene, aniline, or a derivative monomer thereof) into an aqueous solution of the component (B) or a mixture solution of water and an organic solvent with the component (B), and adding an oxidizing agent and, if necessary, an oxidizing catalyst thereto, to carry out oxidative polymerization.

The oxidizing agent and the oxidizing catalyst which can be used may be: a peroxodisulfate (persulfate), such as ammonium peroxodisulfate (ammonium persulfate), sodium peroxodisulfate (sodium persulfate), and potassium peroxodisulfate (potassium persulfate); a transition metal compound, such as ferric chloride, ferric sulfate, and cupric chloride; a metal oxide, such as silver oxide and cesium oxide; a peroxide, such as hydrogen peroxide and ozone; an organic peroxide, such as benzoyl peroxide; oxygen, etc.

As the reaction solvent to be used for carrying out the oxidative polymerization, water or a mixed solvent of water and an organic solvent may be used. The organic solvent herein used is preferably an organic solvent which is miscible with water, and can dissolve or disperse the components (A) and (B). Examples of the solvent include polar solvents, such as N-methyl-2-pyrrolidone, N,N'-dimethylformamide, N,N'-dimethylacetamide, dimethylsulfoxide, and hexamethylene phosphotriamide; alcohols, such as methanol, ethanol, propanol, and butanol; polyhydric aliphatic alcohols, such as ethylene glycol, propylene glycol, dipropylene glycol, 1,3-butylene glycol, 1,4-butylene glycol, D-glucose, D-glucitol, isoprene glycol, butanediol, 1,5- pentanediol, 1,6-hexanediol, 1,9-nonanediol, and neopentyl glycol; carbonate compounds, such as ethylene carbonate and propylene carbonate; cyclic ether compounds, such as dioxane and tetrahydrofuran; linear ethers, such as dialkyl ether, ethylene glycol monoalkyl ether, ethylene glycol dialkyl ether, propylene glycol monoalkyl ether, propylene glycol dialkyl ether, polyethylene glycol dialkyl ether, and polypropylene glycol dialkyl ether; heterocyclic compounds, such as 3-methyl-2-oxazolidinone; nitrile compounds, such as acetonitrile, glutaronitrile, methoxyacetonitrile, propionitrile, and benzonitrile; etc. One of these organic solvents may be used singly, or two or more kinds thereof may be used in mixture. A formulation ratio of these organic solvents miscible with water is preferably 50 mass % or less based on the whole reaction solvent.

In addition, an anion which is capable of doping the component (A) of the π-conjugated polymer may be used in combination other than the component (B) of the dopant polymer. Such an anion is preferably an organic acid from the viewpoints of, for example, adjusting de-doping characteristics from the π-conjugated polymer, dispersibility of the conductive polymer composite, heat resistance, and environmental resistance characteristics. Examples of the organic acid include an organic carboxylic acid, phenols, an organic sulfonic acid, etc.

As the organic carboxylic acid, a material in which one or two or more carboxyl groups are contained in an aliphatic, an aromatic, a cycloaliphatic, or the like may be used. Examples thereof include formic acid, acetic acid, oxalic acid, benzoic acid, phthalic acid, maleic acid, fumaric acid, malonic acid, tartaric acid, citric acid, lactic acid, succinic acid, monochloroacetic acid, dichloroacetic acid, trichloroacetic acid, trifluoroacetic acid, nitroacetic acid, triphenylacetic acid, etc.

Examples of the phenols include phenols, such as cresol, phenol, and xylenol.

As the organic sulfonic acid, a material in which one or two or more sulfonic acid groups are contained in an aliphatic, an aromatic, a cycloaliphatic, or the like may be used. Examples of the organic sulfonic acid containing one sulfonic acid group can include sulfonic acid compounds containing a sulfonic acid group, such as methanesulfonic acid, ethanesulfonic acid, 1-propanesulfonic acid, 1-butanesulfonic acid, 1-hexanesulfonic acid, 1-heptanesulfonic acid, 1-octanesulfonic acid, 1-nonanesulfonic acid, 1-decanesulfonic acid, 1-dodecanesulfonic acid, 1-tetradecanesulfonic acid, 1-pentadecanesulfonic acid, 2-bromoethanesulfonic acid, 3-chloro-2-hydroxypropanesulfonic acid, trifluoromethanesulfonic acid, colistinmethanesulfonic acid, 2-acrylamido-2-methylpropanesulfonic acid, aminomethanesulfonic acid, 1-amino-2-naphthol-4-sulfonic acid, 2-amino-5-naphthol-7-sulfonic acid, 3-aminopropanesulfonic acid, N-cyclohexyl-3-aminopropanesulfonic acid, benzenesulfonic acid, p-toluenesulfonic acid, xylenesulfonic acid, ethylbenzenesulfonic acid, propylbenzenesulfonic acid, butylbenzenesulfonic acid, pentylbenzenesulfonic acid, hexylbenzenesulfonic acid, heptylbenzenesulfonic acid, octylbenzenesulfonic acid, nonylbenzenesulfonic acid, decylbenzenesulfonic acid, undecylbenzenesulfonic acid, dodecylbenzenesulfonic acid, pentadecylbenzenesulfonic acid, hexadecylbenzenesulfonic acid, 2,4-dimethylbenzenesulfonic acid, dipropylbenzenesulfonic acid, butylbenzenesulfonic acid, 4-aminobenzenesulfonic acid, o-aminobenzenesulfonic acid, m-aminobenzenesulfonic acid, 4-amino-2-chlorotoluene-5-sulfonic acid, 4-amino-3-methylbenzene-1-sulfonic acid, 4-amino-5-methoxy-2-methylbenzenesulfonic acid, 2-amino-5-methylbenzene-1-sulfonic acid, 4-amino-2-methylbenzene-1-sulfonic acid, 5-amino-2-methylbenzene-1-sulfonic acid, 4-amino-3-methylbenzene-1-sulfonic acid, 4-acetamido-3-chlorobenzenesulfonic acid, 4-chloro-3-nitrobenzenesulfonic acid, p-chlorobenzenesulfonic acid, naphthalenesulfonic acid, methylnaphthalenesulfonic acid, propylnaphthalenesulfonic acid, butylnaphthalenesulfonic acid, pentylnaphthalenesulfonic acid, dimethylnaphthalenesulfonic acid, 4-amino-1-naphthalenesulfonic acid, 8-chloronaphthalene-1-sulfonic acid, naphthalenesulfonic acid formalin polycondensate, and melaminesulfonic acid formalin polycondensate.

Examples of the organic sulfonic acid containing two or more sulfonic acid groups can include ethanedisulfonic acid, butanedisulfonic acid, pentanedisulfonic acid, decanedisulfonic acid, m-benzenedisulfonic acid, o-benzenedisulfonic acid, p-benzenedisulfonic acid, toluenedisulfonic acid, xylenedisulfonic acid, chlorobenzenedisulfonic acid, fluorobenzenedisulfonic acid, aniline-2,4-disulfonic acid, aniline-2,5-disulfonic acid, dimethylbenzenedisulfonic acid, diethylbenzenedisulfonic acid, dibutylbenzenedisulfonic acid, naphthalenedisulfonic acid, methylnaphthalenedisulfonic acid, ethylnaphthalenedisulfonic acid, dodecylnaphthalenedisulfonic acid, pentadecylnaphthalenedisulfonic acid, butylnaphthalenedisulfonic acid, 2-amino-1,4-benzenedisulfonic acid, 1-amino-3,8-naphthalenedisulfonic acid, 3-amino-1,5-naphthalenedisulfonic acid, 8-amino-1-naphthol-3,6-disulfonic acid, 4-amino-5-naphthol-2,7-disulfonic acid, anthracenedisulfonic acid, butyl anthracenedisulfonic acid, 4-acetamido-4'-isothio-cyanatostilbene-2,2'-disulfonic acid, 4-acetamido-4'-isothiocyanatostilbene-2,2'-disulfonic acid, 4-acetamido-4'-maleimidylstilbene-2,2'-disulfonic acid, 1-acetoxypyrene-3,6,8-trisulfonic acid, 7-amino-1,3,6-naphthalenetrisulfonic acid, 8-aminonaphthalene-1,3,6-trisulfonic acid, 3-amino-1,5,7-naphthalenetrisulfonic acid, etc.

These anions other than the component (B) may be added to the solution containing the raw-material monomer of the component (A), the component (B), an oxidizing agent and/or an oxidative polymerization catalyst before polymerization of the component (A), or may be added to the composite containing the components (A) and (B) after the polymerization.

The thus obtained composite of the components (A) and (B) can be used, if necessary, after subjected to fine pulverization with a homogenizer, a ball mill, or the like.

For fine pulverization, a mixing-dispersing machine which can provide high shearing force is preferably used. Examples of the mixing-dispersing machine include a homogenizer, a high-pressure homogenizer, a bead mill, etc. Among these, a high-pressure homogenizer is preferable.

Specific examples of the high-pressure homogenizer include Nanovater manufactured by Yoshida Kikai Co., Ltd., Microfluidizer manufactured by Powrex Corp., Artimizer manufactured by Sugino Machine Limited, etc.

Examples of a dispersing treatment using the high-pressure homogenizer include a treatment in which the composite solution before subjecting to the dispersing treatment is subjected to counter-collision with high pressure; a treatment in which it is passed through an orifice or slit with high pressure; and other similar methods.

Before or after fine pulverization, impurities may be removed by a method, such as filtration, ultrafiltration, and dialysis, followed by purification with a cation-exchange resin, an anion-exchange resin, a chelate resin, or the like.

Note that a total content of the components (A) and (B) is preferably 0.05 to 5.0 mass % in the conductive polymer composition. When the total content of the components (A)

and (B) is. 0.05 mass % or more, sufficient conductivity or hole injection function is obtained. When the total content is 5.0 mass % or less, uniform conductive coating film is easily obtained.

Examples of the organic solvent, which can be added to the aqueous solution for the polymerization reaction or can dilute the monomer, include methanol, ethyl acetate, cyclohexanone, methyl amyl ketone, butanediol monomethyl ether, propylene glycol monomethyl ether, ethylene glycol monomethyl ether, butanediol monoethyl ether, propylene glycol monoethyl ether, ethylene glycol monoethyl ether, propylene glycol dimethyl ether, diethylene glycol dimethyl ether, propylene glycol monomethyl ether acetate, propylene glycol monoethyl ether acetate, ethyl pyruvate, butyl acetate, methyl 3-methoxypropionate, ethyl 3-ethoxypropionate, tert-butyl acetate, t-butyl propionate, propylene glycol mono-t-butyl ether acetate, γ-butyrolactone, mixtures thereof, etc.

Note that the amount of the organic solvent to be used is preferably 0 to 1,000 mL based on 1 mol of the monomer, particularly preferably 0 to 500 mL. When the amount of the organic solvent used is 1,000 mL or less, the reaction vessel does not become too large so that it is economical.

In the inventive composition, the composite of the components (A) and (B) is dispersed in $H_2O$ as a component (D). The inventive composition further contains a water-soluble organic solvent (C) and a compound (E) shown by a general formula (2) to be described later.

[(C) Component: Water-Soluble Organic Solvent]

In the present invention, a water-soluble organic solvent is added for improving the printability to a material to be processed, such as a substrate. Examples of such an organic solvent include organic solvents that are soluble in $H_2O$ and have a boiling point of 250° C. or less at normal pressure.

Examples thereof include alcohols, such as methanol, ethanol, propanol, and butanol; polyhydric aliphatic alcohols, such as ethylene glycol, propylene glycol, 1,3-propanediol, diethylene glycol, dipropylene glycol, 1,3-butylene glycol, 1,4-butylene glycol, isoprene glycol, 1,2-butanediol, 1,3-butanediol, 1,4-butanediol, 2,3-butanediol, 1,2-pentanediol, 1,5-pentanediol, 1,2-hexanediol, 1,6-hexanediol, and neopentyl glycol; linear ethers, such as dialkyl ether, dimethoxyethane, ethylene glycol monoalkyl ether, ethylene glycol dialkyl ether, propylene glycol monoalkyl ether, propylene glycol dialkyl ether, butanediol monoalkyl ether, polyethylene glycol dialkyl ether, and polypropylene glycol dialkyl ether; cyclic ether compounds, such as dioxane and tetrahydrofuran; polar solvents, such as cyclohexanone, methyl amyl ketone, ethyl acetate, diethylene glycol dimethyl ether, propylene glycol monomethyl ether acetate, propylene glycol monoethyl ether acetate, ethyl pyruvate, butyl acetate, methyl 3-methoxypropionate, ethyl 3-ethoxypropionate, tert-butyl acetate, t-butyl propionate, propylene glycol mono-t-butyl ether acetate, γ-butyrolactone, N-methyl-2-pyrrolidone, N,N'-dimethylformamide, N,N'-dimethylacetamide, dimethylsulfoxide, and hexamethylene phosphotriamide; carbonate compounds, such as ethylene carbonate and propylene carbonate; heterocyclic compounds, such as 3-methyl-2-oxazolidinone; nitrile compounds, such as acetonitrile, glutaronitrile, methoxyacetonitrile, propionitrile, and benzonitrile; mixtures thereof; etc.

The organic solvent (C) to be mixed with a $H_2O$ dispersion of the composite of (A) and (B) is essentially a water-soluble organic solvent. The organic solvent (C) may include an organic solvent (C1) having a boiling point of 120° C. or more, and an organic solvent (C2) having a boiling point of less than 120° C. It is possible to use, for example, either (C1) or (C2) singly, or a mixture of (C1) and (C2). The content(s) preferably satisfy 1.0 wt %≤(C1)+(C2) ≤50.0 wt %, more preferably 5.0 wt. %≤(C1)+(C2)≤30.0 wt %, relative to a total of the components (A), (B), and (D).

Further, the components (C1) and (C2) are preferably selected from alcohols, ethers, esters, ketones, and nitriles each of which has 1 to 7 carbon atoms.

Additionally, the use of an organic solvent having a boiling point higher than that of $H_2O$ in the water-soluble organic solvent makes it possible to avoid solid content precipitation around a nozzle and solid content precipitation due to drying between ejection of the liquid material from a nozzle tip and landing on a substrate.

[(D) Component: $H_2O$]

As the component (D), for example, ultrapure water can be used.

[(E) Component]

The component (E) is a compound shown by the following general formula (2).

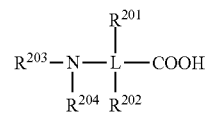

(2)

In the formula, $R^{201}$ and $R^{202}$ each independently represent any of a hydrogen atom, a heteroatom, and a linear, branched, or cyclic monovalent hydrocarbon group having 1 to 20 carbon atoms optionally having a heteroatom. $R^{203}$ and $R^{204}$ each independently represent any of a hydrogen atom and a linear, branched, or cyclic monovalent hydrocarbon group having 1 to 20 carbon atoms optionally having a heteroatom. $R^{201}$ and $R^{203}$, or $R^{201}$ and $R^{204}$, are optionally bonded to each other to form a ring. L represents a linear, branched or cyclic tetravalent organic group having 1 to 20 carbon atoms optionally having a heteroatom. When L has a heteroatom, the heteroatom is optionally an ion.

Incorporating the component (E) enables the conductive polymer composition to have moderate (relieved) acidity. When the conductive polymer composition is used to form a film as a hole injection layer of a thin film-stacked device, such as organic EL and solar cell, it is possible to suppress corrosion of a metallic part of a material which comes into contact with the composition liquid during film formation, and to reduce the acid influence on the device performance by suppressing the acid diffusion into an adjacent layer of the laminate structure of the device and into other constituent layers.

In the present invention, only one kind of the compound (E) shown by the general formula (2) may be used, or two or more kinds thereof may be used in mixture. Moreover, any known compound can also be used.

The structure of the compound shown by the general formula (2) can be specifically exemplified by the following.

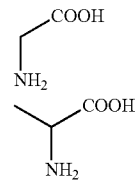

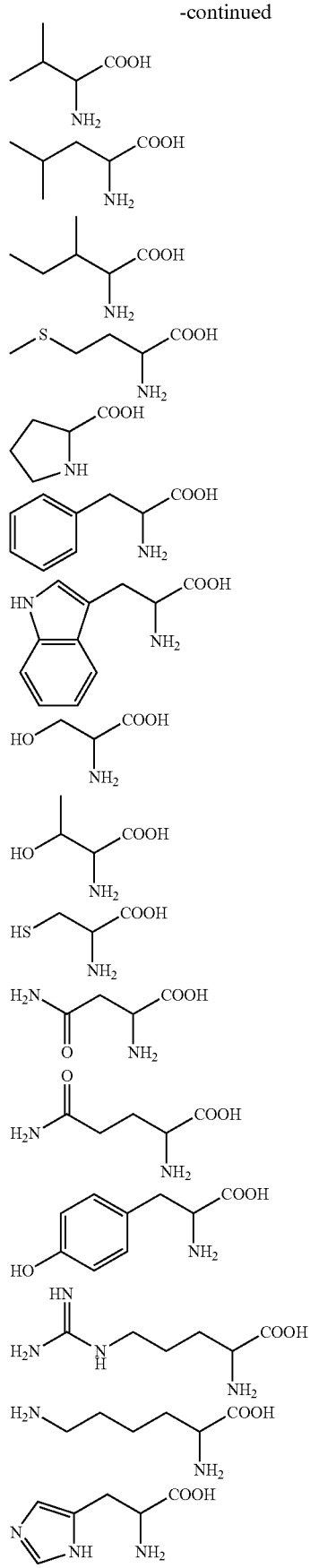
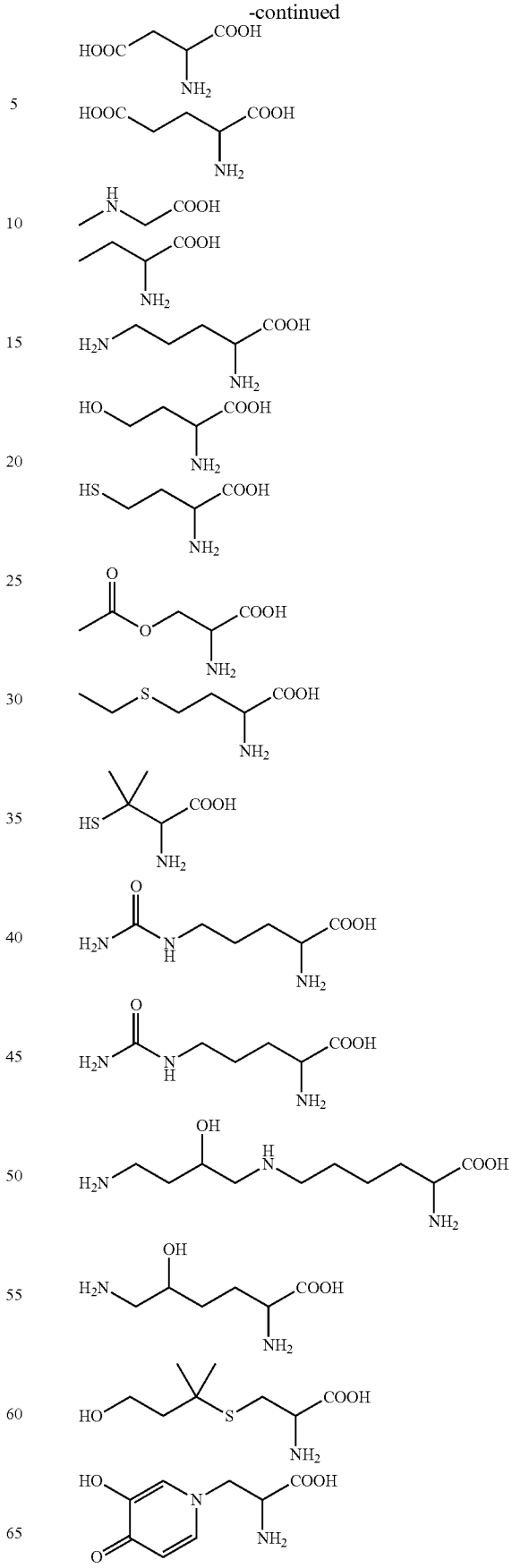

-continued
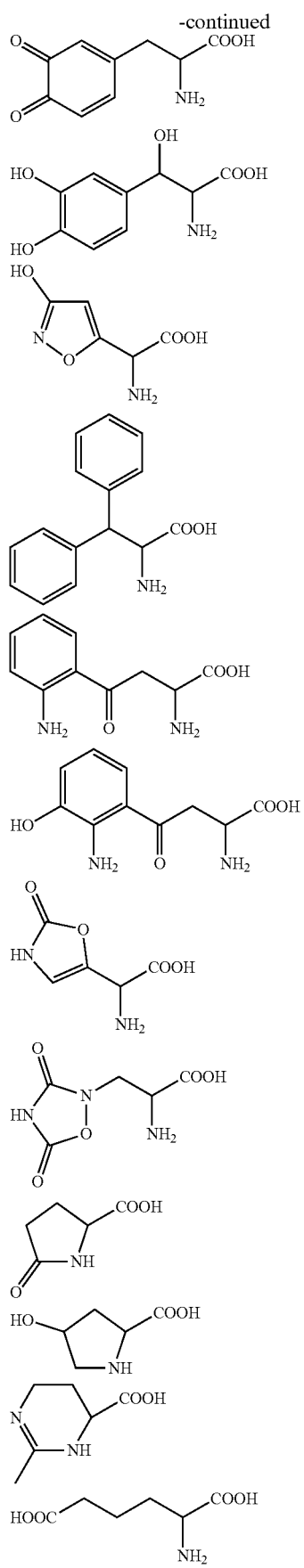
-continued
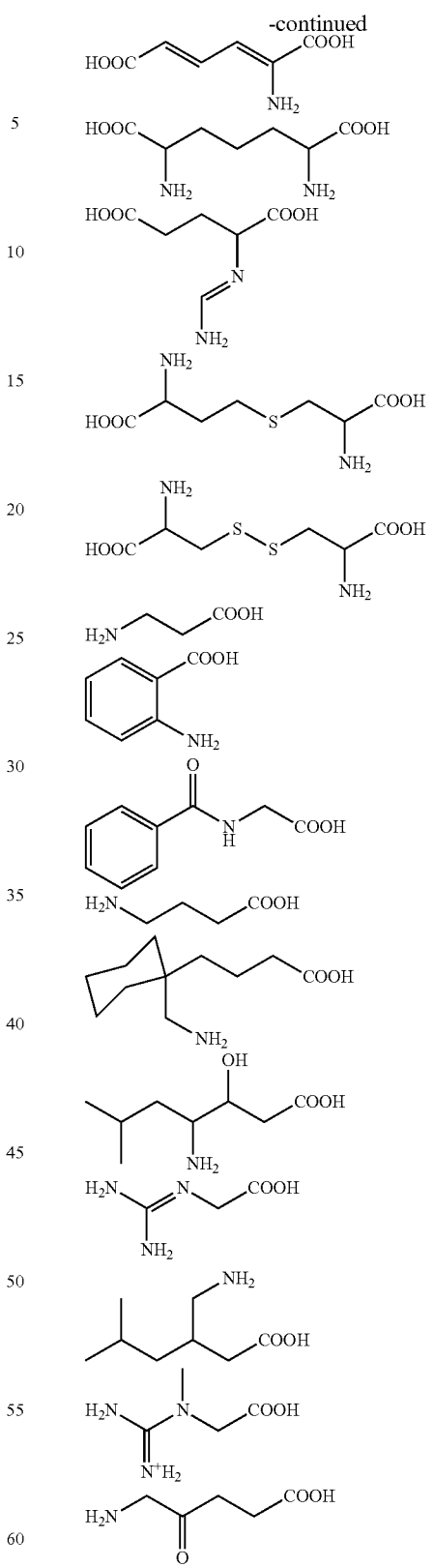
Preferably, the inventive conductive polymer composition contains the compound shown by the general formula (2), in which L represents a linear, branched or cyclic tetravalent organic group having 2 to 10 carbon atoms optionally having a heteroatom.

Other than the structures shown by the general formula (2), compounds shown in the following formula (7) can be suitably used in the present invention.

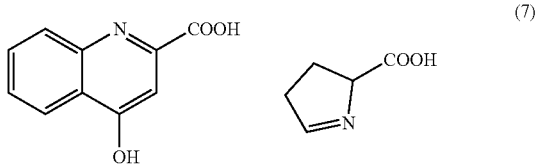

In the inventive conductive polymer composition, the content of the compound shown by the general formula (2) and the compound(s) shown by the formula (7) is preferably 1 part by mass to 50 parts by mass, further more preferably 10 parts by mass to 30 parts by mass, based on 100 parts by mass of the composite of the components (A) and (B). When the compound shown by the general formula (2) and the compound(s) shown by the formula (7) are contained in such amounts, the H+ diffusion from a film formed of the inventive conductive polymer composition to an adjacent layer can be controlled.

[Other Components]

(Surfactant)

In the present invention, a surfactant may be added to further increase wettability to a material to be processed, such as a substrate. Examples of such a surfactant include various surfactants such as nonionic, cationic, and anionic surfactants. Specific examples thereof include nonionic surfactants, such as polyoxyethylene alkyl ether, polyoxyethylene alkylphenyl ether, polyoxyethylene carboxylic acid ester, sorbitan ester, and polyoxyethylene sorbitan ester; cationic surfactants, such as alkyltrimethyl ammonium chloride and alkylbenzyl ammonium chloride; anionic surfactants, such as alkyl or alkylallyl sulfates, alkyl or alkylallyl sulfonate, and dialkyl sulfosuccinate; amphoteric ionic surfactants, such as amino acid type and betaine type; etc.

Preferably, a nonionic surfactant is contained in an amount of 1 part by mass to 50 parts by mass, more preferably 1 part by mass to 15 parts by mass, or 30 parts by mass to 50 parts by mass, based on 100 parts by mass of the composite of the components (A) and (B).

As has been described above, the inventive conductive polymer composition is capable of efficiently removing residual moisture in the film during the film formation, has favorable filterability and high continuous-film formability on inorganic and organic substrates even when a spray coater or inkjet printer is used, and is also capable of forming a conductive film having favorable flatness and high transparency.

[Conductive Polymer Composition]

The inventive conductive polymer composition forms a film having an electric conductivity of less than 1.00E-05 S/cm, when the film formed from the composition has a film thickness 20 to 200 nm, preferably 30 to 200 nm, more preferably 40 to 150 nm. The film formation method in this event is not particularly limited. For example, the film can be formed by spin coating.

With such a film electric conductivity, when the film made from the inventive conductive polymer composition as an hole injection layer for an organic thin-film device is formed on an electrode and mounted on the device, the film itself is inhibited from functioning as an electrode, successfully suppressing light emission (crosstalk) outside the intended electrode surface. Meanwhile, if the film electric conductivity is 1.00E-05 S/cm or more, such crosstalk cannot be suppressed.

Moreover, the inventive conductive polymer composition has a surface tension in a range of preferably 20 to 50 mN/m, more preferably 20 to 35 mN/m. With such a surface tension value, when a droplet spray-type printer such as spray printer and inkjet printer is employed, the leveling of the droplets progresses after the blowing onto a substrate. This makes it possible to prevent the composition solution from repelling on the substrate, and from forming a partial film or a sea-island structure as a trace of the droplets on the substrate.

[Substrate]

The present invention provides a substrate having an organic thin-film device (e.g., organic EL device), the organic thin-film device including a hole injection layer formed from the above-described conductive polymer composition.

Examples of the substrate include inorganic substrates, such as glass substrate, quartz substrate, photomask blank substrate, silicon wafer, gallium arsenide wafer, and indium phosphide wafer; organic resin substrates, such as polyimide, polyethylene terephthalate, polycarbonate, cycloolefin polymer, and triacetyl cellulose; etc.

[Substrate Production Method]

Additionally, the inventive substrate can be produced by a substrate production method including applying the conductive polymer composition by employing spin coating, a spray coater, or inkjet printing.

The inventive method for producing the substrate may include a step of applying the conductive polymer composition to, for example, a glass substrate or a glass substrate with ITO having been vapor-deposited thereon, by employing a spray coater or inkjet printing.

As described above, according to the present invention, the compound (E) and the water-soluble organic solvent (C) are mixed with the $H_2O$ (D) dispersion of the composite composed of the π-conjugated polymer (A) and the dopant polymer (B) that contains a highly strongly acidic sulfo group and a non-doping fluorinated unit. This enables low viscosity, favorable filterability, and high formability of continuous film on inorganic and organic substrates even when a spray coater or an inkjet printer is employed. Moreover, it is possible to form a conductive film having suitable transparency, flatness, durability, and conductivity. Further, the component (E) makes it possible to suppress the diffusion of H+ derived from the acid unit in a non-doping state. Such a conductive polymer composition can function as a hole injection layer. Furthermore, the film electric conductivity is less than 1.00E-05 S/cm, so that crosstalk is successfully suppressed when the resulting film is mounted on an organic EL device etc.

EXAMPLE

Hereinafter, the present invention will be specifically described with reference to Examples and Comparative Examples, but the present invention is not limited thereto.

[Synthesis Examples of Dopant Polymers]

Raw-material monomers polymerized for copolymerization of dopant polymers represented by (B) in composites used in Examples are shown below.

Monomer a″1
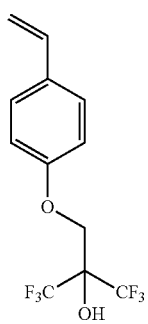
Monomer a″2
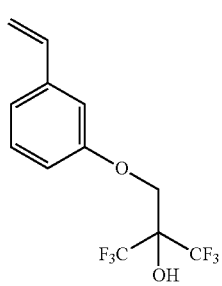
Monomer a″3
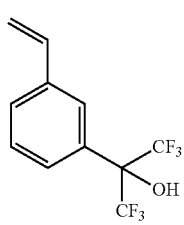
Monomer a″4
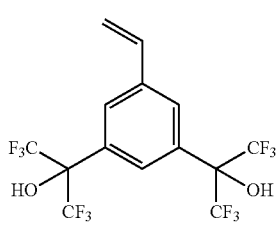
Monomer a″5
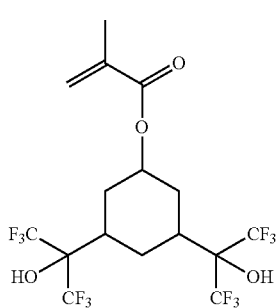
Monomer b″1
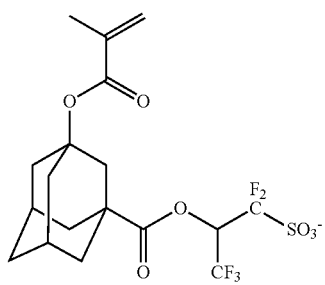
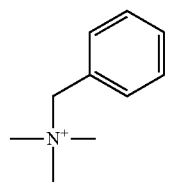
Monomer b″2
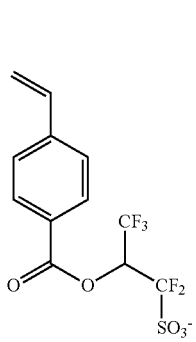
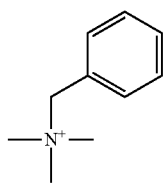
Monomer b″3
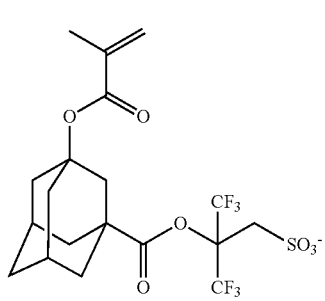

Monomer b″4

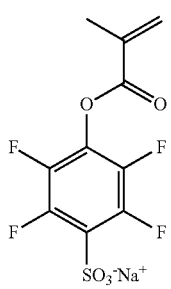

Synthesis Example 1

Under nitrogen atmosphere, a solution was added dropwise over 4 hours to 10 g of methanol stirred at 64° C., the solution containing 1.51 g of Monomer a″1, 3.12 g of Monomer b″1, and 0.12 g of dimethyl 2,2'-azobis(isobutyrate) dissolved in 3 g of methanol. The mixture was further stirred at 64° C. for 4 hours. After cooled to room temperature, the mixture was added dropwise to 10 g of ethyl acetate under vigorous stirring. The formed solid product was collected by filtration, and dried under vacuum at 50° C. for 15 hours. Thus, a white polymer was obtained.

The obtained white polymer was dissolved in 100 g of pure water, and the ammonium salt was changed to a sulfo group by using an ion exchange resin. When the obtained polymer was measured by $^{19}F$, $^{1}H$-NMR and GPC, the following analytical results were obtained.

Weight-average molecular weight (Mw)=20,500
Molecular weight distribution (Mw/Mn)=1.82
This polymer compound is (Polymer 1).

Polymer 1

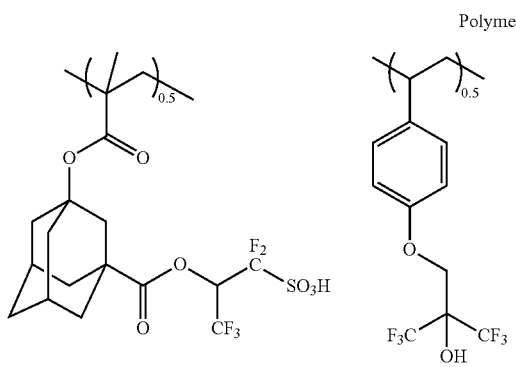

Synthesis Example 2

Under nitrogen atmosphere, a solution was added dropwise over 4 hours to 10 g of methanol stirred at 64° C., the solution containing 1.80 g of Monomer a″1, 2.50 g of Monomer b″1, and 0.12 g of dimethyl 2,2'-azobis(isobutyrate) dissolved in 3 g of methanol. The mixture was further stirred at 64° C. for 4 hours. After cooled to room temperature, the mixture was added dropwise to 10 g of ethyl acetate under vigorous stirring. The formed solid product was collected by filtration, and dried under vacuum at 50° C. for 15 hours. Thus, a white polymer was obtained.

The obtained white polymer was dissolved in 100 g of pure water, and the ammonium salt was changed to a sulfo group by using an ion exchange resin. When the obtained polymer was measured by $^{19}F$, $^{1}H$-NMR and GPC, the following analytical results were obtained.

Weight-average molecular weight (Mw)=19,500
Molecular weight distribution (Mw/Mn)=1.90
This polymer compound is (Polymer 2).

Polymer 2

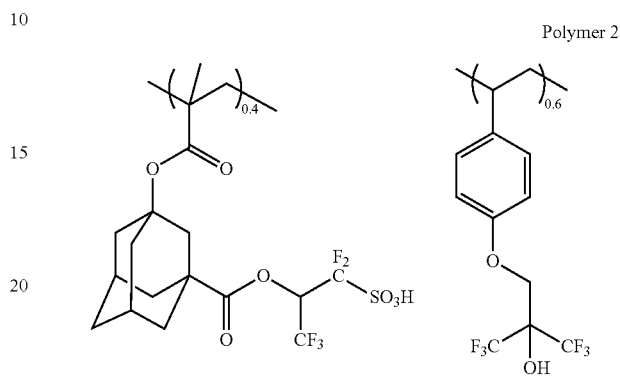

Synthesis Example 3

Under nitrogen atmosphere, a solution was added dropwise over 4 hours to 10 g of methanol stirred at 64° C., the solution containing 1.51 g of Monomer a″2, 3.12 g of Monomer b″1, and 0.12 g of dimethyl 2,2'-azobis(isobutyrate) dissolved in 3 g of methanol. The mixture was further stirred at 64° C. for 4 hours. After cooled to room temperature, the mixture was added dropwise to 10 g of ethyl acetate under vigorous stirring. The formed solid product was collected by filtration, and dried under vacuum at 50° C. for 15 hours. Thus, a white polymer was obtained.

The obtained white polymer was dissolved in 100 g of pure water, and the ammonium salt was changed to a sulfo group by using an ion exchange resin. When the obtained polymer was measured by $^{19}F$, $^{1}H$-NMR and GPC, the following analytical results were obtained.

Weight-average molecular weight (Mw)=21,000
Molecular weight distribution (Mw/Mn)=1.91
This polymer compound is (Polymer 3).

Polymer 3

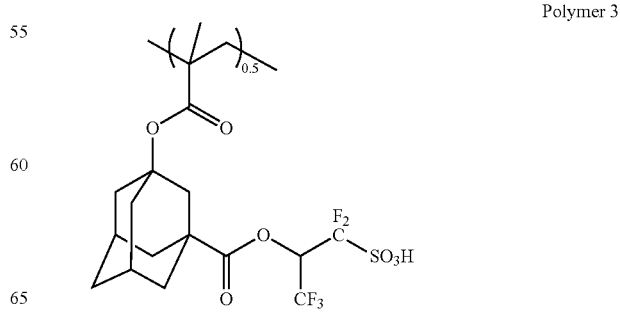

-continued

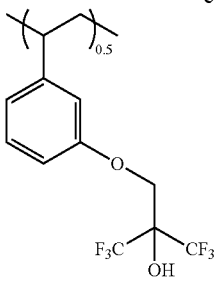

Synthesis Example 4

Under nitrogen atmosphere, a solution was added dropwise over 4 hours to 10 g of methanol stirred at 64° C., the solution containing 1.51 g of Monomer a"1, 2.55 g of Monomer b"2, and 0.12 g of dimethyl 2,2'-azobis(isobutyrate) dissolved in 3 g of methanol. The mixture was further stirred at 64° C. for 4 hours. After cooled to room temperature, the mixture was added dropwise to 10 g of ethyl acetate under vigorous stirring. The formed solid product was collected by filtration, and dried under vacuum at 50° C. for 15 hours. Thus, a white polymer was obtained.

The obtained white polymer was dissolved in 100 g of pure water, and the ammonium salt was changed to a sulfo group by using an ion exchange resin. When the obtained polymer was measured by $^{19}F$, $^{1}H$-NMR and GPC, the following analytical results were obtained.
Weight-average molecular weight (Mw)=18,500
Molecular weight distribution (Mw/Mn)=1.88
This polymer compound is (Polymer 4).

Polymer 4

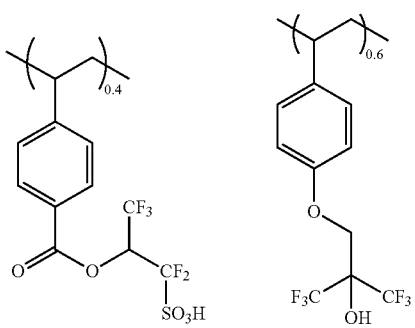

Synthesis Example 5

Under nitrogen atmosphere, a solution was added dropwise over 4 hours to 10 g of methanol stirred at 64° C., the solution containing 1.80 g of Monomer a"1, 2.04 g of Monomer b"3, and 0.12 g of dimethyl 2,2'-azobis(isobutyrate) dissolved in 3 g of methanol. The mixture was further stirred at 64° C. for 4 hours. After cooled to room temperature, the mixture was added dropwise to 10 g of ethyl acetate under vigorous stirring. The formed solid product was collected by filtration, and dried under vacuum at 50° C. for 15 hours. Thus, a white polymer was obtained.

The obtained white polymer was dissolved in 100 g of pure water, and the ammonium salt was changed to a sulfo group by using an ion exchange resin. When the obtained polymer was measured by $^{19}F$, $^{1}H$-NMR and GPC, the following analytical results were obtained.
Weight-average molecular weight (Mw)=20,000
Molecular weight distribution (Mw/Mn)=1.95
This polymer compound is (Polymer 5).

Polymer 5

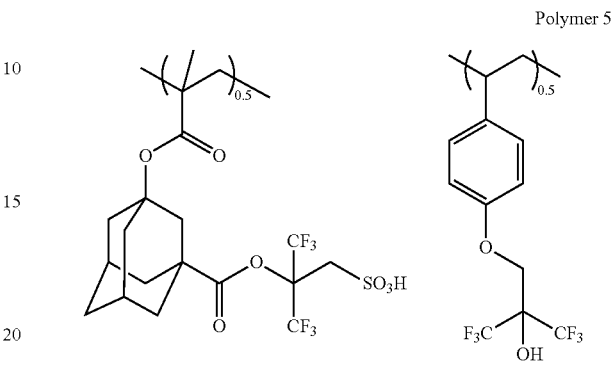

Synthesis Example 6

Under nitrogen atmosphere, a solution was added dropwise over 4 hours to 10 g of methanol stirred at 64° C., the solution containing 1.35 g of Monomer a"3, 3.13 g of Monomer b"1, and 0.12 g of dimethyl 2,2'-azobis(isobutyrate) dissolved in 3 g of methanol. The mixture was further stirred at 64° C. for 4 hours. After cooled to room temperature, the mixture was added dropwise to 10 g of ethyl acetate under vigorous stirring. The formed solid product was collected by filtration, and dried under vacuum at 50° C. for 15 hours. Thus, a white polymer was obtained.

The obtained white polymer was dissolved in 100 g of pure water, and the ammonium salt was changed to a sulfo group by using an ion exchange resin. When the obtained polymer was measured by $^{19}F$, $^{1}H$-NMR and GPC, the following analytical results were obtained.
Weight-average molecular weight (Mw)=21,500
Molecular weight distribution (Mw/Mn)=2.07
This polymer compound is (Polymer 6).

Polymer 6

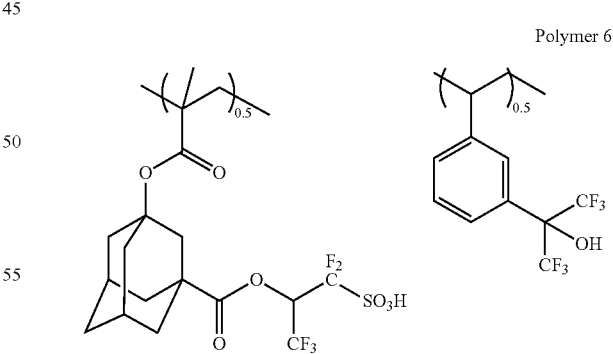

Synthesis Example 7

Under nitrogen atmosphere, a solution was added dropwise over 4 hours to 10 g of methanol stirred at 64° C., the solution containing 1.74 g of Monomer a"4, 3.75 g of Monomer b"1, and 0.12 g of dimethyl 2,2'-azobis(isobutyrate) dissolved in 3 g of methanol. The mixture was further stirred at 64° C. for 4 hours. After cooled to room temperature, the mixture was added dropwise to 10 g of ethyl acetate under vigorous stirring. The formed solid product was collected by filtration, and dried under vacuum at 50° C. for 15 hours. Thus, a white polymer was obtained.

The obtained white polymer was dissolved in 100 g of pure water, and the ammonium salt was changed to a sulfo group by using an ion exchange resin. When the obtained polymer was measured by $^{19}F$, $^{1}H$-NMR and GPC, the following analytical results were obtained.

Weight-average molecular weight (Mw)=22,000

Molecular weight distribution (Mw/Mn)=1.90

This polymer compound is (Polymer 7).

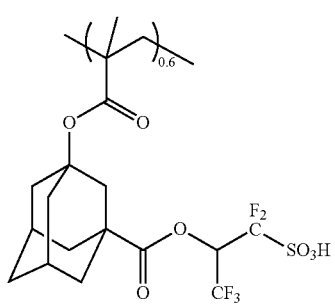

Polymer 7

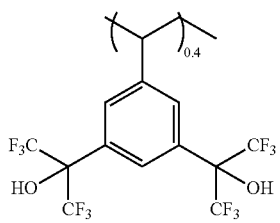

Synthesis Example 8

Under nitrogen atmosphere, a solution was added dropwise over 4 hours to 10 g of methanol stirred at 64° C., the solution containing 2.00 g of Monomer a"5, 3.75 g of Monomer b"1, and 0.12 g of dimethyl 2,2'-azobis(isobutyrate) dissolved in 3 g of methanol. The mixture was further stirred at 64° C. for 4 hours. After cooled to room temperature, the mixture was added dropwise to 10 g of ethyl acetate under vigorous stirring. The formed solid product was collected by filtration, and dried under vacuum at 50° C. for 15 hours. Thus, a white polymer was obtained.

The obtained white polymer was dissolved in 100 g of pure water, and the ammonium salt was changed to a sulfo group by using an ion exchange resin. When the obtained polymer was measured by $^{19}F$, $^{1}H$-NMR and GPC, the following analytical results were obtained.

Weight-average molecular weight (Mw)=21,000

Molecular weight distribution (Mw/Mn)=1.88

This polymer compound is (Polymer 8).

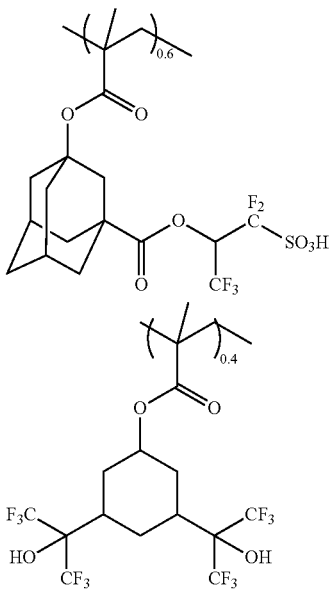

Polymer 8

Synthesis Example 9

Under nitrogen atmosphere, a solution was added dropwise over 4 hours to 10 g of methanol stirred at 64° C., the solution containing 2.50 g of Monomer a"5, 3.13 g of Monomer b"1, and 0.12 g of dimethyl 2,2'-azobis(isobutyrate) dissolved in 3 g of methanol. The mixture was further stirred at 64° C. for 4 hours. After cooled to room temperature, the mixture was added dropwise to 10 g of ethyl acetate under vigorous stirring. The formed solid product was collected by filtration, and dried under vacuum at 50° C. for 15 hours. Thus, a white polymer was obtained.

The obtained white polymer was dissolved in 100 g of pure water, and the ammonium salt was changed to a sulfo group by using an ion exchange resin. When the obtained polymer was measured by $^{19}F$, $^{1}H$-NMR and GPC, the following analytical results were obtained.

Weight-average molecular weight (Mw)=19,000

Molecular weight distribution (Mw/Mn)=1.97

This polymer compound is (Polymer 9).

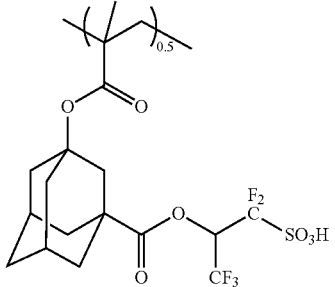

Polymer 9

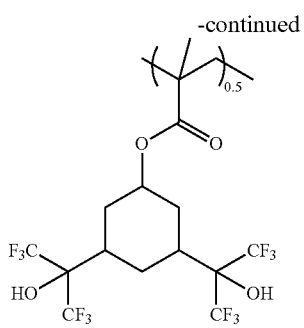

Synthesis Example 10

Under nitrogen atmosphere, a solution was added dropwise over 4 hours to 10 g of methanol stirred at 64° C., the solution containing 1.50 g of Monomer a"1, 1.68 g of Monomer b"4, and 0.12 g of dimethyl 2,2'-azobis(isobutyrate) dissolved in 3 g of methanol. The mixture was further stirred at 64° C. for 4 hours. After cooled to room temperature, the mixture was added dropwise to 10 g of ethyl acetate under vigorous stirring. The formed solid product was collected by filtration, and dried under vacuum at 50° C. for 15 hours. Thus, a white polymer was obtained.

The obtained white polymer was dissolved in 100 g of pure water, and the sodium salt was changed to a sulfo group by using an ion exchange resin. When the obtained polymer was measured by $^{19}F$, $^1H$-NMR and GPC, the following analytical results were obtained.

Weight-average molecular weight (Mw)=22,000
Molecular weight distribution (Mw/Mn)=2.00
This polymer compound is (Polymer 10).

Polymer 10

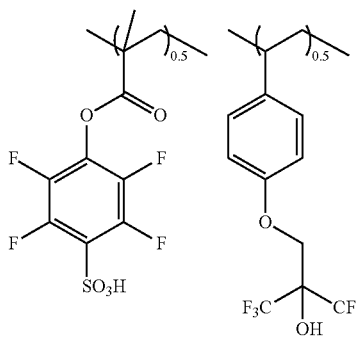

Comparative Synthesis Example 1

Under nitrogen atmosphere, a solution was added dropwise over 4 hours to 10 g of methanol stirred at 64° C., the solution containing 0.60 g of Monomer a"1, 5.00 g of Monomer b"1, and 0.12 g of dimethyl 2,2'-azobis(isobutyrate) dissolved in 3 g of methanol. The mixture was further stirred at 64° C. for 4 hours. After cooled to room temperature, the mixture was added dropwise to 10 g of ethyl acetate under vigorous stirring. The formed solid product was collected by filtration, and dried under vacuum at 50° C. for 15 hours. Thus, a white polymer was obtained.

The obtained white polymer was dissolved in 100 g of pure water, and the ammonium salt was changed to a sulfo group by using an ion exchange resin. When the obtained polymer was measured by $^{19}F$, $^1H$-NMR and GPC, the following analytical results were obtained.

Weight-average molecular weight (Mw)=20,500
Molecular weight distribution (Mw/Mn)=1.94
This polymer compound is (Comparative Polymer 1).

Comparative Polymer 1

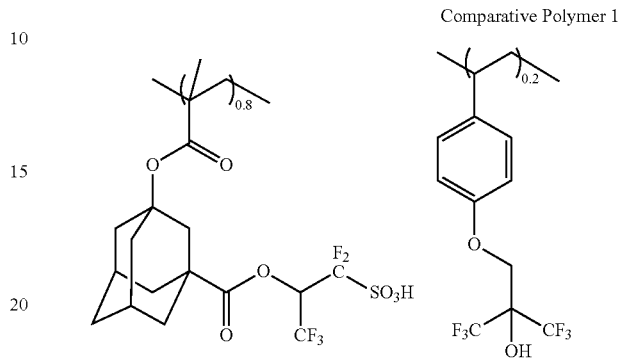

Comparative Synthesis Example 2

Under nitrogen atmosphere, a solution was added dropwise over 4 hours to 10 g of methanol stirred at 64° C., the solution containing 0.60 g of Monomer a"1, 4.08 g of Monomer b"2, and 0.12 g of dimethyl 2,2'-azobis(isobutyrate) dissolved in 3 g of methanol. The mixture was further stirred at 64° C. for 4 hours. After cooled to room temperature, the mixture was added dropwise to 10 g of ethyl acetate under vigorous stirring. The formed solid product was collected by filtration, and dried under vacuum at 50° C. for 15 hours. Thus, a white polymer was obtained.

The obtained white polymer was dissolved in 100 g of pure water, and the ammonium salt was changed to a sulfo group by using an ion exchange resin. When the obtained polymer was measured by $^{19}F$, $^1H$-NMR and GPC, the following analytical results were obtained.

Weight-average molecular weight (Mw)=19,500
Molecular weight distribution (Mw/Mn)=1.99
This polymer compound is (Comparative Polymer 2).

Comparative Polymer 2

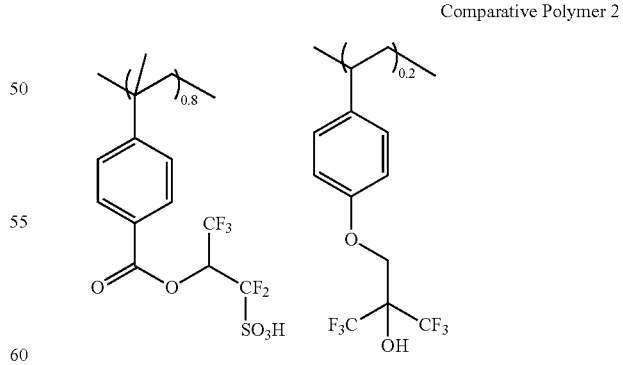

Comparative Synthesis Example 3

Under nitrogen atmosphere, a solution was added dropwise over 4 hours to 10 g of methanol stirred at 64° C., the solution containing 0.87 g of Monomer a"4, 5.00 g of Monomer b"1, and 0.12 g of dimethyl 2,2'-azobis(isobutyrate) dissolved in 3 g of methanol. The mixture was further stirred at 64° C. for 4 hours. After cooled to room temperature, the mixture was added dropwise to 10 g of ethyl acetate under vigorous stirring. The formed solid product was collected by filtration, and dried under vacuum at 50° C. for 15 hours. Thus, a white polymer was obtained.

The obtained white polymer was dissolved in 100 g of pure water, and the ammonium salt was changed to a sulfo group by using an ion exchange resin. When the obtained polymer was measured by $^{19}F$, $^1H$-NMR and GPC, the following analytical results were obtained.

Weight-average molecular weight (Mw)=19,500

Molecular weight distribution (Mw/Mn)=2.00

This polymer compound is (Comparative Polymer 3).

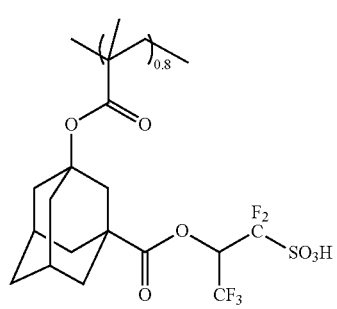

Comparative Polymer 3

Comparative Synthesis Example 4

Under nitrogen atmosphere, a solution was added dropwise over 4 hours to 10 g of methanol stirred at 64° C., the solution containing 1.00 g of Monomer a"5, 5.00 g of Monomer b"1, and 0.12 g of dimethyl 2,2'-azobis(isobutyrate) dissolved in 3 g of methanol. The mixture was further stirred at 64° C. for 4 hours. After cooled to room temperature, the mixture was added dropwise to 10 g of ethyl acetate under vigorous stirring. The formed solid product was collected by filtration, and dried under vacuum at 50° C. for 15 hours. Thus, a white polymer was obtained.

The obtained white polymer was dissolved in 100 g of pure water, and the ammonium salt was changed to a sulfo group by using an ion exchange resin. When the obtained polymer was measured by $^{19}F$, $^1H$-NMR and GPC, the following analytical results were obtained.

Weight-average molecular weight (Mw)=20,000

Molecular weight distribution (Mw/Mn)=1.85

This polymer compound is (Comparative Polymer 4).

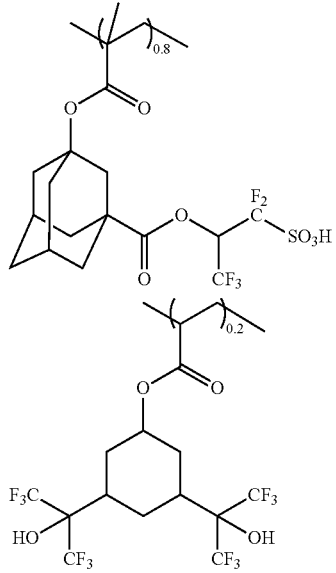

Comparative Polymer 4

Comparative Synthesis Example 5

Under nitrogen atmosphere, a solution was added dropwise over 4 hours to 10 g of methanol stirred at 64° C., the solution containing 0.90 g of Monomer a"1, 4.60 g of Monomer b"3, and 0.12 g of dimethyl 2,2'-azobis(isobutyrate) dissolved in 3 g of methanol. The mixture was further stirred at 64° C. for 4 hours. After cooled to room temperature, the mixture was added dropwise to 10 g of ethyl acetate under vigorous stirring. The formed solid product was collected by filtration, and dried under vacuum at 50° C. for 15 hours. Thus, a white polymer was obtained.

The obtained white polymer was dissolved in 100 g of pure water, and the ammonium salt was changed to a sulfo group by using an ion exchange resin. When the obtained polymer was measured by $^{19}F$, $^1H$-NMR and GPC, the following analytical results were obtained.

Weight-average molecular weight (Mw)=26,000

Molecular weight distribution (Mw/Mn)=2.04

This polymer compound is (Comparative Polymer 5).

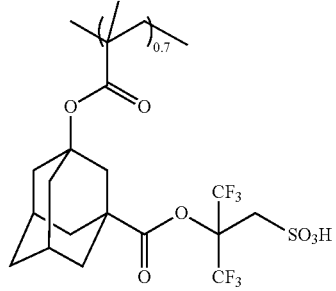

Comparative Polymer 5

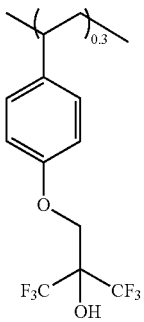

Comparative Synthesis Example 6

Under nitrogen atmosphere, a solution was added dropwise over 4 hours to 10 g of methanol stirred at 64° C., the solution containing 0.90 g of Monomer a"1, 2.35 g of Monomer b"4, and 0.12 g of dimethyl 2,2'-azobis(isobutyrate) dissolved in 3 g of methanol. The mixture was further stirred at 64° C. for 4 hours. After cooled to room temperature, the mixture was added dropwise to 10 g of ethyl acetate under vigorous stirring. The formed solid product was collected by filtration, and dried under vacuum at 50° C. for 15 hours. Thus, a white polymer was obtained.

The obtained white polymer was dissolved in 100 g of pure water, and the sodium salt was changed to a sulfo group by using an ion exchange resin. When the obtained polymer was measured by $^{19}F$, $^{1}H$-NMR and GPC, the following analytical results were obtained.

Weight-average molecular weight (Mw)=31,000
Molecular weight distribution (Mw/Mn)=2.11
This polymer compound is (Comparative Polymer 6).

Comparative Polymer 6

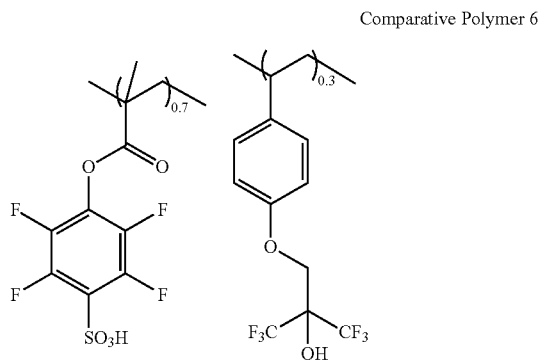

[Preparation of Conductive Polymer Composite Dispersion Containing Polythiophene as π-Conjugated Polymer]

Preparation Example 1

2.37 g of 3,4-ethylenedioxythiophene and a solution in which 15.0 g of Polymer 1 had been dissolved in 1,000 mL of ultrapure water were mixed at 30° C.

The obtained mixture solution was maintained at 30° C. under stirring. In this state, 5.22 g of sodium persulfate dissolved in 100 mL of ultrapure water and an oxidizing catalyst solution of 1.42 g of ferric sulfate were gradually added thereto and stirred for 4 hours to react these materials.

To the obtained reaction solution, 1,000 mL of ultrapure water was added, and about 1,000 mL of the solution was removed by using the ultrafiltration method. This operation was repeated three times.

Then, to the processed solution after the filtration treatment, 200 mL of sulfuric acid diluted to 10 mass % and 2,000 mL of ion exchanged water were added. About 2,000 mL of the processed solution was removed by using the ultrafiltration method, and 2,000 mL of ion exchanged water was added thereto. About 2,000 mL of the solution was removed by using the ultrafiltration method. This operation was repeated three times.

Further, 2,000 mL of ion exchanged water was added to the obtained processed solution, and about 2,000 mL of the processed solution was removed by using the ultrafiltration method. This operation was repeated five times. The resultant was concentrated to obtain 2.5 mass % of blue-colored Conductive Polymer Composite Dispersion 1.

The ultrafiltration conditions were as follows.
Molecular weight cutoff of ultrafiltration membrane: 30 K
Cross flow type
Flow amount of supplied liquid: 3,000 mL/minute
Membrane partial pressure: 0.12 Pa
Note that the ultrafiltration was carried out under the same conditions in the other Preparation Examples.

Preparation Example 2

Preparation was carried out in the same manner as in Preparation Example 1 except for changing 15.0 g of Polymer 1 to Polymer 2, and changing the amount of 3,4-ethylenedioxythiophene blended to 2.49 g, the amount of sodium persulfate blended to 5.47 g, and the amount of ferric sulfate blended to 1.49 g. Thus, Conductive Polymer Composite Dispersion 2 was obtained.

Preparation Example 3

Preparation was carried out in the same manner as in Preparation Example 1 except for changing 15.0 g of Polymer 1 to Polymer 3, and changing the amount of 3,4-ethylenedioxythiophene blended to 2.49 g, the amount of sodium persulfate blended to 5.47 g, and the amount of ferric sulfate blended to 1.49 g. Thus, Conductive Polymer Composite Dispersion 3 was obtained.

Preparation Example 4

Preparation was carried out in the same manner as in Preparation Example 1 except for changing 15.0 g of Polymer 1 to Polymer 4, and changing the amount of 3,4-ethylenedioxythiophene blended to 2.84 g, the amount of sodium persulfate blended to 6.25 g, and the amount of ferric sulfate blended to 1.70 g. Thus, Conductive Polymer Composite Dispersion 4 was obtained.

Preparation Example 5

Preparation was carried out in the same manner as in Preparation Example 1 except for changing 15.0 g of Polymer 1 to Polymer 5, and changing the amount of 3,4-ethylenedioxythiophene blended to 2.28 g, the amount of sodium persulfate blended to 5.01 g, and the amount of ferric sulfate blended to 1.37 g. Thus, Conductive Polymer Composite Dispersion 5 was obtained.

Preparation Example 6

Preparation was carried out in the same manner as in Preparation Example 1 except for changing 15.0 g of Polymer 1 to Polymer 6, and changing the amount of 3,4-ethylenedioxythiophene blended to 2.47 g, the amount of sodium persulfate blended to 5.43 g, and the amount of ferric sulfate blended to 1.48 g. Thus, Conductive Polymer Composite Dispersion 6 was obtained.

Preparation Example 7

Preparation was carried out in the same manner as in Preparation Example 1 except for changing 15.0 g of Polymer 1 to Polymer 7, and changing the amount of 3,4-ethylenedioxythiophene blended to 2.00 g, the amount of sodium persulfate blended to 4.40 g, and the amount of ferric sulfate blended to 1.20 g. Thus, Conductive Polymer Composite Dispersion 7 was obtained.

Preparation Example 8

Preparation was carried out in the same manner as in Preparation Example 1 except for changing 15.0 g of Polymer 1 to Polymer 8, and changing the amount of 3,4-ethylenedioxythiophene blended to 1.90 g, the amount of sodium persulfate blended to 4.17 g, and the amount of ferric sulfate blended to 1.13 g. Thus, Conductive Polymer Composite Dispersion 8 was obtained.

Preparation Example 9

Preparation was carried out in the same manner as in Preparation Example 1 except for changing 15.0 g of Polymer 1 to Polymer 9, and changing the amount of 3,4-ethylenedioxythiophene blended to 1.89 g, the amount of sodium persulfate blended to 4.15 g, and the amount of ferric sulfate blended to 1.13 g. Thus, Conductive Polymer Composite Dispersion 9 was obtained.

Preparation Example 10

Preparation was carried out in the same manner as in Preparation Example 1 except for changing 15.0 g of Polymer 1 to Polymer 10, and changing the amount of 3,4-ethylenedioxythiophene blended to 3.00 g, the amount of sodium persulfate blended to 6.60 g, and the amount of ferric sulfate blended to 1.80 g. Thus, Conductive Polymer Composite Dispersion 10 was obtained.

Comparative Preparation Example 1

Preparation was carried out in the same manner as in Preparation Example 1 except for changing 15.0 g of Polymer 1 to Comparative Polymer 1, and changing the amount of 3,4-ethylenedioxythiophene blended to 2.09 g, the amount of sodium persulfate blended to 4.59 g, and the amount of ferric sulfate blended to 1.25 g. Thus, Comparative Conductive Polymer Composite Dispersion 1 was obtained.

Comparative Preparation Example 2

Preparation was carried out in the same manner as in Preparation Example 1 except for changing 15.0 g of Polymer 1 to Comparative Polymer 2, and changing the amount of 3,4-ethylenedioxythiophene blended to 2.64 g, the amount of sodium persulfate blended to 5.82 g, and the amount of ferric sulfate blended to 1.59 g. Thus, Comparative Conductive Polymer Composite Dispersion 2 was obtained.

Comparative Preparation Example 3

Preparation was carried out in the same manner as in Preparation Example 1 except for changing 15.0 g of Polymer 1 to Comparative Polymer 3, and changing the amount of 3,4-ethylenedioxythiophene blended to 1.97 g, the amount of sodium persulfate blended to 4.33 g, and the amount of ferric sulfate blended to 1.18 g. Thus, Comparative Conductive Polymer Composite Dispersion 3 was obtained.

Comparative Preparation Example 4

Preparation was carried out in the same manner as in Preparation Example 1 except for changing 15.0 g of Polymer 1 to Comparative Polymer 4, and changing the amount of 3,4-ethylenedioxythiophene blended to 1.91 g, the amount of sodium persulfate blended to 4.21 g, and the amount of ferric sulfate blended to 1.15 g. Thus, Comparative Conductive Polymer Composite Dispersion 4 was obtained.

Comparative Preparation Example 5

Preparation was carried out in the same manner as in Preparation Example 1 except for changing 15.0 g of Polymer 1 to Comparative Polymer 5, and changing the amount of 3,4-ethylenedioxythiophene blended to 2.05 g, the amount of sodium persulfate blended to 4.50 g, and the amount, of ferric sulfate blended to 1.23 g. Thus, Comparative Conductive Polymer Composite Dispersion 5 was obtained.

Comparative Preparation Example 6

Preparation was carried out in the same manner as in Preparation Example 1 except for changing 15.0 g of Polymer 1 to Comparative Polymer 6, and changing the amount of 3,4-ethylenedioxythiophene blended to 2.97 g, the amount of sodium persulfate blended to 6.54 g, and the amount of ferric sulfate blended to 1.78 g. Thus, Comparative Conductive Polymer Composite Dispersion 6 was obtained.

[Evaluation of Conductive Polymer Composition Containing Polythiophene as π-Conjugated Polymer]

EXAMPLES 2.5 mass % of one of the conductive polymer composite dispersions obtained in Preparation Examples 1 to 10 was mixed with 0.43 mass % of L-(+)-Lysine included in the compound (E) shown by the general formula (2) and a fluoroalkyl-based nonionic surfactant FS-31 (available from DuPont), and further mixed with 10 wt % of PGMEA (propylene glycol monomethyl ether acetate) as the organic solvent (C1) and 5 wt % of EtOH as the organic solvent (C2). Then, such mixtures were filtered using cellulose filters (manufactured by ADVANTEC Corporation) having a pore size of 0.20 μm. In this manner, conductive polymer compositions were prepared and respectively designated as Examples 1 to 10.

Conductive polymer compositions designated as Examples 11 to 20 were prepared in a manner similar to those in Examples 1 to 10 by mixing 10 wt % of PGMEA (propylene glycol monomethyl ether acetate) as the organic solvent (C1) and 5 wt % of IPA (2-propanol) as the organic solvent (C2).

Conductive polymer compositions designated as Examples 21 to 30 were prepared in a manner similar to those in Examples 1 to 10 by mixing 10 wt % of PGMEA (propylene glycol monomethyl ether acetate) as the organic solvent (C1) and 5 wt % of $^t$BuOH (tertiary butyl alcohol) as the organic solvent (C2).

Conductive polymer compositions designated as Examples 31 to 40 were prepared in a manner similar to those in Examples 1 to 10 by mixing 10 wt % of PGME (propylene glycol monomethyl ether) as the organic solvent (C1) and 5 wt % of EtOH as the organic solvent (C2).

Conductive polymer compositions designated as Examples 41 to 50 were prepared in a manner similar to those in Examples 1 to 10 by mixing 10 wt % of PGME (propylene glycol monomethyl ether) as the organic solvent (C1) and 5 wt % of IPA (2-propanol) as the organic solvent (C2).

Conductive polymer compositions designated as Examples 51 to 60 were prepared in a manner similar to those in Examples 1 to 10 by mixing 10 wt % of PGME (propylene glycol monomethyl ether) as the organic solvent (C1) and 5 wt % of $^t$BuOH (tertiary butyl alcohol) as the organic solvent (C2).

Comparative Examples 2.5 mass % of one of the conductive polymer composite dispersions obtained in Comparative Preparation Examples 1 to 6 was mixed with 0.43 mass % of L-(+)-Lysine included in the compound (E) shown by the general formula (2) and a fluoroalkyl-based nonionic surfactant FS-31 (available from DuPont), and further mixed with 10 wt % of PGMEA (propylene glycol monomethyl ether acetate) as the organic solvent (C1) and 5 wt % of EtOH as the organic solvent (C2). Then, such mixtures were filtered using cellulose filters (manufactured by ADVANTEC Corporation) having a pore size of 0.20 μm. In this manner, conductive polymer compositions were prepared and respectively designated as Comparative Examples 1 to 6.

Conductive polymer compositions designated as Comparative Examples 7 to 12 were prepared in a manner similar to those in Comparative Examples 1 to 6 by mixing 10 wt % of PGMEA (propylene glycol monomethyl ether acetate) as the organic solvent (C1) and 5 wt % of IPA (2-propanol) as the organic solvent (C2).

Conductive polymer compositions designated as Comparative Examples 13 to 18 were prepared in a manner similar to those in Comparative Examples 1 to 6 by mixing 10 wt % of PGMEA (propylene glycol monomethyl ether acetate) as the organic solvent (C1) and 5 wt % of $^t$BuOH (tertiary butyl alcohol) as the organic solvent (C2).

Conductive polymer compositions designated as Comparative Examples 19 to 24 were prepared in a manner similar to those in Comparative Examples 1 to 6 by mixing 10 wt % of PGME (propylene glycol monomethyl ether) as the organic solvent (C1) and 5 wt % of EtOH as the organic solvent (C2).

Conductive polymer compositions designated as Comparative Examples 25 to 30 were prepared in a manner similar to those in Comparative Examples 1 to 6 by mixing 10 wt % of PGME (propylene glycol monomethyl ether) as the organic solvent (C1) and 5 wt % of IPA (2-propanol) as the organic solvent (C2).

Conductive polymer compositions designated as Comparative Examples 31 to 36 were prepared in a manner similar to those in Comparative Examples 1 to 6 by mixing 10 wt % of PGME (propylene glycol monomethyl ether) as the organic solvent (C1) and 5 wt % of $^t$BuOH (tertiary butyl alcohol) as the organic solvent (C2).

The conductive polymer compositions of Examples and Comparative Examples prepared as described above were evaluated as follows.

(Surface Tension)

The surface tension of each composition was measured using a du Nouy surface tensiometer Model D (manufactured by Ito Seisakusho Co., Ltd.). Tables 1-1 to 1-3 show the result.

(Viscosity)

The liquid temperature of each conductive polymer composition was adjusted to 25° C. Then, 35 mL of each composition was weighed into a measurement cell specifically attached to a tuning fork vibration type viscometer SV-10 (manufactured by A&D Company Limited) to measure the viscosity immediately after the preparation. Tables 1-1 to 1-3 show the result.

(pH Measurement)

The pH of each conductive polymer composition was measured using a pH meter D-52 (manufactured by HORIBA, Ltd.). Tables 1-1 to 1-3 show the result.

(Transmittance)

From the refractive index (n, k) at a wavelength of 636 nm measured using a spectroscopic ellipsometer (VASE) with variable incident angle, the transmittance for light beam with a wavelength of 550 nm at FT-200 nm was calculated. Tables 1-1 to 1-3 show the result.

(Conductivity)

Onto a $SiO_2$ wafer having a diameter of 4 inches (100 mm), 1.0 mL of a conductive polymer composition was added dropwise. After 10 seconds, the whole wafer was spin-coated therewith by using a spinner. The spin-coating conditions were so adjusted that the film thickness became 100±5 nm. Baking was carried out in a precise constant temperature oven at 120° C. for 30 minutes to remove the solvent. Thus, a conductive film was obtained.

The electric conductivity (S/cm) of the obtained conductive film was determined from the actually measured value of the film thickness and the surface resistivity (Ω/□) measured by using Hiresta-UP MCP-HT450 and Loresta-GP MCP-T610 (both manufactured by Mitsubishi Chemical Corporation). Tables 1-1 to 1-3 show the result.

(Spray Coater Film Formability)

A 35 mm-square non-alkaline glass substrate was subjected to surface cleaning with $UV/O_3$ for 10 minutes, and coated with one of the conductive polymer compositions by using a spray coater NVD203 (manufactured by Fujimori Technical Laboratory Inc.) to form a film. The coating film surface was observed with an optical microscope and an interference microscope to evaluate whether a continuous film was formed or not. Tables 1-1 to 1-3 show the result.

(Crosstalk on Organic EL Light)

One of the conductive polymer compositions of Examples 1 to 60 and Comparative Examples 1 to 36 was applied to a washed glass substrate with ITO by spray coating to have a film thickness of 100 nm. α-NPD (diphenylnaphthyldiamine) was stacked thereon as a hole transport layer by vapor deposition to have a film thickness of 80 nm. Then, as a light emitting layer, $Alq_3$ (tris(8-hydroxyquinoline)aluminum) complex was vapor-deposited to have a film thickness of 35 nm, and 8-Liq (8-hydroxyquinolinolato-lithium) was vapor-deposited thereon to have a film thickness of 30 nm. An electrode made of an alloy in which magnesium and silver had been mixed was formed thereon to have a film thickness of 100 nm. In this manner, organic EL devices were obtained. The devices were caused to emit light under load with a fixed current density of 20 $mA/cm^2$ to see whether light was emitted outside the ITO electrode (crosstalk) with an optical microscope. Tables 1-1 to 1-3 show the result. The films of the conductive polymer compositions were formed using a spray coater NVD203 (manufactured by Fujimori Technical Laboratory Inc.) for the application, followed by heating at 200° C. for 30 min.

TABLE 1-1

|  | Surface tension (mN/m) | Viscosity (mPa/s) | pH | Transmittance (FT = 200 nm, λ = 550 nm) | Conductivity (S/cm) | Spray coated film state | Light emission outside ITO electrode (crosstalk) |
|---|---|---|---|---|---|---|---|
| Example 1 | 34.0 | 3.60 | 6.2 | 95% | 9.26E−06 | continuous (flat) | none |
| Example 2 | 33.6 | 4.02 | 6.6 | 95% | 4.55E−07 | continuous (flat) | none |
| Example 3 | 32.5 | 3.68 | 6.3 | 96% | 5.40E−06 | Continuous (flat) | none |
| Example 4 | 33.3 | 3.22 | 6.9 | 96% | 4.53E−07 | continuous (flat) | none |
| Example 5 | 33.5 | 3.81 | 7.0 | 94% | 6.21E−06 | continuous (flat) | none |
| Example 6 | 34.2 | 3.53 | 6.5 | 92% | 6.31E−06 | continuous (flat) | none |
| Example 7 | 33.8 | 3.77 | 6.1 | 95% | 2.14E−06 | Continuous (flat) | none |
| Example 8 | 34.0 | 3.52 | 6.2 | 93% | 4.29E−06 | continuous (flat) | none |
| Example 9 | 36.2 | 3.24 | 6.5 | 99% | 7.25E−06 | continuous (flat) | none |
| Example 10 | 33.2 | 3.58 | 6.0 | 97% | 3.64E−06 | Continuous (flat) | none |
| Example 11 | 32.8 | 3.46 | 6.8 | 95% | 5.82E−06 | continuous (flat) | none |
| Example 12 | 33.5 | 3.26 | 6.4 | 94% | 2.28E−07 | Continuous (flat) | none |
| Example 13 | 34.0 | 3.48 | 6.6 | 95% | 6.34E−06 | Continuous (flat) | none |
| Example 14 | 33.6 | 3.29 | 6.6 | 96% | 1.58E−07 | continuous (flat) | none |
| Example 15 | 33.3 | 3.55 | 6.7 | 96% | 6.31E−06 | continuous (flat) | none |
| Example 16 | 33.5 | 3.77 | 6.2 | 96% | 2.56E−06 | Continuous (flat) | none |
| Example 17 | 33.2 | 3.59 | 6.0 | 97% | 3.64E−06 | continuous (flat) | none |
| Example 18 | 32.5 | 3.64 | 6.3 | 95% | 2.58E−06 | continuous (flat) | none |
| Example 19 | 32.6 | 3.69 | 6.3 | 95% | 1.59E−06 | Continuous (flat) | none |
| Example 20 | 33.5 | 3.87 | 6.4 | 96% | 3.64E−06 | Continuous (flat) | none |
| Example 21 | 33.8 | 3.21 | 6.9 | 96% | 2.64E−06 | continuous (flat) | none |
| Example 22 | 33.1 | 3.75 | 6.0 | 94% | 4.67E−07 | Continuous (flat) | none |
| Example 23 | 33.0 | 3.69 | 5.9 | 95% | 7.36E−06 | continuous (flat) | none |
| Example 24 | 34.2 | 3.58 | 6.3 | 96% | 1.62E−07 | continuous (flat) | none |
| Example 25 | 34.6 | 3.94 | 6.5 | 94% | 3.96E−06 | Continuous (flat) | none |
| Example 26 | 33.6 | 3.48 | 6.9 | 95% | 4.59E−06 | Continuous (flat) | none |
| Example 27 | 34.0 | 3.99 | 6.2 | 96% | 6.41E−06 | continuous (flat) | none |
| Example 28 | 33.8 | 4.12 | 6.4 | 95% | 3.20E−06 | Continuous (flat) | none |
| Example 29 | 33.5 | 3.59 | 6.5 | 95% | 3.69E−06 | continuous (flat) | none |
| Example 30 | 34.2 | 3.67 | 6.6 | 94% | 2.48E−06 | continuous (flat) | none |

TABLE 1-2

|  | Surface tension (mN/m) | Viscosity (mPa/s) | pH | Transmittance (FT = 200 nm, λ = 550 nm) | Conductivity (S/cm) | Spray coated film state | Light emission outside ITO electrode (crosstalk) |
|---|---|---|---|---|---|---|---|
| Example 31 | 34.2 | 3.88 | 6.0 | 92% | 8.56E−06 | Continuous (flat) | none |
| Example 32 | 34.0 | 3.15 | 5.9 | 95% | 3.48E−07 | Continuous (flat) | none |
| Example 33 | 33.7 | 3.45 | 5.8 | 95% | 6.48E−06 | Continuous (flat) | none |
| Example 34 | 32.9 | 3.69 | 6.1 | 96% | 5.42E−07 | Continuous (flat) | none |
| Example 35 | 33.5 | 3.75 | 6.7 | 96% | 9.62E−06 | Continuous (flat) | none |
| Example 36 | 33.4 | 3.58 | 6.4 | 94% | 3.69E−06 | Continuous (flat) | none |
| Example 37 | 34.0 | 3.93 | 6.5 | 95% | 4.28E−06 | Continuous (flat) | none |
| Example 38 | 34.8 | 4.21 | 6.1 | 96% | 6.34E−06 | Continuous (flat) | none |
| Example 39 | 34.9 | 3,69 | 6.8 | 96% | 4.25E−06 | Continuous (flat) | none |
| Example 40 | 33.2 | 3.45 | 6.0 | 96% | 3.64E−06 | Continuous (flat) | none |
| Example 41 | 33.0 | 3.85 | 6.2 | 97% | 1.50E−07 | Continuous (flat) | none |
| Example 42 | 32.5 | 3.75 | 6.6 | 95% | 4.30E−07 | Continuous (flat) | none |
| Example 43 | 33.9 | 3.69 | 6.7 | 94% | 6.38E−06 | Continuous (flat) | none |
| Example 44 | 32.1 | 3.58 | 6.6 | 92% | 3.15E−07 | Continuous (flat) | none |
| Example 45 | 34.3 | 3.99 | 6.2 | 94% | 6.32E−06 | Continuous (flat) | none |
| Example 46 | 32.6 | 3.69 | 6.0 | 95% | 1.45E−07 | Continuous (flat) | none |
| Example 47 | 32.5 | 3.85 | 6.6 | 96% | 5.35E−06 | Continuous (flat) | none |
| Example 48 | 33.8 | 3.87 | 6.3 | 96% | 4.15E−06 | Continuous (flat) | none |
| Example 49 | 33.0 | 3.58 | 6.6 | 96% | 6.32E−06 | Continuous (flat) | none |
| Example 50 | 34.2 | 3.24 | 6.5 | 95% | 4.15E−06 | Continuous (flat) | none |
| Example 51 | 33.6 | 3.65 | 6.2 | 96% | 2.35E−06 | Continuous (flat) | none |
| Example 52 | 32.6 | 3.58 | 6.2 | 96% | 4.65E−07 | Continuous (flat) | none |
| Example 53 | 33.8 | 3.69 | 6.8 | 93% | 6.32E−06 | Continuous (flat) | none |
| Example 54 | 34.2 | 3.89 | 6.0 | 95% | 2.25E−07 | Continuous (flat) | none |
| Example 55 | 34.0 | 3.72 | 5.9 | 95% | 7.52E−06 | Continuous (flat) | none |
| Example 56 | 33.6 | 3.48 | 6.4 | 97% | 3.54E−06 | Continuous (flat) | none |
| Example 57 | 32.9 | 3.95 | 6.8 | 99% | 6.25E−06 | Continuous (flat) | none |
| Example 58 | 33.3 | 3.68 | 5.8 | 93% | 2.58E−06 | Continuous (flat) | none |
| Example 59 | 33.5 | 3.88 | 6.2 | 92% | 4.25E−06 | Continuous (flat) | none |
| Example 60 | 34.0 | 3.95 | 6.5 | 96% | 6.25E−06 | Continuous (flat) | none |

TABLE 1-3

|  | Surface tension (mN/m) | Viscosity (mPa/s) | pH | Transmittance (FT = 200 nm, λ = 550 nm) | Conductivity (S/cm) | Spray coated film state | Light emission outside ITO electrode (crosstalk) |
|---|---|---|---|---|---|---|---|
| Comparative Example 1 | 35.2 | 3.25 | 6.3 | 95% | 3.20E−05 | continuous (flat) | observed |
| Comparative Example 2 | 34.2 | 3.98 | 6.9 | 93% | 7.80E−05 | continuous (flat) | observed |

TABLE 1-3-continued

| | Surface tension (mN/m) | Viscosity (mPa/s) | pH | Transmittance (FT = 200 nm, λ = 550 nm) | Conductivity (S/cm) | Spray coated film state | Light emission outside ITO electrode (crosstalk) |
|---|---|---|---|---|---|---|---|
| Comparative Example 3 | 33.5 | 3.69 | 6.3 | 96% | 3.20E−05 | Continuous (flat) | observed |
| Comparative Example 4 | 34.0 | 3.31 | 6.5 | 93% | 9.50E−04 | Continuous (flat) | observed |
| Comparative Example 5 | 35.0 | 3.52 | 6.2 | 95% | 6.30E−05 | Continuous (flat) | observed |
| Comparative Example 6 | 34.2 | 3.65 | 6.4 | 96% | 3.20E−05 | Continuous (flat) | observed |
| Comparative Example 7 | 31.2 | 3.11 | 6.8 | 96% | 6.90E−05 | Continuous (flat) | observed |
| Comparative Example 8 | 33.5 | 3.56 | 6.6 | 96% | 3.50E−05 | Continuous (flat) | observed |
| Comparative Example 9 | 34.2 | 3.35 | 6.4 | 95% | 4.30E−05 | Continuous (flat) | observed |
| Comparative Example 10 | 34.0 | 3.25 | 6.9 | 96% | 5.70E−05 | Continuous (flat) | observed |
| Comparative Example 11 | 33.9 | 3.59 | 6.5 | 94% | 5.30E−05 | Continuous (flat) | observed |
| Comparative Example 12 | 35.1 | 3.85 | 6.5 | 96% | 3.60E−05 | Continuous (flat) | observed |
| Comparative Example 13 | 34.5 | 3.43 | 6.6 | 95% | 1.90E−04 | Continuous (flat) | observed |
| Comparative Example 14 | 34.2 | 3.55 | 6.4 | 96% | 1.50E−04 | Continuous (flat) | observed |
| Comparative Example 15 | 35.2 | 3.68 | 6.5 | 96% | 2.60E−05 | Continuous (flat) | observed |
| Comparative Example 16 | 33.5 | 3.63 | 6.5 | 93% | 1.60E−04 | Continuous (flat) | observed |
| Comparative Example 17 | 34.6 | 3.33 | 6.6 | 94% | 3.60E−05 | Continuous (flat) | observed |
| Comparative Example 18 | 33.2 | 3.37 | 6.3 | 95% | 5.50E−05 | Continuous (flat) | observed |
| Comparative Example 19 | 34.2 | 3.93 | 6.4 | 96% | 8.60E−05 | Continuous (flat) | observed |
| Comparative Example 20 | 35.0 | 4.05 | 6.5 | 93% | 6.90E−05 | Continuous (flat) | observed |
| Comparative Example 21 | 34.4 | 3.66 | 6.0 | 96% | 5.80E−05 | Continuous (flat) | observed |
| Comparative Example 22 | 34.9 | 3.48 | 6.5 | 95% | 4.90E−05 | Continuous (flat) | observed |
| Comparative Example 23 | 34.5 | 3.32 | 6.0 | 94% | 8.60E−05 | Continuous (flat) | observed |
| Comparative Example 24 | 34.7 | 3.28 | 6.5 | 96% | 4.90E−05 | Continuous (flat) | observed |
| Comparative Example 25 | 34.0 | 3.98 | 6.2 | 96% | 6.80E−05 | Continuous (flat) | observed |
| Comparative Example 26 | 33.5 | 3.68 | 6.5 | 94% | 5.60E−05 | Continuous (flat) | observed |
| Comparative Example 27 | 34.5 | 3.35 | 6.4 | 95% | 4.90E−05 | Continuous (flat) | observed |
| Comparative Example 28 | 36.0 | 3.91 | 6.5 | 96% | 7.60E−05 | Continuous (flat) | observed |
| Comparative Example 29 | 34.0 | 3.99 | 6.7 | 93% | 6.00E−05 | Continuous (flat) | observed |
| Comparative Example 30 | 33.9 | 4.20 | 6.5 | 95% | 4.30E−05 | Continuous (flat) | observed |
| Comparative Example 31 | 35.6 | 3.83 | 6.9 | 96% | 9.60E−05 | Continuous (flat) | observed |
| Comparative Example 32 | 34.0 | 3.54 | 6.5 | 95% | 4.80E−05 | Continuous (flat) | observed |
| Comparative Example 33 | 35.1 | 3.99 | 6.4 | 95% | 5.30E−05 | Continuous (flat) | observed |
| Comparative Example 34 | 34.4 | 4.23 | 6.4 | 95% | 3.60E−05 | Continuous (flat) | observed |
| Comparative Example 35 | 34.0 | 4.50 | 6.8 | 94% | 3.50E−05 | Continuous (flat) | observed |
| Comparative Example 36 | 34.2 | 3.18 | 6.9 | 96% | 3.70E−05 | Continuous (flat) | observed |

(Luminance Attenuation Percentage after Device Continuous Light Emission)

One of the conductive polymer compositions of Examples 1 to 60 and Comparative Examples 1 to 36 was applied to a washed glass substrate with ITO by spray coating to have a film thickness of 100 nm. α-NPD (diphenylnaphthyldiamine) was stacked thereon as a hole transport layer by vapor deposition to have a film thickness of 80 nm. Then, as a light emitting layer, $Alq_3$ (tris(8-hydroxyquinoline)aluminum) complex was vapor-deposited to have a film thickness of 35 nm, and 8-Liq (8-hydroxyquinolinolato-lithium) was vapor-deposited thereon to have a film thickness of 30 nm. An electrode made of an alloy in which magnesium and silver had been mixed was formed thereon to have a film thickness of 100 nm. In this manner, organic EL devices were obtained. The devices were caused to emit light under load with a fixed current density of 20 mA/cm² to measure the luminance [cd/m²], [cd/A] immediately after driving, driving voltage [V], and an elapsed time until the luminance became 70% of that immediately after driving by the continuous light emission. Tables 2-1 to 2-3 show the results.

TABLE 2-1

|  | [cd/m²] | [cd/A] | [V] | Elapsed time (h) until 70% of luminance immediately after driving |
|---|---|---|---|---|
| Example 1 | 976.66 | 9.77 | 3.67 | 5523 |
| Example 2 | 941.76 | 9.42 | 3.74 | 5963 |
| Example 3 | 965.22 | 9.65 | 4.04 | 5696 |
| Example 4 | 965.22 | 9.65 | 4.04 | 5485 |
| Example 5 | 931.82 | 9.32 | 3.86 | 5555 |
| Example 6 | 953.22 | 9.53 | 3.88 | 5262 |
| Example 7 | 917.27 | 9.17 | 4.01 | 5858 |
| Example 8 | 922.74 | 9.23 | 3.52 | 5485 |
| Example 9 | 976.33 | 9.76 | 3.66 | 5698 |
| Example 10 | 955.43 | 9.55 | 3.61 | 5558 |
| Example 11 | 937.92 | 9.38 | 3.79 | 5695 |
| Example 12 | 949.88 | 9.50 | 3.78 | 5758 |
| Example 13 | 952.10 | 9.52 | 3.91 | 5958 |
| Example 14 | 962.61 | 9.63 | 4.00 | 5485 |
| Example 15 | 949.26 | 9.49 | 3.72 | 5358 |
| Example 16 | 941.76 | 9.42 | 3.74 | 5789 |
| Example 17 | 965.22 | 9.65 | 4.04 | 5969 |
| Example 18 | 965.22 | 9.65 | 4.04 | 5863 |
| Example 19 | 931.82 | 9.32 | 3.86 | 6002 |
| Example 20 | 953.22 | 9.53 | 3.88 | 5426 |
| Example 21 | 917.27 | 9.17 | 4.01 | 6012 |
| Example 22 | 922.74 | 9.23 | 3.52 | 5987 |
| Example 23 | 976.33 | 9.76 | 3.66 | 6023 |
| Example 24 | 955.43 | 9.55 | 3.61 | 5858 |
| Example 25 | 937.92 | 9.38 | 3.79 | 5969 |
| Example 26 | 949.88 | 9.50 | 3.78 | 5485 |
| Example 27 | 952.10 | 9.52 | 3.91 | 5558 |
| Example 28 | 962.61 | 9.63 | 4.00 | 6023 |
| Example 29 | 949.26 | 9.49 | 3.72 | 6000 |
| Example 30 | 941.76 | 9.42 | 3.74 | 5785 |

TABLE 2-2

|  | [cd/m²] | [cd/A] | [V] | Elapsed time (h) until 70% of luminance immediately after driving |
|---|---|---|---|---|
| Example 31 | 965.22 | 9.65 | 4.04 | 5956 |
| Example 32 | 965.22 | 9.65 | 4.04 | 5485 |
| Example 33 | 931.82 | 9.32 | 3.86 | 5628 |
| Example 34 | 953.22 | 9.53 | 3.88 | 5826 |
| Example 35 | 917.27 | 9.17 | 4.01 | 5485 |
| Example 36 | 922.74 | 9.23 | 3.52 | 5932 |
| Example 37 | 976.33 | 9.76 | 3.66 | 5758 |
| Example 38 | 955.43 | 9.55 | 3.61 | 5625 |
| Example 39 | 937.92 | 9.38 | 3.79 | 5485 |
| Example 40 | 949.88 | 9.50 | 3.78 | 5995 |
| Example 41 | 952.10 | 9.52 | 3.91 | 5696 |
| Example 42 | 962.61 | 9.63 | 4.00 | 5820 |
| Example 43 | 949.26 | 9.49 | 3.72 | 5658 |
| Example 44 | 941.76 | 9.42 | 3.74 | 5963 |
| Example 45 | 965.22 | 9.65 | 4.04 | 6009 |
| Example 46 | 965.22 | 9.65 | 4.04 | 5958 |
| Example 47 | 931.82 | 9.32 | 3.86 | 5485 |
| Example 48 | 953.22 | 9.53 | 3.88 | 5695 |
| Example 49 | 917.27 | 9.17 | 4.01 | 5958 |
| Example 50 | 922.74 | 9.23 | 3.52 | 5777 |
| Example 51 | 976.33 | 9.76 | 3.66 | 5915 |
| Example 52 | 955.43 | 9.55 | 3.61 | 6000 |
| Example 53 | 937.92 | 9.38 | 3.79 | 5885 |
| Example 54 | 949.88 | 9.50 | 3.78 | 5969 |
| Example 55 | 952.10 | 9.52 | 3.91 | 5785 |
| Example 56 | 962.61 | 9.63 | 4.00 | 5695 |
| Example 57 | 949.26 | 9.49 | 3.72 | 5993 |
| Example 58 | 941.76 | 9.42 | 3.74 | 5750 |
| Example 59 | 965.22 | 9.65 | 4.04 | 5695 |
| Example 60 | 965.22 | 9.65 | 4.04 | 5882 |

TABLE 2-3

|  | [cd/m²] | [cd/A] | [V] | Elapsed time (h) until 70% of luminance immediately after driving |
|---|---|---|---|---|
| Comparative Example 1 | 955.43 | 9.55 | 3.61 | 5648 |
| Comparative Example 2 | 952.10 | 9.52 | 3.91 | 5555 |
| Comparative Example 3 | 949.26 | 9.49 | 3.72 | 5612 |
| Comparative Example 4 | 941.76 | 9.42 | 3.74 | 6000 |
| Comparative Example 5 | 965.22 | 9.65 | 4.04 | 5694 |
| Comparative Example 6 | 965.22 | 9.65 | 4.04 | 5998 |
| Comparative Example 7 | 953.22 | 9.53 | 3.88 | 5559 |
| Comparative Example 8 | 976.33 | 9.76 | 3.66 | 5565 |
| Comparative Example 9 | 937.92 | 9.38 | 3.79 | 5009 |
| Comparative Example 10 | 949.88 | 9.50 | 3.78 | 5252 |
| Comparative Example 11 | 952.10 | 9.52 | 3.91 | 5486 |
| Comparative Example 12 | 962.61 | 9.63 | 4.00 | 5788 |
| Comparative Example 13 | 941.76 | 9.42 | 3.74 | 5884 |
| Comparative Example 14 | 931.82 | 9.32 | 3.86 | 5694 |
| Comparative Example 15 | 917.27 | 9.17 | 4.01 | 5206 |
| Comparative Example 16 | 922.74 | 9.23 | 3.52 | 5893 |
| Comparative Example 17 | 976.33 | 9.76 | 3.66 | 4999 |
| Comparative Example 18 | 955.43 | 9.55 | 3.61 | 5648 |
| Comparative Example 19 | 962.61 | 9.63 | 4.00 | 5989 |
| Comparative Example 20 | 965.22 | 9.65 | 4.04 | 5777 |
| Comparative Example 21 | 931.82 | 9.32 | 3.86 | 5968 |
| Comparative Example 22 | 953.22 | 9.53 | 3.88 | 5559 |
| Comparative Example 23 | 917.27 | 9.17 | 4.01 | 5206 |
| Comparative Example 24 | 922.74 | 9.23 | 3.52 | 5798 |
| Comparative Example 25 | 955.43 | 9.55 | 3.61 | 5318 |
| Comparative Example 26 | 952.10 | 9.52 | 3.91 | 5688 |
| Comparative Example 27 | 949.26 | 9.49 | 3.72 | 5556 |
| Comparative Example 28 | 941.76 | 9.42 | 3.74 | 5468 |
| Comparative Example 29 | 965.22 | 9.65 | 4.04 | 5328 |
| Comparative Example 30 | 965.22 | 9.65 | 4.04 | 5969 |
| Comparative Example 31 | 953.22 | 9.53 | 3.88 | 5877 |
| Comparative Example 32 | 976.33 | 9.76 | 3.66 | 5186 |
| Comparative Example 33 | 937.92 | 9.38 | 3.79 | 5789 |
| Comparative Example 34 | 949.88 | 9.50 | 3.78 | 5999 |
| Comparative Example 35 | 952.10 | 9.52 | 3.91 | 5485 |
| Comparative Example 36 | 962.61 | 9.63 | 4.00 | 5666 |

As shown in Tables 1-1 to 1-3, Examples 1 to 60 and Comparative Examples 1 to 36 were equivalent in surface tension, viscosity, pH, and transmittance, and continuous (flat) films were formed by spray coating in any examples (in each of the conductive polymer compositions, the water-soluble organic solvent (C), the compound (E) shown by the general formula (2), and the surfactant were mixed with the H₂O (D) dispersion of the composite of the π-conjugated polymer (A) and the polymer (B) that was obtained by copolymerizing the polymerizable monomer shown by the general formula (6) and the monomer having a fluorosulfonic acid). Nevertheless, the electric conductivity in any of Examples 1 to 60 was lower than those in Comparative Examples 1 to 36 and was less than 1.00E-05 S/cm; no light emission outside the ITO electrode (crosstalk) occurred in the light emission test conducted on the organic EL devices in Examples. In contrast, light emission outside the ITO electrode surface (crosstalk) was observed in the light emission test conducted on the organic EL devices on which Comparative Examples 1 to 36 with an electric conductivity of 1.00E-05 S/cm or more were mounted.

Moreover, as shown in Tables 2-1 to 2-3, when Examples 1 to 60 and Comparative Examples 1 to 36 were mounted on the organic EL, the luminance [cd/m²], [cd/A] immediately after driving the devices, and the driving voltage [V] were equivalent. While the electric conductivity of any of Examples 1 to 60 was lower than those of Comparative Examples 1 to 36, the hole injection effect and function from ITO were equivalent. Examples 1 to 60 and Comparative Examples 1 to 36 were equivalent in the elapsed time until the luminance reached 70% of that immediately after driving by the continuous light emission. Accordingly, the conductive polymer compositions of Examples 1 to 60 are capable of exhibiting favorable performance as hole injection layer materials for organic EL devices.

As described above, it was revealed that: the inventive conductive polymer compositions are capable of forming continuous films on inorganic and organic substrates even by employing a spray-type printer, such as a spray coater and inkjet, in addition to conventional application with a spin coater; and the inventive conductive polymer compositions are capable of forming conductive films having appropriate transparency and conductivity as hole injection layer, and favorable injection efficiency. Moreover, in the component (B), the repeating unit "b" containing a sulfo group is copolymerized with the non-doping fluorinated unit "a" having no sulfonic acid terminal, and the use of this polymer as a dopant to form a composite with the component (A) improves the efficiency of eliminating the residual moisture in the resulting film, and has an effect of delaying luminance attenuation in an organic EL device in which the luminance attenuation is otherwise accelerated by moisture; in other words, the luminance lifetime of light emitted from an organic EL device is extended. Further, the compound (E) protects adjacent layers from H⁺ derived from the repeating unit "b" containing a sulfo group, and prevents corrosion of liquid-contacting metallic surface of a material used in the film formation. Furthermore, since the film electric conductivity (S/cm) is less than 1.00E-05, when the composition film is mounted on an organic EL device, a portion of this film applied outside the surface of an ITO electrode serving as an anode is prevented from functioning as a hole injection layer and simultaneously from acting as an electrode. This makes it possible to provide a device which causes no crosstalk and emits light only from an electrode surface designed to emit light.

It should be noted that the present invention is not limited to the above-described embodiments. The embodiments are just examples, and any embodiments that substantially have the same feature and demonstrate the same functions and effects as those in the technical concept disclosed in claims of the present invention are included in the technical scope of the present invention.

The invention claimed is:
1. A conductive polymer composition comprising:
   a composite comprising
      a π-conjugated polymer (A), wherein the component (A) is a material in which at least one precursor monomer selected from the group consisting of pyrrole, thiophene, selenophene, tellurophene, aniline, polycyclic aromatic compounds, and derivatives thereof is polymerized, and
      a polymer (B) shown by the following general formula (1);
   H₂O (D) for dispersing the composite;
   a water-soluble organic solvent (C); and
   a compound (E) shown by the following general formula (2),
   wherein an electric conductivity of a film with a thickness of 20 to 200 nm formed from the conductive polymer composition is less than 1.00E-05 S/cm, wherein the conductive polymer composition has a surface tension in a range of 20 to 50 mN/m,

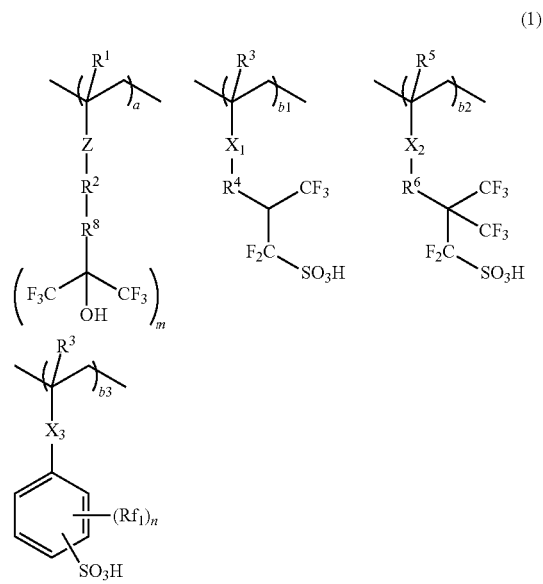

wherein R¹ represents a hydrogen atom or a methyl group; Z represents any of a phenylene group, a naphthylene group, an ester group, an ether group, an amino group, and an amide group; when Z is a phenylene group or a naphthylene group, R² represents any of a single bond and a linear, branched, or cyclic hydrocarbon group having 1 to 12 carbon atoms optionally having one or both of an ester group and an ether group; when Z is an ester group, an ether group, an amino group, or an amide group, R² represents any of a single bond and a linear, branched, or cyclic hydrocarbon group having 1 to 14 carbon atoms optionally having an ether group; "m" represents any one of 1 to 3; R³, R⁵, and R⁷ each independently represent a hydrogen atom or a methyl group; R⁴ and R⁶ each independently represent any of a single bond and a linear, branched, or cyclic hydrocarbon group having 1 to 12 carbon atoms optionally having one or both of an ether group and an ester group; $R^8$ represents any of a single bond, a methylene group, an ethylidene group, an isopropylidene group, an ether group, an ester group, an amino group, an amide group, and a linear, branched, or cyclic hydrocarbon group having 1 to 12 carbon atoms optionally containing an ether group, an ester group, an amino group, an amide group, or a heteroatom, and the amino groups and the amide groups each optionally contain any of a hydrogen atom and a linear, branched, or cyclic hydrocarbon group having 1 to 12 carbon atoms optionally containing a heteroatom; $X_1$ and $X_2$ each independently represent any of a single bond, a phenylene group, a naphthylene group, an ether group, an ester group, and an amide group; $X_3$ represents any of a single bond, an ether group, and an ester group; $Rf_1$ represents a fluorine atom or a trifluoromethyl group; "a", b1, b2, and b3 satisfy $0.4 \leq a \leq 0.6$, $0 \leq b1 \leq 0.6$, $0 \leq b2 \leq 0.6$, $0 \leq b3 \leq 0.6$, and $0 < b1+b2+b3 \leq 0.6$; and "n" represents an integer of 1 to 4, and

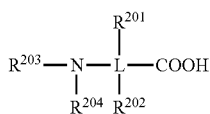

(2)

wherein $R^{201}$ and $R^{202}$ each independently represent any of a hydrogen atom, a heteroatom, and a linear, branched, or cyclic monovalent hydrocarbon group having 1 to 20 carbon atoms optionally having a heteroatom; $R^{203}$ and $R^{204}$ each independently represent any of a hydrogen atom and a linear, branched, or cyclic monovalent hydrocarbon group having 1 to 20 carbon atoms optionally having a heteroatom; $R^{201}$, $R^{203}$, or $R^{201}$ and $R^{204}$, are optionally bonded to each other to form a ring; L represents a linear, branched or cyclic tetravalent organic group having 1 to 20 carbon atoms optionally having a heteroatom; and when L has a heteroatom, the heteroatom is optionally an ion.

2. The conductive polymer composition according to claim 1, wherein the component (C) comprises an organic solvent (C1) having a boiling point of 120° C. or more and/or an organic solvent (C2) having a boiling point of less than 120° C. such that $1.0 \text{ wt \%} \leq (C1)+(C2) \leq 50.0 \text{ wt \%}$ is satisfied relative to a total of the components (A), (B), and (D).

3. The conductive polymer composition according to claim 2, wherein the components (C1) and (C2) are selected from alcohols, ethers, esters, ketones, and nitriles each of which has 1 to 7 carbon atoms.

4. The conductive polymer composition according to claim 2, wherein the repeating unit "a" in the component (B) comprises one or more selected from repeating units shown by the following general formulae (3-1) to (3-4),

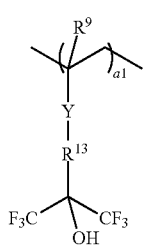

(3-1)

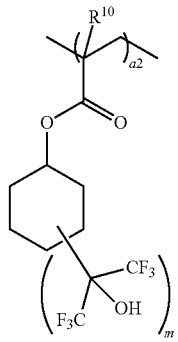

(3-2)

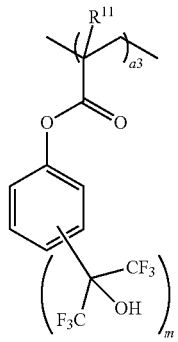

(3-3)

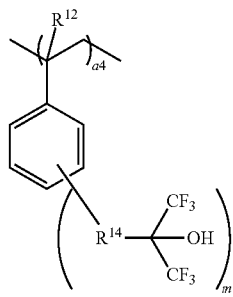

(3-4)

wherein $R^9$, $R^{10}$, $R^{11}$, and $R^{12}$ each independently represent a hydrogen atom or a methyl group; $R^{13}$ represents any of a single bond and a linear, branched, or cyclic hydrocarbon group having 1 to 14 carbon atoms optionally having an ether group; $R^{14}$ represents any of a single bond, a methylene group, an ethylidene group, an isopropylidene group, an ether group, an ester group, an amino group, an amide group, and a linear, branched, or cyclic hydrocarbon group having 1 to 12 carbon atoms optionally containing an ether group, an ester group, an amino group, an amide group, or a heteroatom, and the amino groups and the amide groups each optionally contain any of a hydrogen atom and a linear, branched, or cyclic hydrocarbon group having 1 to 12 carbon atoms optionally containing a heteroatom; Y represents any of an ether group, an ester group, an amino group, and an amide group, and the amino group and the amide group each optionally contain any of a hydrogen atom and a linear, branched, or cyclic hydrocarbon group having 1 to 12 carbon atoms optionally containing a heteroatom; "m" represents any one of 1 to 3; and a1, a2, a3, and a4 satisfy $0 \leq a1 < 1.0$, $0 \leq a2 < 1.0$, $0 \leq a3 < 1.0$, $0 \leq a4 < 1.0$, and $0 < a1+a2+a3+a4 < 1.0$.

5. The conductive polymer composition according to claim 1, wherein the repeating unit "a" in the component (B)

comprises one or more selected from repeating units shown by the following general formulae (3-1) to (3-4),

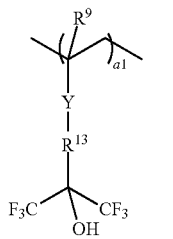

(3-1)

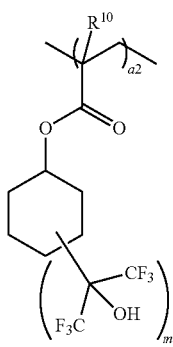

(3-2)

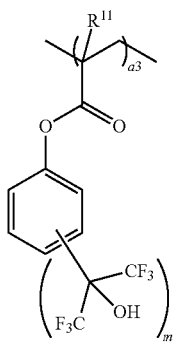

(3-3)

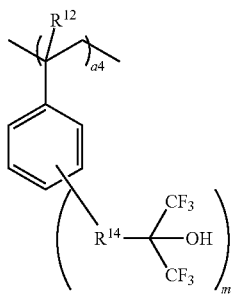

(3-4)

wherein $R^9$, $R^{10}$, $R^{11}$, and $R^{12}$ each independently represent a hydrogen atom or a methyl group; $R^{13}$ represents any of a single bond and a linear, branched, or cyclic hydrocarbon group having 1 to 14 carbon atoms optionally having an ether group; $R^{14}$ represents any of a single bond, a methylene group, an ethylidene group, an isopropylidene group, an ether group, an ester group, an amino group, an amide group, and a linear, branched, or cyclic hydrocarbon group having 1 to 12 carbon atoms optionally containing an ether group, an ester group, an amino group, an amide group, or a heteroatom, and the amino groups and the amide groups each optionally contain any of a hydrogen atom and a linear, branched, or cyclic hydrocarbon group having 1 to 12 carbon atoms optionally containing a heteroatom; Y represents any of an ether group, an ester group, an amino group, and an amide group, and the amino group and the amide group each optionally contain any of a hydrogen atom and a linear, branched, or cyclic hydrocarbon group having 1 to 12 carbon atoms optionally containing a heteroatom; "m" represents any one of 1 to 3; and a1, a2, a3, and a4 satisfy $0 \le a1 < 1.0$, $0 \le a2 < 1.0$, $0 \le a3 < 1.0$, $0 \le a4 < 1.0$, and $0 < a1+a2+a3+a4 < 1.0$.

6. The conductive polymer composition according to claim 1, wherein the repeating unit b1 in the component (B) comprises one or more selected from repeating units shown by the following general formulae (4-1) to (4-4),

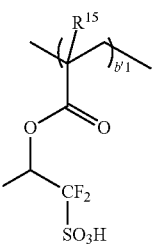

(4-1)

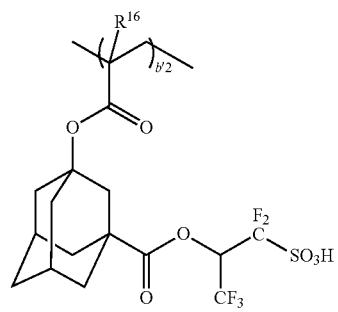

(4-2)

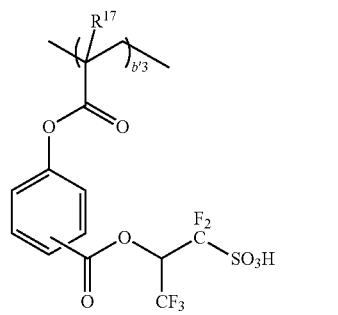

(4-3)

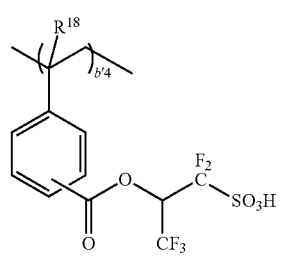

(4-4)

wherein $R^{15}$, $R^{16}$, $R^{17}$, and $R^{18}$ each independently represent a hydrogen atom or a methyl group; and b'1, b'2, b'3, and b'4 satisfy $0 \le b'1 < 1.0$, $0 \le b'2 < 1.0$, $0 \le b'3 < 1.0$, $0 \le b'4 < 1.0$, and $0 < b'1+b'2+b'3+b'4 < 1.0$.

7. The conductive polymer composition according to claim 1, wherein the component (B) further comprises a repeating unit shown by the following general formula (5),

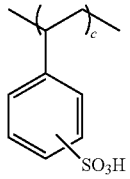

(5)

wherein "c" satisfies 0<c<1.0.

8. The conductive polymer composition according to claim 1, wherein the component (B) has a weight-average molecular weight in a range of 1,000 to 500,000.

9. The conductive polymer composition according to claim 1, wherein the component (E) is contained in an amount of 1 part by mass to 50 parts by mass based on 100 parts by mass of the composite of the component (A) with the component (B).

10. The conductive polymer composition according to claim 1, further comprising a nonionic surfactant.

11. The conductive polymer composition according to claim 10, wherein the nonionic surfactant is contained in an amount of 1 part by mass to 15 parts by mass based on 100 parts by mass of the composite of the component (A) with the component (B).

12. A substrate comprising an organic thin-film device, wherein the organic thin-film device comprises a hole injection layer formed from the conductive polymer composition according to claim 1.

13. A method for producing the substrate according to claim 12, comprising applying the conductive polymer composition by employing spin coating, a spray coater, or inkjet printing.

* * * * *